(12) United States Patent
Todd

(10) Patent No.: US 11,670,512 B2
(45) Date of Patent: Jun. 6, 2023

(54) SELECTIVE DEPOSITION ON SILICON CONTAINING SURFACES

(71) Applicant: VERSUM MATERIALS US, LLC, Tempe, AZ (US)

(72) Inventor: Michael A. Todd, Tempe, AZ (US)

(73) Assignee: VERSUM MATERIALS US, LLC, Tempe, AZ (US)

(*) Notice: Subject to any disclaimer, the term of this patent is extended or adjusted under 35 U.S.C. 154(b) by 696 days.

(21) Appl. No.: 16/494,081

(22) PCT Filed: Mar. 16, 2018

(86) PCT No.: PCT/US2018/022836
§ 371 (c)(1),
(2) Date: Sep. 13, 2019

(87) PCT Pub. No.: WO2018/170382
PCT Pub. Date: Sep. 20, 2018

(65) Prior Publication Data
US 2021/0118684 A1   Apr. 22, 2021

Related U.S. Application Data

(60) Provisional application No. 62/472,724, filed on Mar. 17, 2017.

(51) Int. Cl.
| | |
|---|---|
| *C23C 16/04* | (2006.01) |
| *H01L 21/285* | (2006.01) |
| *H01L 21/02* | (2006.01) |
| *C23C 16/44* | (2006.01) |
| *C23C 16/46* | (2006.01) |

(52) U.S. Cl.
CPC .... *H01L 21/28562* (2013.01); *H01L 21/0228* (2013.01); *H01L 21/02057* (2013.01)

(58) Field of Classification Search
CPC .................................................. C23C 2222/20
See application file for complete search history.

(56) References Cited

U.S. PATENT DOCUMENTS

2016/0222504 A1* 8/2016 Haukka ................... C23C 16/04
2016/0322213 A1* 11/2016 Thompson ........ H01L 21/31133

\* cited by examiner

*Primary Examiner* — Lois L Zheng
(74) *Attorney, Agent, or Firm* — Daniel A. DeMarah, Jr.

(57) ABSTRACT

A method is disclosed for delectively depositing a material on a substrate wherein the substrate has at least two different surfaces wherein one surface is passivated thereby allowing selective deposition on the non-passivated surface. In particular, disclosed is a method for preparing a surface of a substrate for selective film deposition, wherein the surface of the substrate comprises at least a first surface comprising $SiO_2$ and an initial concentration of surface hydroxyl groups and a second surface comprising SiH, the method comprising the steps of: contacting the substrate with a wet chemical composition to obtain a treated substrate comprising an increased concentration of surface hydroxyl groups relative to the initial concentration of surface hydroxyl groups; and heating the treated substrate to a temperature of from about 200° C. to about 600° C., wherein the heating step converts at least a portion of the surface hydroxyl groups on the first surface to surface siloxane groups on the surface of the substrate.

60 Claims, 38 Drawing Sheets

SELECTIVE DEPOSITION ON SILICON CONTAINING SURFACES

CROSS-REFERENCE TO RELATED APPLICATIONS

This application claims priority under 35 U.S.C. § 119(e) to U.S. provisional patent application No. 62/472,724, filed on Mar. 17, 2017, the entirety of which is incorporated herein by reference.

BACKGROUND

The present application relates to selective deposition on a first surface of a substrate relative to a second surface. In addition, further processing can be used to subsequently deposit a different material on the second surface relative to the first.

Selective deposition processes are gaining a lot of momentum mostly because of the limitations of contemporary lithographic processes to enable the fabrication of advanced semiconductor devices based on ever diminishing physical dimensions. Traditionally, patterning in the microelectronics industry has been accomplished using various lithography and etch processes. However, since lithography is becoming exponentially more complex and expensive the use of selective deposition to form self-aligned features is becoming much more attractive. The fabrication of self-aligned via structures would benefit significantly from manufacturable selective deposition processes. Another potential application for selective deposition is gap fill. In gap fill, the dielectric "fill" film is grown selectively from the bottom of a trench towards the top. Selective deposition could be used for other applications such as selective sidewall deposition where films are selectively deposited on exposed surfaces of three dimensional FIN-FET structures. This would enable the deposition of a sidewall spacer without the need for complex patterning steps. Selective deposition processes for metal and metal oxide films that are used as gate dielectrics and capacitor dielectrics would also be of great utility in semiconductor device manufacturing.

There are many previous examples within the technical literature related to the selective formation of surface passivation coatings on wafers with multiple, different chemical surfaces that are exposed. This has been done with the purpose of retarding or preventing the deposition of films through ALD processes on these passivated surfaces, but not preventing deposition on the surfaces where the ALD deposition process is desired to deposit a film. In general, the selectivity of the processes has been less than adequate due to incomplete passivation of the surfaces and/or due to physisorption of ALD precursor molecules and subsequent formation of the ALD film material either within the passivation layer itself or on the surfaces where deposition is not desired. The present invention seeks to overcome the limitations of the prior art and provide improved methods for selective deposition of thin film materials using ALD deposition processes.

SUMMARY

One or more embodiments of the disclosure are directed to methods of depositing a film. A substrate comprising a first substrate surface including a hydroxyl-terminated surface and a second substrate surface including a hydrogen-terminated surface is provided. The substrate is exposed to multiple processing steps to selectively alter the hydroxyl-terminated surface relative to the hydrogen-terminated surface in order to render it unreactive, or less reactive, than an untreated hydroxyl-terminated surface during a subsequent film deposition step wherein a film is selectively deposited on the hydrogen-terminated surface.

In the broadest aspect, the present invention provides a method for preparing a surface of a substrate for selective film deposition, wherein the surface of the substrate comprises at least a first surface comprising $SiO_2$ and an initial concentration of surface hydroxyl groups and a second surface comprising SiH, the method comprising the steps of: contacting the substrate to a wet chemical composition to obtain a treated substrate comprising an increased concentration of surface hydroxyl groups relative to the initial concentration of surface hydroxyl groups; and heating the treated substrate at a temperature of from about 200° C. to about 600° C., wherein the heating step converts at least a portion of the surface hydroxyl groups on the first surface to surface siloxane groups on the surface of the substrate.

In another aspect, the present invention provides a method for selectively passivating the surface of a substrate by vapor phase reaction, wherein the surface of the substrate comprises at least a first surface comprising $SiO_2$ and an initial concentration of surface hydroxyl groups and a second surface comprising SiH, the method comprising the steps of: contacting the substrate to a wet chemical composition to obtain a treated substrate comprising an increased concentration of surface hydroxyl groups relative to the initial concentration of surface hydroxyl groups; heating the treated substrate at a temperature of from about 200° C. to about 600° C. and a pressure of from 10-10 Torr to 3000 Torr, wherein the heating step converts at least a portion of the surface hydroxyl groups on the first surface to surface siloxane groups on the surface of the substrate; exposing the substrate, at a temperature equal to or below the heating step, to a silicon-containing compound selected from the group consisting of Formula I and Formula II:

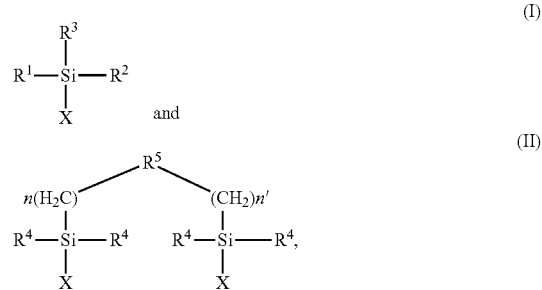

wherein $R^1$, $R^2$, and $R^4$ are each independently selected from H, a $C_1$ to $C_8$ linear alkyl group, a branched $C_3$ to $C_8$ alkyl group, a $C_3$ to $C_8$ cyclic alkyl group, a $C_3$ to $C_{10}$ heterocyclic group, a $C_3$ to $C_{10}$ alkenyl group, a $C_4$ to $C_8$ aryl group, and a $C_3$ to $C_{10}$ alkynyl group; $R^3$ is selected from a $C_1$ to $C_{18}$ alkyl group, a branched $C_3$ to $C_{10}$ alkyl group, a $C_4$ to $C_{10}$ heterocyclic group and a $C_4$ to $C_{10}$ aryl group; $R^5$ is selected from a bond, a $C_1$ to $C_8$ linear alkyl group, a branched $C_3$ to $C_8$ alkyl group, a $C_3$ to $C_8$ cyclic alkyl group, a $C_3$ to $C_{10}$ heterocyclic group, a $C_3$ to $C_{10}$ alkenyl group, a $C_4$ to $C_8$ aryl group, and a $C_3$ to $C_{10}$ alkynyl group; X is selected from $NR^aR^b$, Cl, F, Br, I, —$OCH_3$, and —OH, wherein $R^a$ and $R^b$ are each independently selected from H, a $C_1$ to $C_4$ linear alkyl group and a $C_1$-$C_4$ branched alkyl group; and n and n' are each independently selected from a number of from 0 to 5, wherein n+n'>1 and <11, wherein the silicon-containing compound reacts with the surface hydroxyl groups of the first surface to form a silyl ether-terminated surface and thereby passivate the surface.

In another aspect, the present invention provides a method of selectively depositing a film on a surface of a substrate wherein the surface of the substrate comprises at least a first surface comprising $SiO_2$ and an initial concentration of surface hydroxyl groups and a second surface comprising SiH, the method comprising the steps of: contacting the substrate to a wet chemical composition to obtain a treated substrate comprising an increased concentration of surface hydroxyl groups relative to the initial concentration of surface hydroxyl groups; heating the treated substrate at a temperature of from about 200° C. to about 600° C. and a pressure of from 10-10 Torr to 3000 Torr, wherein the heating step converts at least a portion of the surface hydroxyl groups on the first surface to surface siloxane groups on the surface of the substrate; exposing the substrate, at a temperature equal to or below the heating step, to a silicon-containing compound selected from the group consisting of Formula I and Formula II:

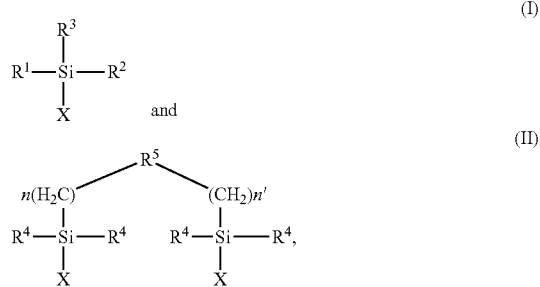

wherein $R^1$, $R^2$, and $R^4$ are each independently selected from H, a $C_1$ to $C_8$ linear alkyl group, a branched $C_3$ to $C_8$ alkyl group, a $C_3$ to $C_8$ cyclic alkyl group, a $C_3$ to $C_{10}$ heterocyclic group, a $C_3$ to $C_{10}$ alkenyl group, a $C_4$ to $C_8$ aryl group, and a $C_3$ to $C_{10}$ alkynyl group; $R^3$ is selected from a $C_1$ to $C_{18}$ alkyl group, a branched $C_3$ to $C_{10}$ alkyl group, a $C_4$ to $C_{10}$ heterocyclic group and a $C_4$ to $C_{10}$ aryl group; $R^5$ is selected from a bond, a $C_1$ to $C_8$ linear alkyl group, a branched $C_3$ to $C_8$ alkyl group, a $C_3$ to $C_8$ cyclic alkyl group, a $C_3$ to $C_{10}$ heterocyclic group, a $C_3$ to $C_{10}$ alkenyl group, a $C_4$ to $C_8$ aryl group, and a $C_3$ to $C_{10}$ alkynyl group; X is selected from $NR^aR^b$, Cl, F, Br, I, —$OCH_3$, and —OH, wherein $R^a$ and $R^b$ are each independently selected from H, a $C_1$ to $C_4$ linear alkyl group and a $C_1$-$C_4$ branched alkyl group; and n and n' are each independently selected from a number of from 0 to 5, wherein n+n'>1 and <11, wherein the silicon-containing compound reacts with the surface hydroxyl groups of the first surface to form a silyl ether-terminated surface and thereby passivate the surface; and exposing the substrate to one or more deposition gases to deposit a film on the second surface selectively over the first surface.

The embodiments of the invention can be used alone or in combinations with each other.

DETAILED DESCRIPTION

Figure 1:
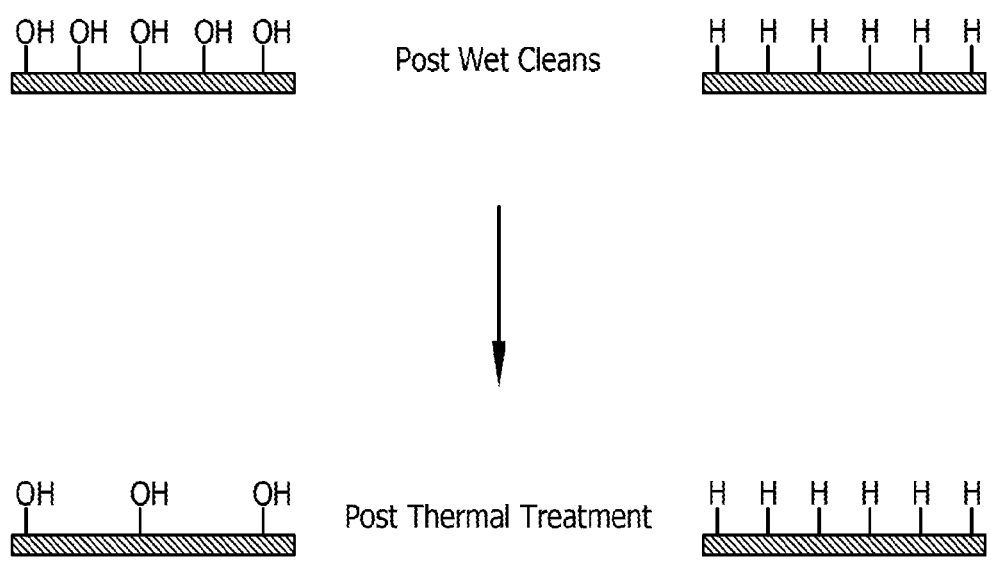
FIG. 1 is an illustration of the effect of the heat treatment step of the present invention on a substrate surface.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventor expects skilled artisans to employ such variations as appropriate, and the inventor intends for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

There are a variety of methods that could be used for selective depositions. Embodiments of the disclosure are directed to methods that employ surface deactivation by taking advantage of the surface chemistry of two different surfaces. Since two different surfaces will have different reactive handles, the differences can be taken advantage of by utilizing molecules that will react with one surface (to deactivate that surface) and not react with the other surface.

As used in this specification and the appended claims, the term "substrate" and "wafer" are used interchangeably, both referring to a surface, or portion of a surface, upon which a process acts. It will also be understood by those skilled in the art that reference to a substrate can also refer to only a portion of the substrate, unless the context clearly indicates otherwise. Additionally, reference to depositing on a substrate can mean both a bare substrate and a substrate with one or more films or features deposited or formed thereon.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, silicon nitride, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal and/or bake the substrate surface. In addition to film processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus for example, where a film/layer or partial film/layer has been deposited onto a substrate surface, the exposed surface of the newly deposited film/layer becomes the substrate surface. What a given substrate surface comprises will depend on what films are to be deposited, as well as the particular chemistry used. In one or more embodiments, the first substrate surface will comprise a metal, and the second substrate surface will comprise a dielectric, or vice versa. In some embodiments, a substrate surface may comprise certain functionality (e.g., —OH, —NH, etc.).

Likewise, the films that can be used in the methods described herein are quite varied. In some embodiments, the films may comprise, or consist essentially of a metal. Examples of metal films include, but are not limited to, cobalt (Co), copper (Cu), nickel (Ni), tungsten (W), etc. In some embodiments, the film comprises a dielectric. Examples include, $SiO_2$, SiN, $HfO_2$, etc.

As used in this specification and the appended claims, the terms "reactive gas", "precursor", "reactant", and the like, are used interchangeably to mean a gas that includes a species which is reactive with a substrate surface. For example, a first "reactive gas" may simply adsorb onto the surface of a substrate and be available for further chemical reaction with a second reactive gas.

Embodiments of the disclosure provide methods of selectively depositing a film such as, for example, a metal film, onto one surface of a substrate over a second surface the same substrate. As used in this specification and the appended claims, the term "selectively depositing a film on one surface over another surface", and the like, means that one of the first or second surface is passivated to substantially prevent deposition on the passivated layer and a film is deposited on the second (non-passivated) surface. The term "over" used in this regard does not imply a physical orientation of one surface on top of another surface, rather a relationship of the thermodynamic or kinetic properties of the chemical reaction with one surface relative to the other surface. For example, selectively depositing a cobalt film onto a copper surface over a dielectric surface means that the cobalt film deposits on the copper surface and less or no cobalt film deposits on the dielectric surface; or that the formation of the cobalt film on the copper surface is thermodynamically or kinetically favorable relative to the formation of a cobalt film on the dielectric surface.

In some situations it is desirable to selectively deposit a material on one surface of a substrate relative to a second, different surface of the same substrate. For example, selective deposition may be used to form capping layers, barrier layers, etch stop layers, sacrificial and/or protective layers or for sealing pores, such as in porous low k materials.

Using the processes described herein, in some embodiments a material comprising Ni, Ti, Fe, or Co, such as Ni metal, nickel nitride or $NiN_x$, cobalt, iron or titanium oxide structures can selectively be grown on $SiO_2$ based surfaces, and other surfaces as described herein. As used herein, nickel nitride or $NiN_x$ refers to a material comprising at least some Ni—N bonds.

In some embodiments, a first material, such as a material comprising Ni, Ti, Fe, or Co, such as nickel, nickel nitride or $NiN_x$, cobalt, iron or titanium oxide film, may be deposited selectively on one surface relative to a second, different surface. For example, a nickel, nickel nitride, cobalt, iron or titanium oxide film can be selectively deposited on a low-k insulator surface, for example an oxide or nitride surface, such as a form of silicon oxide or silicon nitride, relative to a second surface, such as a H-terminated surface of the same substrate.

In some embodiments the surface on which selective deposition occurs comprises an $AH_x$-termination, where A is one or more of N, O or S and x is from 1 to 2. In some embodiments the surface comprises OH-terminations. In some embodiments the surface is an $NH_x$-terminated surface such as a —NH or —$NH_2$ terminated surface. In some embodiments the surface is an $SH_x$-terminated surface.

In some embodiments the first surface is a dielectric surface, such as a $SiO_2$ surface or silicon oxynitride surface. In some embodiments the first surface may comprise silicon oxides, silicon nitrides, silicon oxynitrides, fluorinated silica glass (FSG), carbon doped silicon oxide (SiOC) and/or materials containing more than about 50% silicon oxide. In some embodiments the first surface comprises OH-groups and may comprise, for example, an alumina ($Al_2O_3$) surface with —OH surface groups.

In some embodiments the second surface is a —$SiH_3$, —$SiH_2$, or —SiH surface. In some embodiments the second surface is formed by etching native oxide of silicon and the second surface comprises Si—H bonds. In some embodiments the second surface is a pure silicon surface or a silicon(100) oriented surface.

In the broadest aspect, the present invention provides a method for preparing a surface of a substrate for selective film deposition, wherein the surface of the substrate comprises at least a first surface comprising $SiO_2$ and an initial concentration of surface hydroxyl groups and a second surface comprising SiH, the method comprising the steps of: contacting the substrate to a wet chemical composition to obtain a treated substrate comprising an increased concentration of surface hydroxyl groups relative to the initial concentration of surface hydroxyl groups; and heating the treated substrate at a temperature of from about 200° C. to about 600° C., wherein the heating step converts at least a portion of the surface hydroxyl groups on the first surface to surface siloxane groups on the surface of the substrate. As used herein the phrase "surface comprising SiH" includes the $AH_x$-termination as defined above.

In another aspect, the present invention provides a method for selectively passivating the surface of a substrate by vapor phase reaction, wherein the surface of the substrate comprises at least a first surface comprising $SiO_2$ and an initial concentration of surface hydroxyl groups and a second surface comprising SiH, the method comprising the steps of: contacting the substrate to a wet chemical composition to obtain a treated substrate comprising an increased concentration of surface hydroxyl groups relative to the initial concentration of surface hydroxyl groups; heating the treated substrate at a temperature of from about 200° C. to about 600° C. and a pressure of from 10-10 Torr to 3000 Torr, wherein the heating step converts at least a portion of the surface hydroxyl groups on the first surface to surface siloxane groups on the surface of the substrate; exposing the substrate, at a temperature equal to or below the heating step, to a silicon-containing compound selected from the group consisting of Formula I and Formula II:

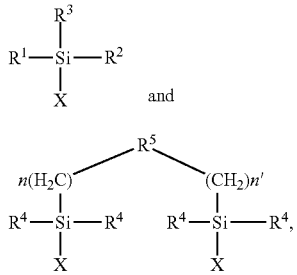

wherein $R^1$, $R^2$, and $R^4$ are each independently selected from H, a $C_1$ to $C_8$ linear alkyl group, a branched $C_3$ to $C_8$ alkyl group, a $C_3$ to $C_8$ cyclic alkyl group, a $C_3$ to $C_{10}$ heterocyclic group, a $C_3$ to $C_{10}$ alkenyl group, a $C_4$ to $C_8$ aryl group, and a $C_3$ to $C_{10}$ alkynyl group; $R^3$ is selected from a $C_1$ to $C_{18}$ alkyl group, a branched $C_3$ to $C_{10}$ alkyl group, a $C_4$ to $C_{10}$ heterocyclic group and a $C_4$ to $C_{10}$ aryl group; $R^5$ is selected from a bond, a $C_1$ to $C_8$ linear alkyl group, a branched $C_3$ to $C_8$ alkyl group, a $C_3$ to $C_8$ cyclic alkyl group, a $C_3$ to $C_{10}$ heterocyclic group, a $C_3$ to $C_{10}$ alkenyl group, a $C_4$ to $C_8$ aryl group, and a $C_3$ to $C_{10}$ alkynyl group; X is selected from $NR^aR^b$, Cl, F, Br, I, —$OCH_3$, and —OH, wherein $R^a$ and $R^b$ are each independently selected from H, a $C_1$ to $C_4$ linear alkyl group and a $C_1$-$C_4$ branched alkyl group; and n and n' are each independently selected from a number of from 0 to 5, wherein n+n'>1 and <11, wherein the silicon-containing compound reacts with the surface hydroxyl groups of the first surface to form a silyl ether-terminated surface and thereby passivate the surface.

In another aspect, the present invention provides a method of selectively depositing a film on a surface of a substrate wherein the surface of the substrate comprises at least a first surface comprising $SiO_2$ and an initial concentration of surface hydroxyl groups and a second surface comprising SiH, the method comprising the steps of: contacting the substrate to a wet chemical composition to obtain a treated substrate comprising an increased concentration of surface hydroxyl groups relative to the initial concentration of surface hydroxyl groups; heating the treated substrate at a temperature of from about 200° C. to about 600° C. and a pressure of from 10-10 Torr to 3000 Torr, wherein the heating step converts at least a portion of the surface hydroxyl groups on the first surface to surface siloxane groups on the surface of the substrate; exposing the substrate, at a temperature equal to or below the heating step, to a silicon-containing compound selected from the group consisting of Formula I and Formula II:

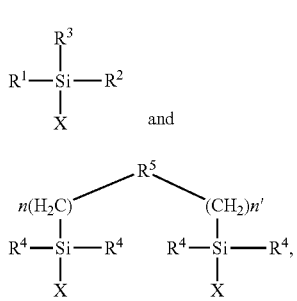

wherein W, $R^2$, and $R^4$ are each independently selected from H, a $C_1$ to $C_8$ linear alkyl group, a branched $C_3$ to $C_8$ alkyl group, a $C_3$ to $C_8$ cyclic alkyl group, a $C_3$ to $C_{10}$ heterocyclic group, a $C_3$ to $C_{10}$ alkenyl group, a $C_4$ to $C_8$ aryl group, and a $C_3$ to $C_{10}$ alkynyl group; $R^3$ is selected from a $C_1$ to $C_{18}$ alkyl group, a branched $C_3$ to $C_{10}$ alkyl group, a $C_4$ to $C_{10}$ heterocyclic group and a $C_4$ to $C_{10}$ aryl group; $R^5$ is selected from a bond, a $C_1$ to $C_8$ linear alkyl group, a branched $C_3$ to $C_8$ alkyl group, a $C_3$ to $C_8$ cyclic alkyl group, a $C_3$ to $C_{10}$ heterocyclic group, a $C_3$ to $C_{10}$ alkenyl group, a $C_4$ to $C_8$ aryl group, and a $C_3$ to $C_{10}$ alkynyl group; X is selected from $NR^aR^b$, Cl, F, Br, I, —$OCH_3$, and —OH, wherein $R^a$ and $R^b$ are each independently selected from H, a $C_1$ to $C_4$ linear alkyl group and a $C_1$-$C_4$ branched alkyl group; and n and n' are each independently selected from a number of from 0 to 5, wherein n+n'>1 and <11, wherein the silicon-containing compound reacts with the surface hydroxyl groups of the first surface to form a silyl ether-terminated surface and thereby passivate the surface; and exposing the substrate to one or more deposition precursors to deposit a film on the second surface selectively over the first surface.

In each method disclosed herein, there is provided a method for preparing a surface of a substrate for selective deposition by vapor phase reaction, wherein the surface comprises $SiO_2$ and SiH, wherein the first step is typically but optionally contacting the surface with a wet chemical composition.

In some embodiments the surface comprising $SiO_2$ is a dielectric surface, such as a $SiO_2$ surface and/or silicon oxynitride surface. In some embodiments the surface comprising $SiO_2$ may comprise silicon oxides, silicon nitrides, silicon oxynitrides, fluorinated silica glass (FSG), carbon doped silicon oxide (SiOC) and/or materials containing more than about 50% silicon oxide. In some embodiments the surface comprising $SiO_2$ comprises —OH groups and may comprise, for example, an alumina ($Al_2O_3$) surface with —OH surface groups.

In some embodiments the surface comprising SiH is a —$SiH_3$, —$SiH_2$, or —SiH surface. In some embodiments the surface comprising SiH is a pure silicon surface or an Si(100) surface.

As stated above, the first surface comprises an initial concentration of surface hydroxyl groups. Typically, the concentration of surface hydroxyl groups can be quantified by techniques well known in the art such as, for example, Time-of-Flight Secondary Ion Mass Spectrometry (TOF-SIMS). In preferred embodiments, the initial concentration of surface hydroxyl groups is from about $1.4 \times 10^6$ normalized counts for positive ion analysis for mass 45 amu to about $2.2 \times 10^6$ normalized counts for positive ion analysis for mass 45 amu as determined by TOF-SIMS. This corresponds to hydroxyl surface concentrations of about 4.2 $OH/nm^2$ to 4.6 $OH/nm^2$ as measured by FTIR and other techniques known to those skilled in the art.

The method of the present invention includes the optional step of contacting the substrate with a wet chemical composition to obtain a treated substrate comprising an increased concentration of surface hydroxyl groups relative to the initial concentration of surface hydroxyl groups. Although optional, it is preferred that the surface of the substrate first be treated with a wet chemical treatment. Exemplary wet chemical treatments include known chemical treatments such as, for example, RCA clean chemicals SC-1 and SC-2, HF, peroxide, $H_2SO_4/H_2O_2$, $NH_4OH$, buffered HF solutions, and mixtures thereof.

As is known in the art, "RCA clean chemicals" refer to compositions comprising an ammonium hydroxide and hydrogen peroxide mixture wherein the basic cleaning procedure developed by the Radio Corporation of America in the 1960s. The RCA Standard-Clean-1 (SC-1) procedure uses an ammonium hydroxide and hydrogen peroxide solution and water heated to a temperature of about 70° C. The SC-1 procedure dissolves films and removes Group I and II metals. The Group I and II metals are removed through complexing with the reagents in the SC-1 solution. The RCA Standard-Clean-2 (SC-2) procedure utilizes a mixture of hydrogen peroxide, hydrochloric acid, and water heated to a temperature of about 70° C. The SC-2 procedure removes the metals that are not removed by the SC-1 procedure.

The purpose of the wet chemical clean is two-fold. First, the wet chemical step removes impurities from the surface to remove the thin oxide grown on the Si (100) surfaces and replaces it with hydrogen termination while preserving to a large extent the —OH surface termination on the $SiO_2$ surfaces. Such processes are common within the industry and can be optimized to yield clean surfaces with the desired properties using methods known to those skilled in the art. Next, the wet chemical clean also increases the concentration of surface hydroxyl groups relative to the concentration of surface hydroxyl groups prior to contacting the surface with the wet chemical. Preferably, the concentration of surface hydroxyl groups increases by from about 1.1 times the initial concentration to about 1.8 times the initial concentration and ultimately reaches a surface hydroxyl concentration that approaches about 4.6 $OH/nm^2$.

Contacting with the wet chemical can occur by any method known to those skilled in the art such as, for example, dipping or spraying. The contacting step can be one discrete step or more than one step.

In some embodiments, the temperature of the wet chemical during the contacting step can be, for example, from about 50° C. to about 100° C. In other embodiments, the temperature of the wet chemical during the contacting step can be, for example, from about 55° C. to about 95° C. In other embodiments, the temperature of the wet chemical during the contacting step can be, for example, from about 60° C. to about 90° C.

Any process that can be used alone or in conjunction with the wet chemical to increase the surface hydroxyl concentration of the two substrate surfaces to a range approaching at least about $3\times10^{18}$ OH $groups/m^2$, can be utilized to provide a fully hydroxylated surface, particularly those that simultaneously provide a hydrogen terminated Si(100) surface. Suitable processes include plasma processes (hydrogen plasma, $NH_3/NF_3$ plasmas, water plasmas, water/hydrogen peroxide plasmas and the like), wet chemical processes and/or combinations of the foregoing (to provide full hydroxylation of both surfaces, followed by SiH surface formation on the Si(100) surfaces).

The method of the present invention also includes the step of heating the treated substrate at a temperature of from about 200° C. to about 600° C. and, preferably, from about 200° C. to about 500° C., wherein the heating step converts at least a portion of the surface hydroxyl groups on the first surface to surface siloxane groups on the surface of the substrate. This thermal "treatment" of the wet chemical-cleaned surface can comprise one step or multiple steps. In the multiple step embodiment, the thermal treatment may be conducted at one or more discrete process temperatures for pre-determined lengths of time. The thermal treatments may be carried out over the temperature range of from about 50-1200° C., the pressure range 10-10 Torr to 3000 Torr, with or without the presence of a carrier/purge gas for times ranging from 10 s to 12 hours. Any of the process parameters might be changed in a pre-determined fashion for a pre-determined length of time during either a single step thermal treatment or during any of the sub-steps in a multi-step thermal treatment. Heating can be achieved through thermal contact with a heated surface, use of a heated gas stream, through radiant heating (i.e., lamps) or through any other suitable means. Heating may be conducted in a dedicated, interconnected chamber that is a part of a multi-chamber cluster tool. Where multiple, discrete heating steps are used, they may be carried out in multiple dedicated chambers including load locks and heating chambers that may also be part of larger, interconnected cluster tools.

In one embodiment, the heating step is performed at a temperature of from about 200° C. to about 600° C. In another embodiment, the heating step is performed at a temperature of from about 300° C. to about 550° C. In yet another embodiment, the heating step is performed at a temperature of from about 400° C. to about 500° C. In still another embodiment, the heating step is performed by first heating the substrate to a temperature of less than about 200° C. for 5-10 minutes, followed by increasing the temperature to from about 400° C. to about 500° C.

Although described as a two-step process herein, it may be possible to achieve similar results using a single step process carried out at an initially higher temperature within the range disclosed in the second step below. In the first step of the thermal process, adsorbed moisture is removed from the surface of the $SiO_2$ to prevent the formation of undesirable interfacial phases during film deposition in a subsequent step and to help provide a very repeatable hydroxyl concentration on the surfaces of the exposed $SiO_2$ films. This first, discrete thermal treatment may be carried out over the temperature range of from about 50 to about 250° C., over the pressure range 10-10 MIT to 760 Torr for lengths of time varying from 1 s to 12 hours. Preferably, the temperature is between about 50 and about 240° C., the pressure is between 10-5 Torr and 300 Torr and the time is between 30 s and 8 hours. Still more preferably, the temperature is between about 50 and about 230° C., the pressure is between 10-4 and 100 Torr and the time is between 1 minute and 6 hours. The conditions of the first step to remove adsorbed moisture can be routinely optimized using methods known to those skilled in the art.

Without intending to be bound by a particular theory, it is believed that during the heating step a portion of the 'bound' surface hydroxyl groups are converted to surface siloxane bonds by continued heating at elevated temperature through removal of water molecules from the surface (condensation of surface silanol groups). This second, discrete thermal treatment may be carried out over the temperature range of from about 200 to about 1000° C., over the pressure range 10-10 Torr to 760 Torr for lengths of time varying from 10 s to 12 hours.

In one example, the temperature of the heating step is between about 280 and about 650° C., the pressure is between 10-5 Torr and 300 Torr and the time is between 30 s and 10 hours. In another example, the temperature is between about 300 and about 550° C., the pressure is between 10-4 and 100 Torr and the time is between 1 minute and 8 hours. The process can be routinely optimized to yield a post thermal treatment surface hydroxyl coverage that provides a mean hydroxyl spacing equal to that desired within the range of from about 3 to 9 Å using methods known to those skilled in the art.

Referring to FIG. 1, the function of the thermal treatment is, at least in part, to remove a portion of the hydroxyl groups from the surface comprising the hydroxyl groups. The thermal treatment step(s) may be carried out in any one of several desirable fashions, or through a combination of more than one of them. These include dynamic processing conditions in which the sample is continuously exposed to vacuum with or without a flow of carrier/purge gas; static processing conditions in which the sample is isolated from the vacuum source for pre-determined lengths of time with or without a carrier/purge gas present; and pump-purge process conditions in which the sample is pumped on continuously for a pre-determined amount of time, then isolated from the vacuum source and the chamber volume containing it is backfilled with an ultra-high purity carrier gas to a pre-determined pressure for a pre-determined length of time, after which the sample volume is pumped down to base vacuum for a pre-determined amount of time. This pump-purge or cycle purge process may be completed as many times as desired in order to achieve the desired surface hydroxyl concentration. Routine experimentation can be used to determine the optimal process conditions to repeatably yield the desired surface hydroxyl concentration and mean hydroxyl group spacing.

Although described in terms of single and two-step processes, multi-step processes involving as many discrete steps as desired with pre-determined process conditions and pre-determined lengths of time are also within the scope of the present invention.

The above described steps of contacting the substrate with a wet chemical composition to obtain a treated substrate comprising an increased concentration of surface hydroxyl groups relative to the initial concentration of surface hydroxyl groups; and heating the treated substrate to a temperature of from about 200° C. to about 600° C., wherein the heating step converts at least a portion of the surface hydroxyl groups on the first surface to surface siloxane groups on the surface of the substrate provide the basis for the next step in the process which is passivating the first surface so that a layer can be selectively deposited on the second surface.

Although presented in the context of producing passivation coatings, the teachings herein can also be readily applied to film deposition conditions through the appropriate choice of deposition precursor molecules and film deposition process conditions (temperature, pressure, partial pressure(s) and duration, coupled with purge conditions (P, T, purge gas and duration) for ALD-like processes) to enable improved deposition conditions for Si-containing substrate surfaces that comprise Si, O, C, N, H and combinations of the foregoing, including dopants such as, for example, boron, phosphorous, arsenic, and antimony. These processes might be selective by incorporating the teachings herein, or non-selective with regard to film deposition and substrate chemical topography. By providing an improved starting $SiO_2$ surface with reduced steric hindrance and higher reactivity using the methods disclosed herein, many film deposition processes can be improved. Although presented in the specific case of $SiO_2$, pre-treatments of other surfaces using similar techniques as described herein may also improve film deposition on those surfaces at low deposition temperatures.

Although described in terms of the $SiO_2/Si$ (100) system, the thermal treatment step can be utilized for many additional materials to enable selective passivation and/or activation of the desired surfaces and thereby enable selective film deposition processes. The chemical surface terminations present on Si(100), Si-containing dielectrics and other materials can be similarly altered through the use of appropriate precursor chemicals and appropriate processing to enable selective deposition through selective surface activation/passivation.

In some embodiments, the method of the present invention includes the step of exposing the substrate, at a temperature equal to or below the heating step, to a silicon-containing compound selected from the group consisting of Formula I and Formula II:

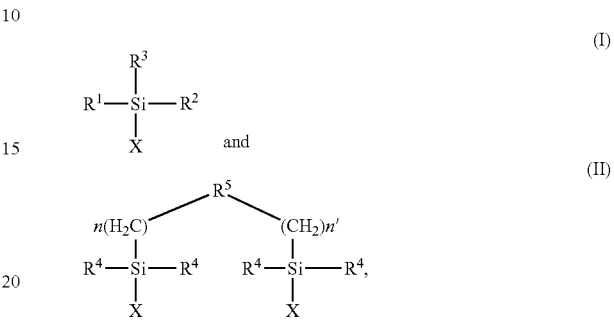

wherein $R^1$, $R^2$, and $R^4$ are each independently selected from H, a $C_1$ to $C_8$ linear alkyl group, a branched $C_3$ to $C_8$ alkyl group, a $C_3$ to $C_8$ cyclic alkyl group, a $C_3$ to $C_{10}$ heterocyclic group, a $C_3$ to $C_{10}$ alkenyl group, a $C_4$ to $C_8$ aryl group, and a $C_3$ to $C_{10}$ alkynyl group; $R^3$ is selected from a $C_1$ to $C_{18}$ alkyl group, a branched $C_3$ to $C_{10}$ alkyl group, a $C_4$ to $C_{10}$ heterocyclic group and a $C_4$ to $C_{10}$ aryl group; $R^5$ is selected from a bond, a $C_1$ to $C_8$ linear alkyl group, a branched $C_3$ to $C_8$ alkyl group, a $C_3$ to $C_8$ cyclic alkyl group, a $C_3$ to $C_{10}$ heterocyclic group, a $C_3$ to $C_{10}$ alkenyl group, a $C_4$ to $C_8$ aryl group, and a $C_3$ to $C_{10}$ alkynyl group; X is selected from $NR^aR^b$, Cl, F, Br, I, —$OCH_3$, and —OH, wherein $R^a$ and $R^b$ are each independently selected from H, a $C_1$ to $C_4$ linear alkyl group and a $C_1$-$C_4$ branched alkyl group; and n and n' are each independently selected from a number of from 0 to 5, wherein n+n'>1 and <11, wherein the silicon-containing compound reacts with the surface hydroxyl groups of the first surface to form a silyl ether-terminated surface and thereby passivate the surface.

In another embodiment, the compounds for use in the method of the present invention are selected from the group consisting of Formula I and Formula II:

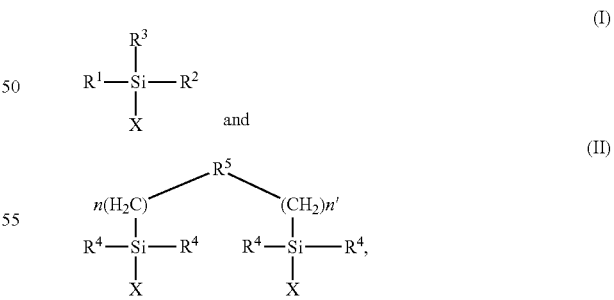

wherein $R^1$, $R^2$, and $R^4$ are each independently selected from H, a $C_1$ to $C_{18}$ linear alkyl group, a branched $C_3$ to $C_8$ alkyl group, a $C_3$ to $C_{18}$ cyclic or bicyclic alkyl group, a $C_3$ to $C_{18}$ heterocyclic group, a $C_3$ to $C_{18}$ alkenyl group, a $C_4$ to $C_8$ aryl group, and a $C_3$ to $C_M$ alkynyl group; $R^3$ is selected from a $C_1$ to $C_{18}$ alkyl group, a branched $C_3$ to $C_{10}$ alkyl group, a $C_4$ to $C_{10}$ heterocyclic group and a $C_4$ to $C_{10}$ aryl group; $R^5$ is selected from a bond, a $C_1$ to $C_{18}$ linear alkyl group, a branched $C_3$ to $C_{18}$ alkyl group, a $C_3$ to $C_{18}$ cyclic or bicyclic alkyl group, a $C_3$ to $C_{10}$ heterocyclic group, a $C_3$ to $C_{18}$ alkenyl group, a $C_4$ to $C_8$ aryl group, and a $C_3$ to $C_{10}$ alkynyl group; X is selected from $NR^aR^b$, Cl, F, Br, I, —$OCH_3$, and —OH, wherein $R^a$ and $R^b$ are each independently selected from H, a $C_1$ to $C_a$ linear alkyl group and a $C_1$-$C_4$ branched alkyl group; and n and n' are each independently selected from a number of from 0 to 5, wherein n+n'>1 and <11.

As shown above, there are two general classes of silicon-containing precursor molecules represented by the structures of Formula I and Formula II that may be employed for passivation of $SiO_2$. Each class of compounds are designed to bond to the surface hydroxyl groups through a single reactive ligand (halogeno, amino, alkoxy or silanol), as opposed to many of the precursors in the prior art that rely on multiple reactive ligands (i.e., trialkoxy or trichloro species). It is presently believed that the single reactive ligand species of the present invention will have a high propensity to form monolayer passivation layers with higher overall surface coverage, particularly in light of the surface hydroxyl distribution on the $SiO_2$ surfaces that will be provided herein after the thermal treatment step. All are based upon the concept that the Si—O—Si bond will be the most advantageous in terms of anchoring the passivation molecule to the surface of the $SiO_2$ and, thus, the atoms that incorporate the reactive ligand are all Si for the present description of the $SiO_2$/Si (100) system.

The two general 'classes' of precursor molecules include those with:

Formula I—One anchor atom to bond to the surface (monopodal molecules); and

Formula II—Two anchor atoms to bond to the surface (bipodal molecules)

Additional embodiments also include the use of fluorocarbon ligands with the caveat that they include at least one hydrocarbon ($CH_2$) link bonded directly to the silicon atom, thereby separating the silicon atom from direct bonding with the fluorocarbon portion of the ligand (i.e. there are no Si—$CF_x$ bonds present within the molecule that will form the surface passivation layer). Specific, non-limiting examples include iodo tris(3,3,3-trifluoropropyl) silane, dimethylamino tris(3,3,3-trifluoropropyl) silane, [($CF_3CF_2(CH_2)_6(CH_3)_2SiCl$] and bromo tris(1,1,1-3,3,3-hexafluoroisopropyl) silane.

Specific examples of compounds according to Formula I include, but are not limited to the following:

A. Trimethylsilicon chloride; trimethylsilicon bromide; trimethylsilicon Iodide; dimethylaminotrimethyl silane; ethylmethylaminotrimethyl silane; diethylaminotrimethyl silane; ethylpropylaminotrimethyl silane; di-propylaminotrimethyl silane; ethylisopropylaminotrimethyl silane; di-isopropylaminotrimethyl silane; di-n-butyltrimethyl silane; di-isobutyltrimethyl silane; di-sec-butyltrimethyl silane;

B. Triethylsilicon chloride; triethylsilicon bromide; triethylsilicon iodide; dimethylaminotriethyl silane; ethylmethylaminotriethyl silane; diethylaminotriethyl silane; ethylpropylaminotriethyl silane; di-propylaminotriethyl silane; ethylisopropylaminotriethyl silane; di-iso-propylaminotriethyl silane; di-n-butyltriethyl silane; di-isobutyltriethyl silane; di-sec-butyltriethyl silane;

C. Tri-n-propylsilicon chloride; tri-n-propylsilicon bromide; tri-n-propylsilicon iodide; dimethylaminotri-n-propyl silane; ethylmethylaminotri-n-propyl silane; diethylaminotri-n-propyl silane; ethylpropylaminotri-n-propylsilane; di-propylaminotri-n-propyl silane; ethylisopropylaminotri-n-propyl silane; di-iso-propylaminotri-n-propyl silane;

D. Tri-isopropylsilicon chloride; tri-isopropylsilicon bromide; tri-isopropylsilicon iodide; dimethylaminotri-isopropyl silane; ethylmethylamino tri-isopropyl silane; diethylamino tri-isopropyl silane; ethylpropylaminotri-isopropyl silane; di-propylamino tri-isopropyl silane; ethylisopropylamino tri-isopropyl silane; di-iso-propylamino tri-isopropyl silane;

E. Tri-n-butylsilicon chloride; Tri-n-butylsilicon bromide; Tri-n-butylsilicon iodide; dimethylaminotri-n-butyl silane; ethylmethylamino tri-n-butyl silane; diethylamino tri-n-butyl silane;

F. Tri-isobutylsilicon chloride; tri-isobutylsilicon bromide; tri-isobutylsilicon iodide; dimethylaminotri-isobutyl silane; ethylmethylamino tri-isobutyl silane; diethylamino tri-isobutyl silane;

G. Tri-secbutylsilicon chloride; tri-secbutylsilicon bromide; tri-secbutylsilicon iodide; dimethylaminotri-secbutyl silane; ethylmethylamino tri-secbutyl silane; diethylamino tri-secbutyl silane;

H. Tri-n-pentylsilicon chloride; tri-n-pentylsilicon bromide; tri-n-pentylsilicon iodide; dimethylaminotri-n-pentyl silane;

I. Chloro-tris(3,3,3-trifluoropropyl)silane; bromo-tris(3,3,3-trifluoropropyl)silane; iodo-tris(3,3,3-trifluoropropyl)silane; dimethylamino-tris(3,3,3-trifluoropropyl)silane; ethylmethylamino-tris(3,3,3-trifluoropropyl)silane; diethylamino-tris(3,3,3-trifluoropropyl)silane; ethylpropylamino-tris(3,3,3-trifluoropropyl)silane; di-propylamino-tris(3,3,3-trifluoropropyl)silane; ethylisopropylamino-tris(3,3,3-trifluoropropyl)silane; di-iso-propylamino-tris(3,3,3-trifluoropropyl)silane;

J. Chloro-tris(4,4,4-trifluorobutyl)silane; bromo-tris(4,4,4-trifluorobutyl)silane; iodo-tris(4,4,4-trifluorobutyl)silane; dimethylamino-tris(4,4,4-trifluorobutyl)silane;

K. Octyldimethylsilicon chloride; octyldimethylsilicon bromide; octyldimethylsilicon iodide; dimethylaminooctyldimethyl silane;

L. Decyldimethylsilicon chloride; Decyldimethylsilicon bromide; Decyldimethylsilicon iodide; dimethylamino Decyldimethyl silane;

M. Dodecyldimethylsilicon chloride; Dodecyldimethylsilicon bromide; Dodecyldimethylsilicon iodide; dimethylaminododecyldimethyl silane;

N. Hexadecyldimethylsilicon chloride; Hexadecyldimethylsilicon bromide; Hexadecyldimethylsilicon iodide; dimethylaminohexadecyldimethyl silane;

O. Octadecyldimethylsilicon chloride; Octadecyldimethylsilicon bromide; Octadecyldimethylsilicon iodide; dimethylamino-octadecyldimethyl silane;

P. Chlorodimethyl(1H,1H-2H,2H-perfluorooctyl)silane; bromodimethyl(1H,1H-2H,2H-perfluorooctyl)silane; iododimethyl(1H,1H-2H,2H-perfluorooctyl)silane; dimethylaminodimethyl(1H,1H-2H,2H-perfluorooctyl)silane;

Q. Chlorodimethyl(1H,1H-2H,2H-perfluorodecyl)silane; bromodimethyl(1H,1H-2H,2H-perfluorodecyl)silane; iododimethyl(1H,1H-2H,2H-perfluorodecyl)silane; dimethylamino-dimethyl(1H,1H-2H,2H-perfluorodecyl)silane; and R. Chlorodimethyl(1H,1H-2H,2H-perfluorododecyl)silane; bromodimethyl(1H,1H-2H,2H-perfluorododecyl)silane; iododimethyl(1H,1H-2H,2H-perfluorododecyl)silane; dimethylamino-dimethyl(1H,1H-2H,2H-perfluorododecyl)silane.

Specific examples of compounds according to Formula II and II(a) include, but are not limited to the following 1,3-bis-chlorodimethylsilyl(ethane); 1,3-bis-bromodimethylsilyl(ethane); 1,3-bis-iododimethylsilyl(ethane); 1,3-bis-dimethylamino-dimethylsilyl(ethane); 1,3-bis-chlorodimethylsilyl(propane); 1,3-bis-bromodimethylsilyl(propane); 1,3-bis-iododimethylsilyl(propane); 1,3-bis-dimethylamino-dimethylsilyl(propane); 1,3-bis-chlorodimethylsilyl(butane); 1,3-bis-bromodimethylsilyl(butane); 1,3-bis-iododimethylsilyl(butane); and 1,3-bis-dimethylamino-dimethylsilyl(butane).

Additional embodiments also include the use of fluorocarbon ligands in any desired R group position with the caveat that they include at least one hydrocarbon ($CH_2$) link bonded directly to the silicon atom, thereby separating the silicon atom from direct bonding with the fluorocarbon portion of the ligand (i.e., there are no Si—$CF_x$ bonds present within the molecule that will form the surface passivation layer).

A benefit of the method of the present invention is that one can control the surface density of —OH groups by heating the surface as detailed above after wet chemical treatment. The heat will drive off a portion of the —OH groups. This surface density can be measured by, for example, low energy ion scattering, TOF-SIMS, or FTIR (surface mode), and, from that information, a precursor can be selected for optimal passivation based on the size of the precursor. For example, if the distances between —OH groups is about 6.5 Å, then, for example, a bipodal precursor with ethyl ("$(CH_2)_2$") or propyl (("$(CH_2)_3$") linkage may be a good "fit" because the length of a propyl group is about 6.9 Å.

Without intending to be bound by any particular theory, it is believed that optimal passivation results for $SiO_2$ dielectric surfaces can be achieved through a combination of thermal treatment processing and passivation molecule design. Specifically, it is presently believed that removal of adsorbed moisture and tightly clustered surface hydroxyl groups from the $SiO_2$ surface will yield a surface hydroxyl population that is largely free of hydrogen bonding, an increased number of surface siloxane-like (Si—O—Si) bonds that are far less reactive than hydroxyl groups (and that also have less polarity than —OH surface bonds) and that can be tailored to have a mean separation distance that can be controlled through the pre-treatment process conditions. It is believed that this surface will allow essentially complete passivation of reactive chemical sites through the use of specific passivation molecules that have intramolecular lengths that match their reactive group distances to the hydroxyl group surface spacing.

The ability to design molecules with the desired/designed spacing of groups from both steric hindrance and a reactive ligand spacing perspectives provides a marked improvement over the prior art. It may lead to much faster gas phase surface passivation coating formation reactions and, simultaneously, improved surface coverage (limited only by the inherent 'steric crowding' imparted by the choice of organic ligands incorporated into the parent passivation molecule). For the specific embodiment of selective passivation of a $SiO_2$ surface relative to a Si(100) surface the thermal pre-treatment temperature is preferably between from about 375 to about 450° C. in order to provide a mean surface hydroxyl spacing of approximately 6.5 angstroms while leaving the H-terminated Si(100) surface provided by the initial wet cleaning steps intact and essentially unchanged. The preferred precursor molecules for this surface depend upon whether they have 1 or 2 points of surface bonding embedded within the molecule (i.e., 1 or 2 reactive ligands with no more than 1 reactive ligand attached to any given atom within a precursor molecule). For 1 point of surface bonding molecules, the spacing is largely driven by steric hindrance constraints and the non-reactive ligand(s) are selected such that they will not hinder reactions at neighboring 'free' hydroxyl sites, but such that they will provide maximum surface coverage by organic functionalities. For dipodal point of surface bonding molecules, the spacing between the two (single reactive ligand) atoms is made to be slightly larger than the mean spacing between surface hydroxyl groups.

The controlled "free" surface hydroxyl spacing, coupled with the molecular design may enable rapid and complete, vapor phase formation of surface passivation coatings. This represents a potential marked improvement over the prior art and may result in commercially feasible selective ALD processes for $SiO_2$/Si surfaces.

Additional advantages include: (1) that the increased reactivity of the "free" hydroxyl groups enables the use of a wider range of reactive ligands to attach the surface passivation moieties to the $SiO_2$ surfaces relative to $SiO_2$ surfaces not so prepared (i.e., enables the use of a broader range of precursor chemistries); (2) that the passivation layer that is formed will be formed more rapidly and more completely at reaction temperatures higher than the minimum reaction temperature with better (maximized) surface coverage relative to related-art surfaces not so prepared; (3) formation of $SiO_2$ passivated surfaces with improved resistance to precursor nucleation in subsequent ALD film deposition processes by virtue of the closest-packed passivation layer and the reduction in the number of residual surface hydroxyl bonds (present beneath the surface passivation layer for $SiO_2$ surfaces of the prior art) enabling improved selective film deposition in subsequent process steps.

It is preferred that the passivation layer be formed as soon as possible after heat treatment to avoid exposure of the treated surfaces to moisture or oxygen.

When used as co-reactants or catalysts, amines are meant to encompass the class of molecules including $NR_3$ where R is independently H, alkyl, aryl, alkene, etc. and pyridine and pyridine derivatives. It is known in the art that amines can be used in conjunction with molecules encompassing halogen reactive groups to achieve lower overall reaction temperature for reactions on the hydroxylated surfaces of the related art. If used in conjunction with the teachings of the present invention, such amines might enable even lower temperature reactions to form the desired passivation layers, as well as reduced reaction times. Absent the teachings of the present invention, the use of these molecules can enable the formation of the desired passivation layers at lower temperatures than in their absence. In all cases where amine co-reactants are utilized, there is the risk of contamination and poisoning of the hydroxylated surface through the formation of condensed pyridinium or ammonium halide salts. Care must be used in process development to minimize the contamination of the hydroxylated surfaces by these salts using methods known to those skilled in the art.

Vapor phase reactions are meant to imply that the precursors are exposed to the heated and pre-treated substrate (that is contained in a sealed vessel) through introduction of the precursors in the vapor phase, but this does not preclude condensation of precursors or co-reactants on the surface of the substrate if the substrate temperature is below the boiling point of the precursors and/or co-reactants (i.e. a liquid layer may be allowed to form to promote the reaction of the surface hydroxyl groups with the precursors and/or reactants).

Liquid (solution) phase reactions are meant to imply that the precursors and/or co-reactants are introduced directly onto the surface of the substate in the liquid state, either 'neat' or in conjunction with a suitable liquid solvent. If a solvent is used, it should be ultra-high purity and non-reactive with either the substrate or the precursors and/or co-reactants.

Vapor phase or gas phase reactions include those between the surface hydroxyl groups provided by the passivation step and the single reactive ligand on the precursor molecule. They include the exposure of the heated substrate to the precursor molecule(s) and/or co-reactants in a suitable chamber that must be capable of providing the necessary pressure control and that can also supply heat to the substrate and/or chamber walls; the chamber should also provide suitable purity for the reactions that will take place, generally through high leak integrity and the use of ultra-high purity carrier and reactive gases. Another embodiment of the invention relates to using cooling of the substrate to promote the formation of a liquid layer of precursor(s) and/or co-reactants on the surface of the substrate prior to subsequently heating the substrate to react the precursor(s) and/or co-reactants with the surface hydroxyl groups.

The term "precursors" is intended to mean the single reactive ligand, single anchor point and/or two anchor point molecules described previously herein. They may be used in conjunction with ultra-high purity carrier gases (as defined previously) and in any desired mixtures with one another (i.e. more than one type of precursor can be used either together or in discrete, independent steps to form the desired passivation layer with whatever order of precursor introduction is desired). Co-reactants are meant to mean the catalytic amine reactants disclosed previously (if they are to be used).

The precursor(s) and/or co-reactants may be delivered to the reactor using mass flow controllers (perhaps with heated lines), liquid injection vaporizers (perhaps with heated lines) or with no metering device (i.e. neat introduction of the vapor and or gas from a vessel that is isolated from the reactor using a simple valve). Any of the foregoing may also be used in combination with one another. Any means of providing the gas and/or vapor(s) to the reaction chamber that provides sufficient purity and repeatability may be used.

The precursor(s) and/or co-reactants may be introduced independently to the reactor, mixed prior to introduction to the reactor, mixed in the reactor or in any combination of the preceding in multiple, independent steps that might include differences in how the precursors are introduced between steps.

For direct vapor phase reactions, it is believed that the temperature range for reaction should be selected to be near the maximum stability temperature of a given surface passivation layer (as mentioned previously). However, the temperature range of the reactions may be between room temperature and 700° C., with the caveat that the temperature should be equal to or less than that of the pre-treatment temperature. The pressure may range from 10-10 Torr to 3000 Torr and may be maintained under dynamic flow conditions (i.e. with a valve and a butterfly valve type arrangement) or may be maintained under static conditions (i.e. an evacuated chamber is exposed to the desired precursor(s) and/or co-reactant(s) until a total desired pressure is achieved and then the chamber is isolated from both the precursor(s) and/or co-reactant(s) source(s) and the vacuum pump). The reactor can be evacuated fully and re-exposed to fresh precursor(s) and/or co-reactants as many times as necessary. Precursor(s) and/or co-reactants may be introduced using any mixtures and/or concentrations desired.

Once the $SiO_2$ surface is passivated the surface comprising SiH is active for further selective reactions such as, for example, a selective ALD deposition of SiCN on the Si—H surface. Additional materials that may be selectively deposited on the surface comprising SiH include silicon films comprising oxygen, nitrogen, hydrogen and carbon (i.e., $SiO_x$, $SiN_x$, $SiO_xN_y$, $SiC_xN_y$, $SiO_xC_y$, all possibly incorporating H as well), metals metal nitrides, and metal oxides.

In some embodiments, a metal oxide film is selectively deposited on the second surface. In one example, the metal oxide film may serve as a cap layer on the second surface. The metal oxide film can, for example, be deposited by atomic layer deposition (ALD), plasma-enhanced ALD (PEALD), chemical vapor deposition (CVD), plasma-enhanced CVD (PECVD), or pulsed CVD. According to one embodiment, the metal oxide film may be selected from the group consisting of $HfO_2$, $ZrO_2$, $TiO_2$, $Al_2O_3$, and a combination thereof. In some examples, the metal oxide film may be deposited by ALD using alternating exposures of a metal organic precursor and an oxidizer (e.g., $H_2O$, $H_2O_2$, plasma-excited $O_2$ or $O_3$).

Selective depositions according to the present invention can be, for example, metal and metal oxide layers disclosed in Hamalainen et al., "Atomic Layer Deposition of Noble Metals and Their Oxides," Chem. Mater. 2014, 26, 786-801; and Johnson et al., "A Brief review of Atomic layer Deposition: From Fundamentals to Applications", Materials Today, Volume 17, Number 5, June 2014, both of which are incorporated herein by reference in their entireties.

In some embodiments, a metal film is selectively deposited on the second surface. In one example, the metal film may serve as a cap layer on the second surface. In another example, the metal film may serve as a conductive pathway on the second surface (i.e. a line, pad or plug). In another example the metal film can, for example, be deposited by atomic layer deposition (ALD), plasma-enhanced ALD (PEALD), chemical vapor deposition (CVD), plasma-enhanced CVD (PECVD), or pulsed CVD. According to one embodiment, the metal film may be selected from the group consisting of Al, Ti, Co, Rh, Ir, Fe, Ru, Os, Mn, Tc, Re, Cu, Ag, Au, Ni, Pd or Pt and a combination thereof.

In some embodiments, a metal or metal nitride film is selectively deposited on the second surface. In one example, the metal or metal nitride film may serve as a cap layer on the second surface. In another example, the metal or metal nitride film may serve as a diffusion barrier layer. The metal or metal nitride film can, for example, be deposited by atomic layer deposition (ALD), plasma-enhanced ALD (PEALD), chemical vapor deposition (CVD), plasma-enhanced CVD (PECVD), or pulsed CVD. Examples are found in, for example, "IBM Research Report, "Atomic Layer Deposition of Metal and Metal Nitride Thin Films: Current Research Efforts and Applications for Semiconductor Device Processing," RC22737 (W0303-012), Mar. 5, 2003.

In some embodiments deposition on a first surface of a substrate as described herein, such as a $SiO_2$ surface of the substrate, relative to a second H-terminated surface of the substrate is at least about 90% selective, at least about 95% selective, at least about 96%, 97%, 98% or 99% or greater selective. In some embodiments deposition only occurs on the first surface and does not occur on the second surface. In some embodiments deposition on the first surface of the substrate relative to the second surface of the substrate is at least about 70% selective, or at least about 80% selective, which may be selective enough for some particular applications. In some embodiments deposition on the first surface of the substrate relative to the second surface of the substrate is at least about 50% selective, which may be selective enough for some particular applications.

EXAMPLE

Figure 2:
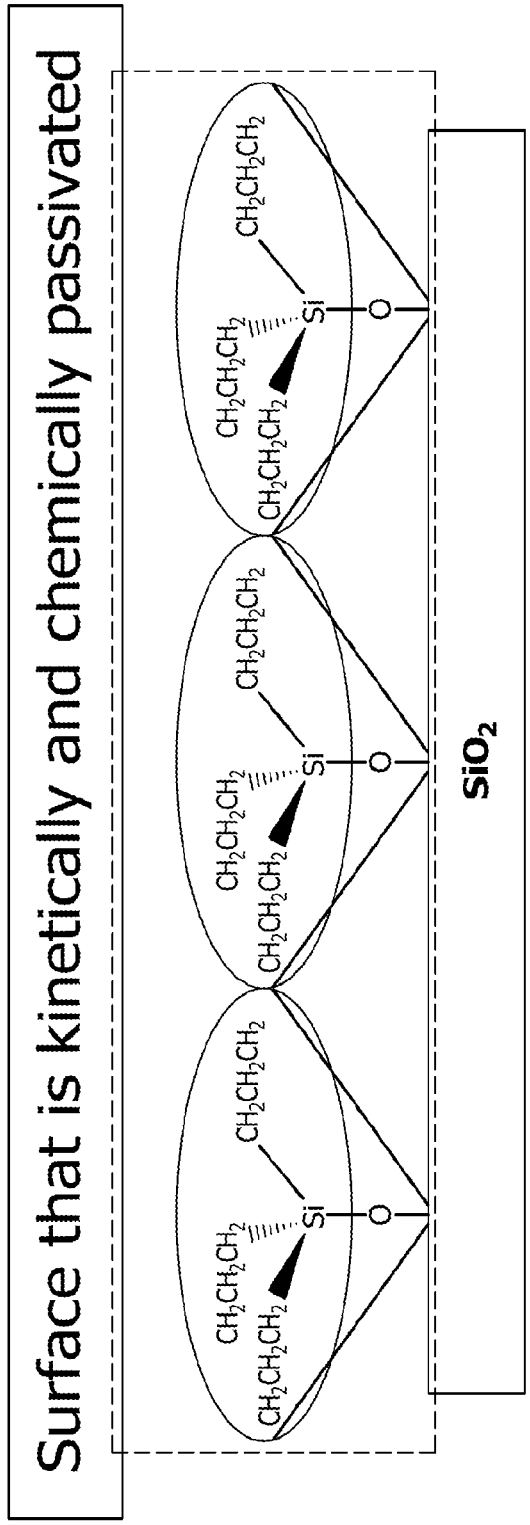
FIG. 2 is an illustration of a passivated surface according to the present invention.

The following examples will demonstrate each of the claimed method steps. The goal of the invention and that of the experiments that have been run is to produce a $SiO_2$ surface that is nearly free of hydroxyl groups and that, additionally, has a monolayer to sub-monolayer coverage of an organosilane passivating coating. In a preferred embodiment, the 'steric' hindrance of the passivating molecules on the surface of the $SiO_2$ closely matches the nearly uniform mean spacing of the surface hydroxyl groups left after the thermal treatment step has been completed (see illustration of FIG. 2).

Step 1: Contacting the Substrate with a Wet Chemical Composition to Obtain a Treated Substrate Comprising an Increased Concentration of Surface Hydroxyl Groups Relative to the Initial Concentration of Surface Hydroxyl Groups Example 1: Increase of Surface Hydroxyl Concentration with SC-1 Wet Chemical Exposure Independent coupons of $SiO_2$ and Si(100) are simultaneously processed through the following sequence of steps:

Both substrate surfaces were first cleaned in a freshly prepared solution comprising hydrogen peroxide (28-30%), ammonium hydroxide (28%) and distilled de-ionized water in the ratio of 200 ml:100 ml:1000 ml, the cleaning encompassing first mixing the chemicals together in a quartz beaker, heating the solution in the beaker to 70° C.+/−5° C., fully immersing the substrate surfaces in the pre-heated cleaning solution for 10 minutes, removing the substrates from the cleaning solution and immersing them in a container filled with fresh distilled deionized water and rinsing said substrates until the cleaning solution concentration on the substrates has been diluted to below detection limits.

The effectiveness and completeness of the cleaning step can be measured using contact angle measurements (goniometer measurements) with the liquid comprised of water or any other suitable fluid. The data presented herein is for distilled de-ionized water droplets that have a volume of 2 μL.

The starting surfaces (in the as-received state) were measured multiple times and were found to lie within the ranges shown below:
$SiO_2$: 32-43°
Si(100): 26-35°

It is believed that the variability observed in the as-received contact angle measurements is the direct result of the adsorption of atmospheric moisture onto the oxide surfaces that are common to both substrates in the as-received state.

The surfaces of both the $SiO_2$ and Si(100) substrates were measured by goniometer measurements and TOF-SIMS measurements to be hydroxylated to a much higher degree than those of the starting samples. The water contact angles of the fully hydroxylated surfaces were measured and were found to lie within the ranges shown below:
$SiO_2$: 5-10°
Si(100): 5-10°

After the surfaces were demonstrated to be wetting and hydrophilic, the first step is complete. Although illustrated through a wet cleaning step, the invention is not so limited.

Figure 3:
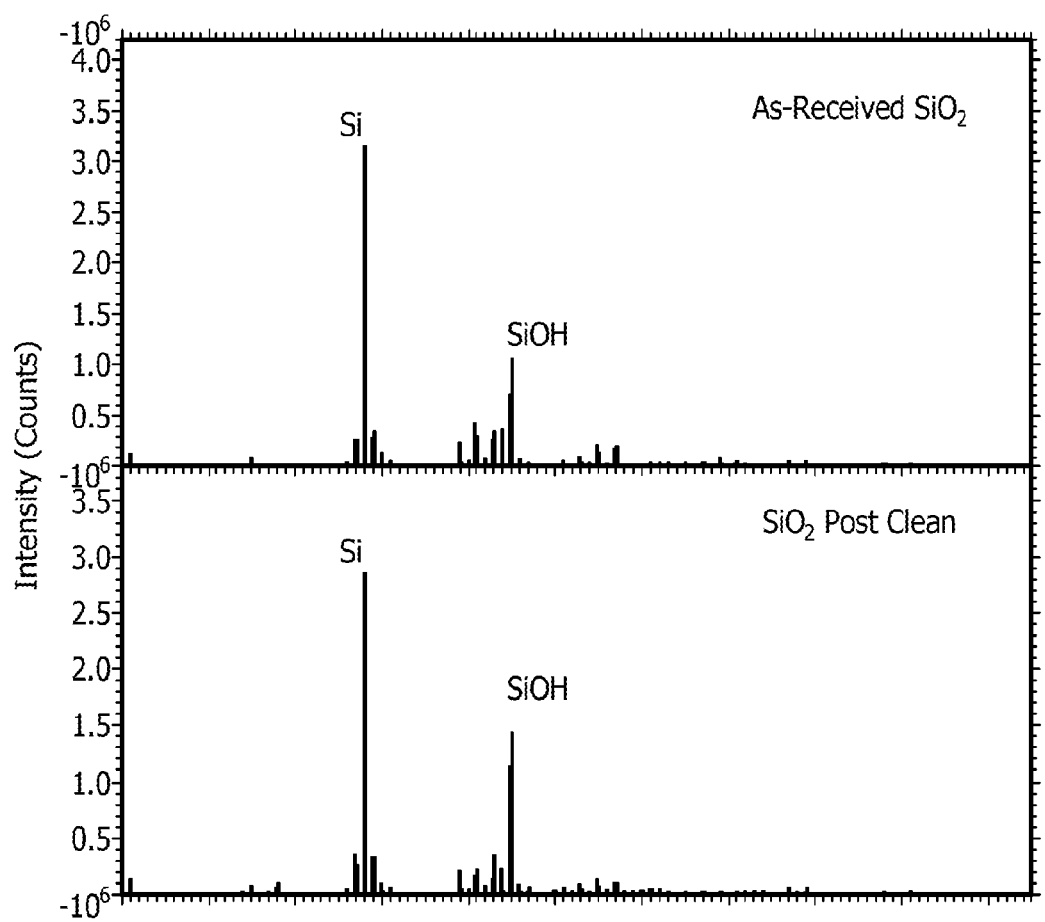
FIG. 3 is a TOF-SIMS spectra of a substrate surface after a wet chemical exposure step according to an embodiment of the present invention.

The state of the $SiO_2$ surfaces in the as-received and post-clean states is also reflected through TOF-SIMS measurements of the $SiO_2$ substrates. These measurements allow 'semi-quantitative' characterization of the surface concentrations of hydroxyl, hydride and other species present on the substrates. Representative TOF-SIMS spectra for the as-received and post-clean states are presented in FIG. 3, which illustrates a clear increase in hydroxyl surface concentration post cleaning as shown through the difference in the relative intensities between the two SiOH peaks for the two samples. This increase in hydroxyl surface concentration post cleaning is what enables the desired controlled decrease in the surface hydroxyl concentration.

Example 2: Conversion of the Si—OH Bonds on the Si(100) Surface to Si—H Bonds

The fully hydroxylated $SiO_2$ and Si(100) surfaces provided by the previous example are then simultaneously treated using an HF solution with a concentration of between 2.0-3.0% (0.1%-5.0% range) for a time sufficient to yield a fully hydrophobic surface on the Si(100) and are then rinsed in water and blown dry using a stream of ultra-high purity nitrogen. Typically the formation of the Si(100)-H terminated surface takes between 80 and 110 s at room temperature (range: 20 s-600 s). The surfaces of the $SiO_2$ and the Si(100) were characterized using contact angle measurements. In general it is believed that the lower the contact angle on the $SiO_2$ surface and the closer that the contact angle is to 90° on the Si(100)-H surface, the better the results of the HF-etch step for purposes of the invention. Typical values measured post the HF-etch step for the two substrate surfaces include:
$SiO_2$: 4-8°
Si(100): 80°-90°

Due to the high degree of surface hydroxylation, these types of $SiO_2$ substrates are even more susceptible to atmospheric contaminants and moisture adsorption than the as-received samples, so care should be exercised during their storage and handling prior to loading into the reactor system. For the invention to perform as intended, it is necessary to fully remove any of this type of excess moisture from the sample surfaces prior to performing the thermal treatment step. This is accomplished by heating under reduced pressure conditions at a temperature of about 200° C. for a period of 1-10 minutes. Ambient can be vacuum (or reduced pressure under ultra-high purity inert gas flow ($N_2$, He, Ne, Ar, etc. . . . ) at a pressure from 10-5 Torr to 740 Torr.

Similarly, the Si(100)-H surface has proven to show limited stability towards air exposure with a propensity to oxidize, thereby negating the chemical differentiation from the $SiO_2$ surface that is required to achieve selective passivation layer formation. For the invention to perform as intended, it is necessary to load the samples into the reactor system as quickly as possible after the HF-etch to avoid re-oxidation of the surface. Alternatively, the substrates could be stored in a chemically inert environment where the rate of oxidation is very slow relative to air and then quickly loaded into the reactor system.

Although illustrated through a wet clean, any process or combination of processes that can yield a fully hydroxylated $SiO_2$ surface [$\alpha_{OH}$ (s)=9.5 mole/m$^2$] and a fully hydrogen terminated Si(100) surface simultaneously may be used to practice the present invention. Plasma processes (as mentioned previously), wet processes or combinations of the two may be used to provide the necessary chemical terminations with the properties that have been described.

Figure 6:
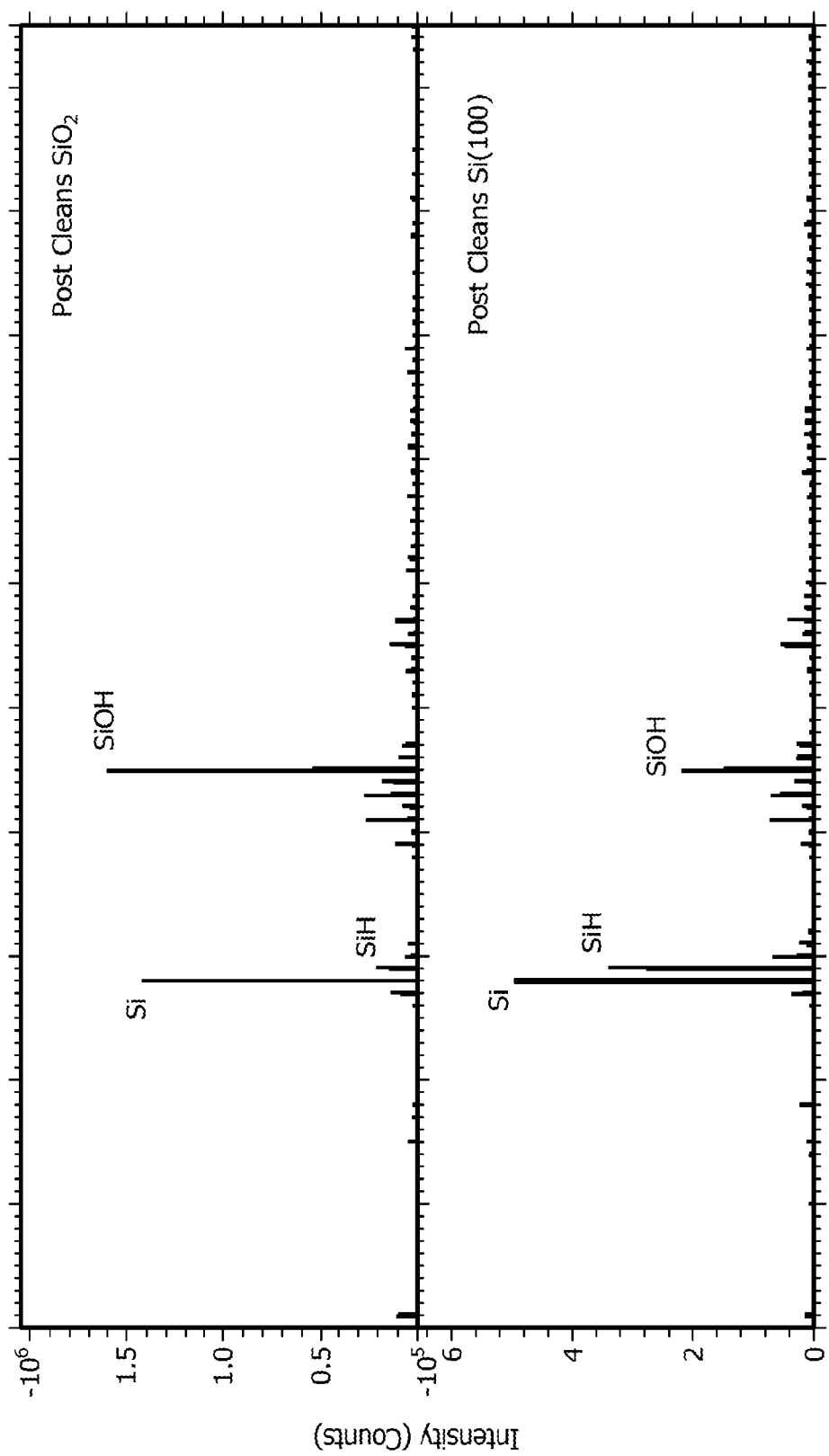
FIG. 6 is a TOF-SIMS spectra of a substrate surface after a wet chemical exposure step according to an embodiment of the present invention.

The state of the Si(100) and $SiO_2$ surfaces in the post-clean states (SC-1 and HF) has also been characterized through TOF-SIMS measurements. These measurements allow semi-quantitative characterization of the surface concentrations of hydroxyl, hydride and other species present on the substrates. Representative TOF-SIMS spectra for the Si(100) and SiO$_2$ surfaces post SC-1 clean and HF-etch are shown in FIG. 6. It is believed that the small hydroxyl peak shown in FIG. 6 is due to some oxidation that occurred to the sample in transit for measurement.

Referring to FIG. 6, despite the oxidation of the Si(100) samples that is taking place during air exposure, it is clear that the desired differentiation in chemical surface terminations has been achieved between the SiO$_2$ and Si(100) surfaces. That is, the SiO$_2$ surfaces have a very high concentration of hydroxyl groups and the Si(100) surfaces have a very high concentration of hydride groups relative to one another; even with the air oxidation that has occurred on the Si(100) surfaces, it is clear that the two substrates have very different concentrations of hydroxyl and hydride surface terminations post the cleaning steps. It also well known to those skilled in the art that an HF etch of single crystal silicon surfaces will lead to hydrophobic hydrogen surface terminations that are susceptible to oxidation upon prolonged air exposure.

Step 2: Heating the Treated Substrate to a Temperature of from about 200° C. to about 600° C., Wherein the Heating Step Converts at Least a Portion of the Surface Hydroxyl Groups on the First Surface to Surface Siloxane Groups on the Surface of the Substrate Example 3: Wet Clean Followed by Thermal Treatment The purpose of the thermal pre-treatment is to reduce the surface hydroxyl concentration by the maximal amount, ideally leaving behind only isolated hydroxyl groups that will then be passivated using one of the organosilane precursors using a vapor phase process. To realize the maximal decrease in surface hydroxyl concentration using the thermal treatment, it is first necessary to produce a fully hydroxylated surface (using wet cleans, vapor phase exposures, plasma treatments, etc. . . . ). That is, it is necessary to first increase the surface hydroxyl concentration beyond what is normally observed for an as-received or as-processed silicon dioxide surface prior to the thermal treatment to realize the surface hydroxyl termination of the present invention.

The mechanism behind the thermal treatment reduction of surface hydroxyl groups is a silanol condensation reaction with the elimination of water according to the formula:

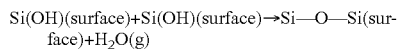
Si(OH)(surface)+Si(OH)(surface)→Si—O—Si(surface)+H$_2$O(g)

Three types of samples have been characterized using TOF-SIMS to quantify the surface hydroxyl concentrations in the pre-thermal treatment and the post-thermal treatment states:
(1) As-received thermal silicon dioxide "as-received"
(2) Silicon dioxide that has been cleaned using (NH$_4$OH+H$_2$O$_2$) "SC-1"
(3) Silicon dioxide that has been cleaned using (NH$_4$OH+H$_2$O$_2$) "SC-1" followed by an HF-etch "SC-1+HF"

The thermal treatment procedure used for each type of sample was identical and involves the following primary steps:
(1) Preparation of surface hydroxyl coverage (if any) through appropriate wet chemistry steps
(2) Loading of samples into the reactor system where they will be heated
(3) Cycle purging the samples until base pressure for the reactor system is achieved
(4) Purging the reactor system under a flow of ultra-high purity N$_2$ for sufficient time to reduce the moisture content in the reactor system that arises from opening the reactor system and from the samples themselves
(5) Executing the thermal treatment using the pre-programmed process stored in the furnace temperature controller
(6) Cooling the samples to room temperature under a flow of ultra-high purity N$_2$
(7) Unloading the samples from the reactor system and packaging them under N$_2$ for shipment for analysis Example 4: Thermal Treatment of an SC-1 Cleaned Silicon Dioxide Sample (1,000 Å Thermal SiO$_2$ on Si(100))

Several 1.5"×1.5" coupons of a 1,000 Å thermal SiO$_2$/Si (100) ["1,000 Å SiO$_2$"] were cleaved from a 4" wafer, blown off with a stream of high purity nitrogen to remove particles and then loaded into a Teflon boat suitable for immersion in an SC-1 cleaning bath. The boat and samples were then immersed in an SC-1 cleaning solution (100 ml ultra-high purity NH$_4$OH (28%-30%); 200 ml ultra-high purity H$_2$O$_2$ (28-30%); 1000 ml distilled, deionized H$_2$O) that was preheated to a temperature of 70+/−5° C. where they were cleaned for 10 minutes. The samples were then removed from the cleaning bath and rinsed of chemicals using three dump rinse cycles of distilled, deionized water. The samples were then dried thoroughly using a source of ultra-high purity N$_2$ gas that was filtered for particles.

One of the cleaned 1000 Å SiO$_2$ samples was then loaded into the tube of a tube furnace reactor system under a flow of 250 sccm ultra-high purity N$_2$ gas at room temperature. The tube was then sealed and slowly evacuated to a pressure of 10 mTorr. A flow of 20 sccm N$_2$ was then introduced into the reactor tube and a reduced pressure N$_2$ purge was conducted for 2 minutes (at a pressure of 2.3 Torr). The flow of N$_2$ was then stopped and the tube was evacuated to a pressure of ≤5 mTorr. The previously described cycle purging steps are repeated until base pressure is achieved within the reactor system.

After base pressure was achieved, a flow of 20 sccm of ultra-high purity N$_2$ was introduced into the reactor system and a reduced pressure N$_2$ purge (at 2.3 Torr) was conducted for 1 hour to reduce the background moisture concentration in the system prior to initiating the thermal treatment.

The thermal treatment was then performed under a reduced pressure purge of ultra-high purity N$_2$ gas (at 2.3 Torr) using the pre-programmed heating process recipe stored on the temperature controller for the furnace. The heat traces of two independent thermocouples (one representing the external tube temperature—'wall' and one representing the sample temperature—'sample') are shown in FIG. 4, which illustrates the sample temperature as a function of time.

Figure 4:
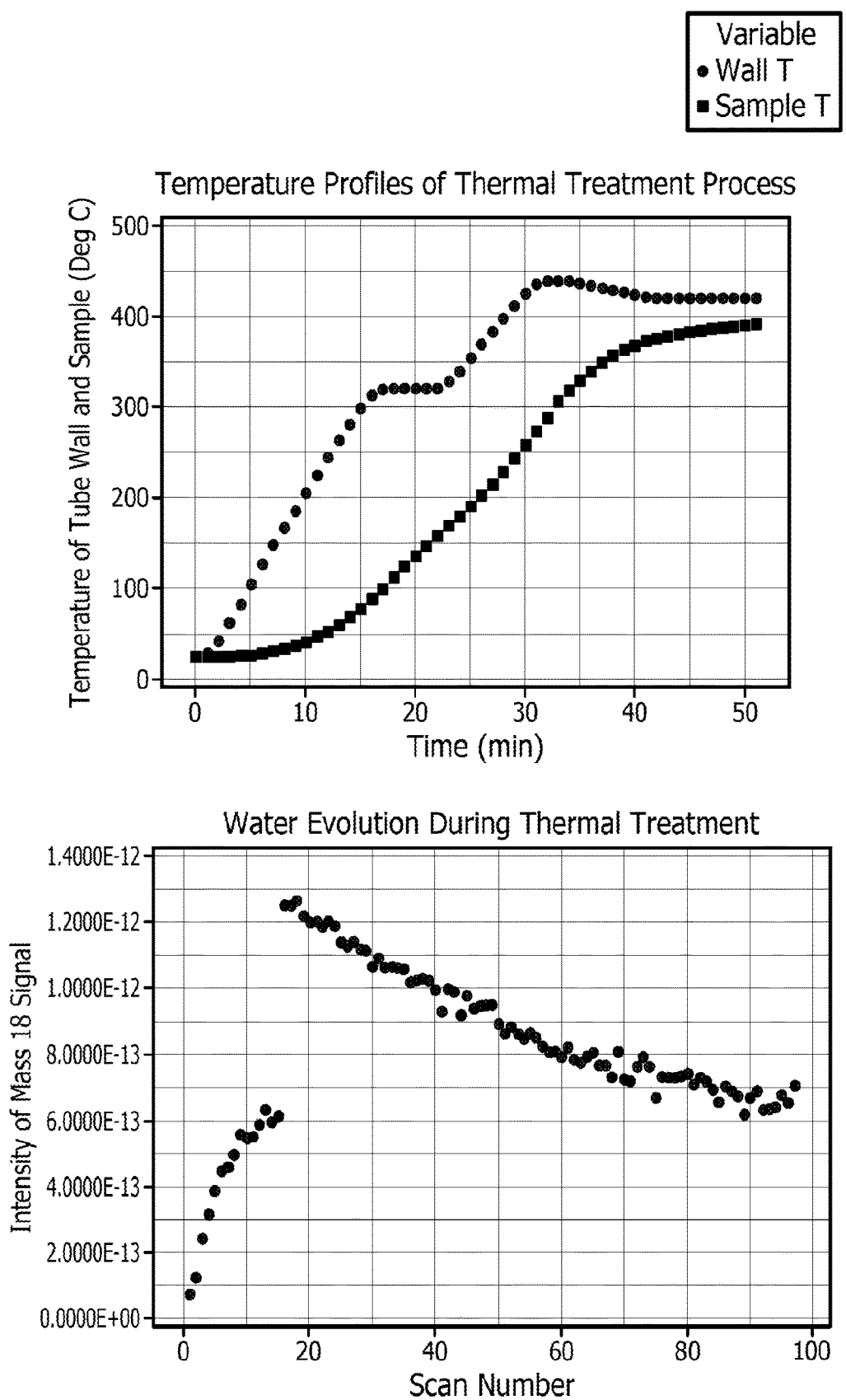
FIG. 4 is a graph illustrating the temperature profile verus time for a thermal treatment step according to an embodiment of the present invention as well as the corresponding QMS spectra showing loss of $H_2O$ signal.

FIG. 4 also shows the trace of the moisture emission from the sample that occurs during the thermal treatment step (as measured by an in-situ quadrupole mass spectrometer (QMS)). This emission of moisture is consistent with the silanol condensation reaction described previously.

After the thermal treatment process was completed, the sample was cooled to room temperature under a flow of 20 sccm ultra-high purity N$_2$ (at a pressure of 2.3 Torr). The sample was then unloaded under a flow of 500 sccm N$_2$, quickly enclosed in a container and then stored under $N_2$ for shipment to the vendor for TOF-SIMS.

Figure 5:
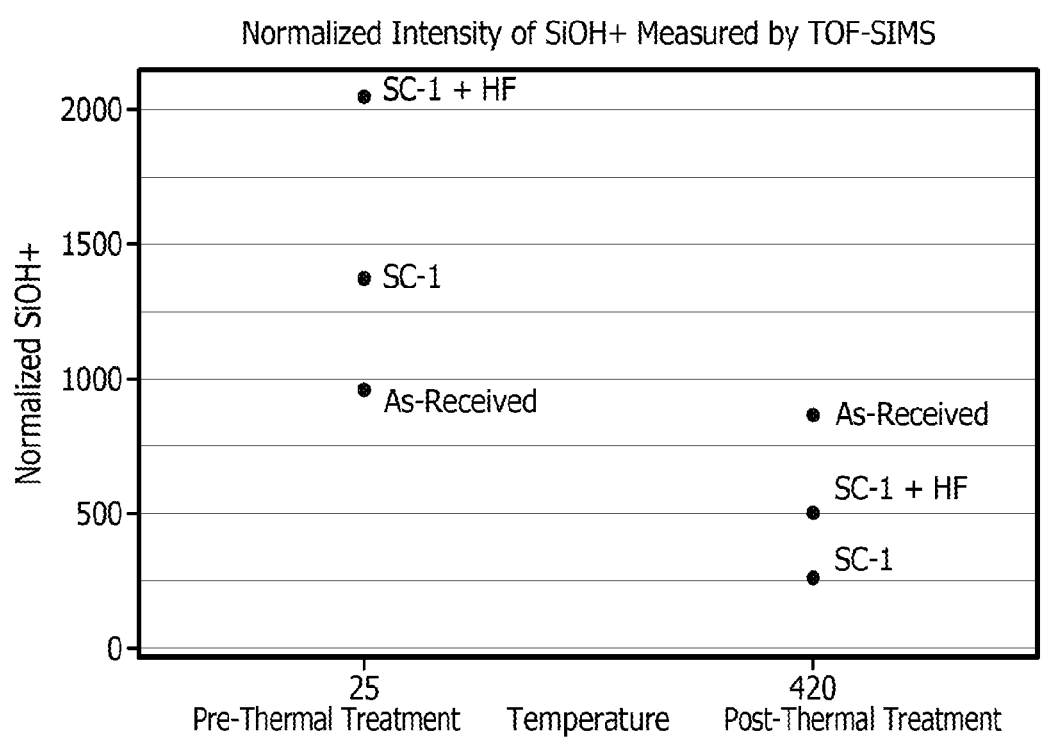
FIG. 5 is a graph illustrating the normalized intensity of SiOH measured by TOF-SIMS for a substrate surface pre- and post-thermal exposure.

Referring now to FIG. 5, the three types of samples described previously were each processed through the thermal treatment in a manner identical to that described above for the SC-1 cleaned sample. Each of these types of samples were characterized using TOF-SIMS and AFM in the pre-thermal treatment and post-thermal treatment states, as well as by goniometer measurements (water contact angle measurements). The TOF-SIMS data for these samples is shown in FIG. 5. The TOF-SIMS measurements show the normalized SiOH+ ion intensities (at mass 45 amu) observed for each of the samples in the pre-thermal treatment and post-thermal treatment states. The following key observations are deduced from this data set:

1. The as-received sample (which did not have its surface hydroxyl concentration increased beyond its normal state) shows a very small change in surface hydroxyl concentration after the thermal treatment step. There was no major reduction in surface hydroxyl concentration for this sample post thermal treatment;

2. Both the SC-1 and the SC-1+HF samples have increased surface hydroxyl concentrations relative to the as-received sample that did not receive a step to increase its surface hydroxyl concentration (as 'expected'); and 3. Both the SC-1 and the SC-1+HF samples show dramatic decreases in surface hydroxyl concentrations post thermal treatment, to concentrations well below those measured for the as-received sample post thermal treatment. This important distinction highlights the importance of the overall process flow to obtain the desired low surface hydroxyl concentration of the present invention. Without first increasing the surface hydroxyl concentration prior to thermal treatment, no dramatic reduction in the surface hydroxyl concentration is realized through the thermal treatment. This means that most silicon oxide surfaces that are encountered in the industry will not exhibit the behavior desired in the present invention, even if they are heated using the thermal treatment profile disclosed herein.

Example 5: Thermal Treatment (Reduction of $SiO_2$ Surface Hydroxyl Concentration in a Controlled Fashion with Minimal Impact on the Hydride Surface Termination of the Si(100) Surfaces)

The Si(100) and $SiO_2$ substrates with the desired chemical surface terminations prepared by Examples 1 and 2 are next loaded into the reactor system where they are subjected to several pump-purge cycles to remove atmospheric and phy-sisorbed contaminants. The first cycle involves pumping the samples to a pressure of between 5 and 10 mTorr above base pressure, followed by a reduced pressure $N_2$ purge (10-20 sccm of ultra-high purity $N_2$) at a pressure of 2-4 Torr for 3 minutes, followed by a pumping step to a pressure of between 1 and 3 mTorr above base pressure, followed by a reduced pressure $N_2$ purge (10-20 sccm of ultra-high purity $N_2$) at a pressure of 2-4 Torr for 3 minutes, followed by a final pump down step to base pressure. For this experiment, a heated load lock was not available so cycle purging was performed in the reactor tube itself.

The samples were then processed using the thermal treatment to reduce the hydroxyl surface concentration on the $SiO_2$ surfaces while having minimal impact on the Si(100) hydride surfaces. The thermal treatment profile is shown in FIG. 7, wherein the x-axis is time in minutes and the y-axis is temperature in ° C.

Figure 7:
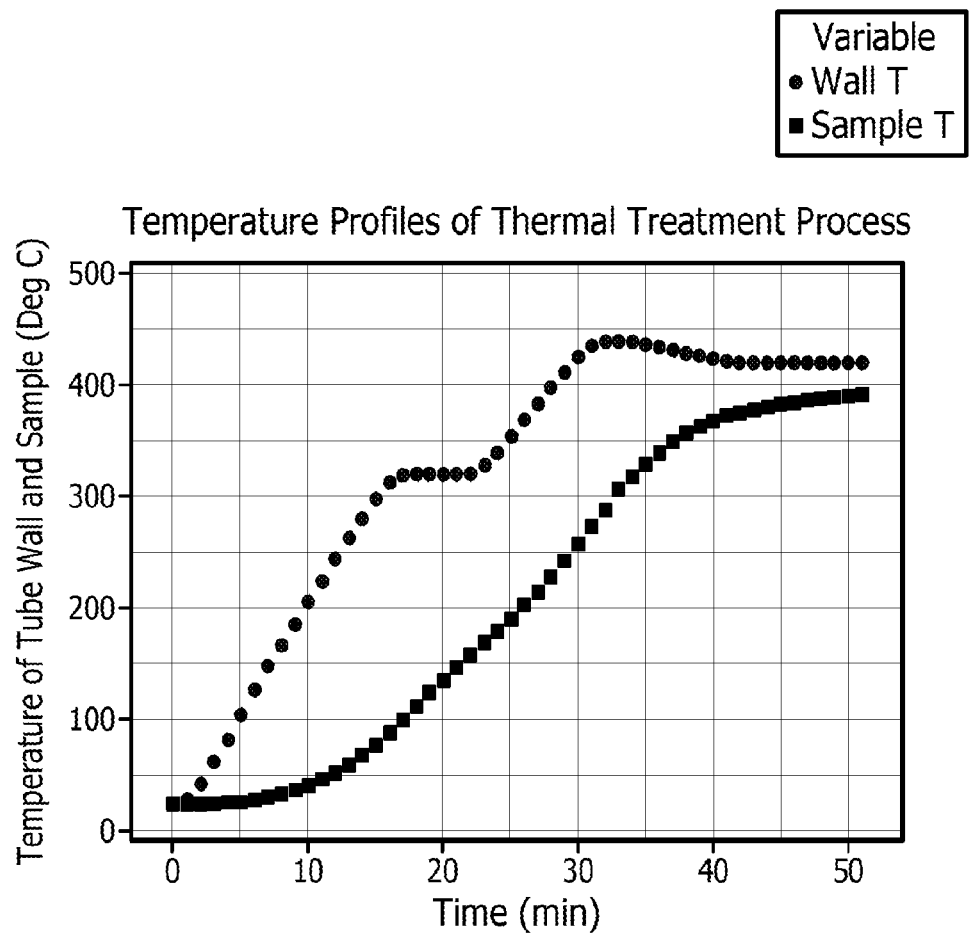
FIG. 7 is a graph illustrating the temperature profile verus time for a thermal treatment step according to an embodiment of the present invention.

The temperatures shown in FIG. 7 are for two independent thermocouples (one embedded within the furnace itself and in contact with the reactor tube and one that closely approximates the actual sample temperature). This is the actual profile used to reduce the hydroxyl concentration on the $SiO_2$ surfaces through the reaction:

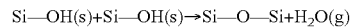

Figure 8:
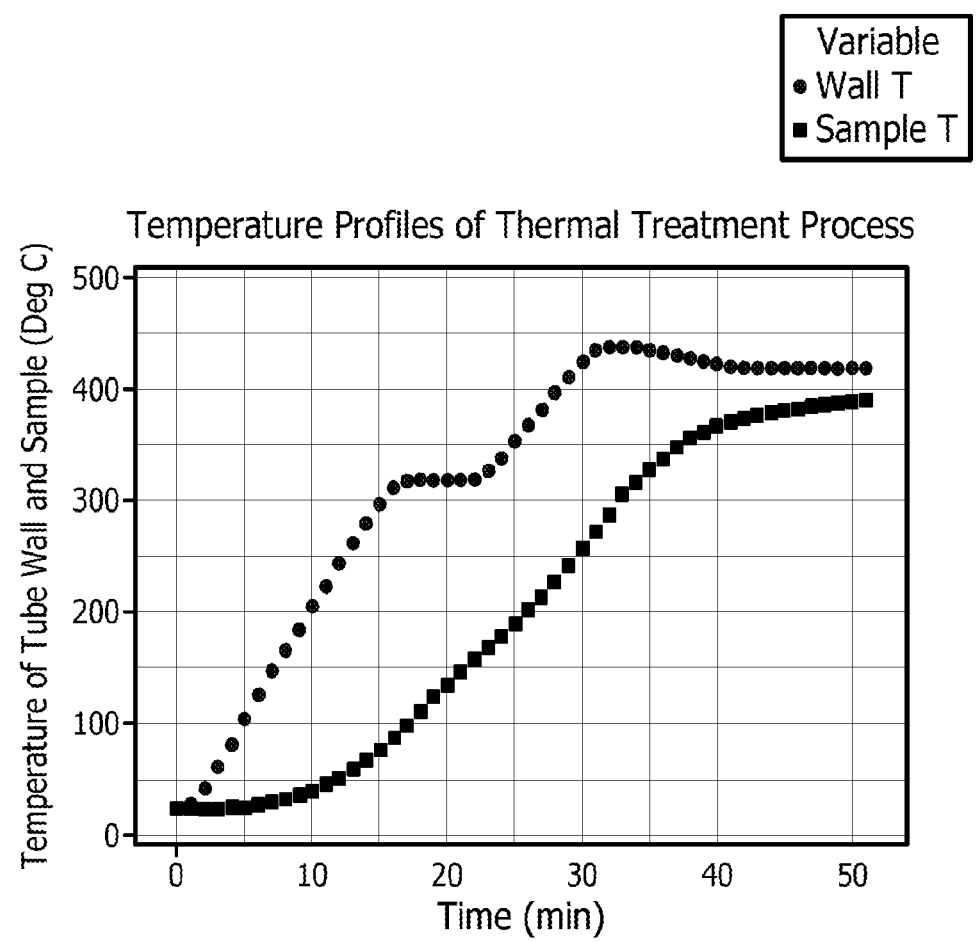
FIG. 8 is a graph illustrating the temperature profile verus time for a thermal treatment step according to an embodiment of the present invention as well as the corresponding QMS spectra showing loss of $H_2O$ signal.
Figure 8:
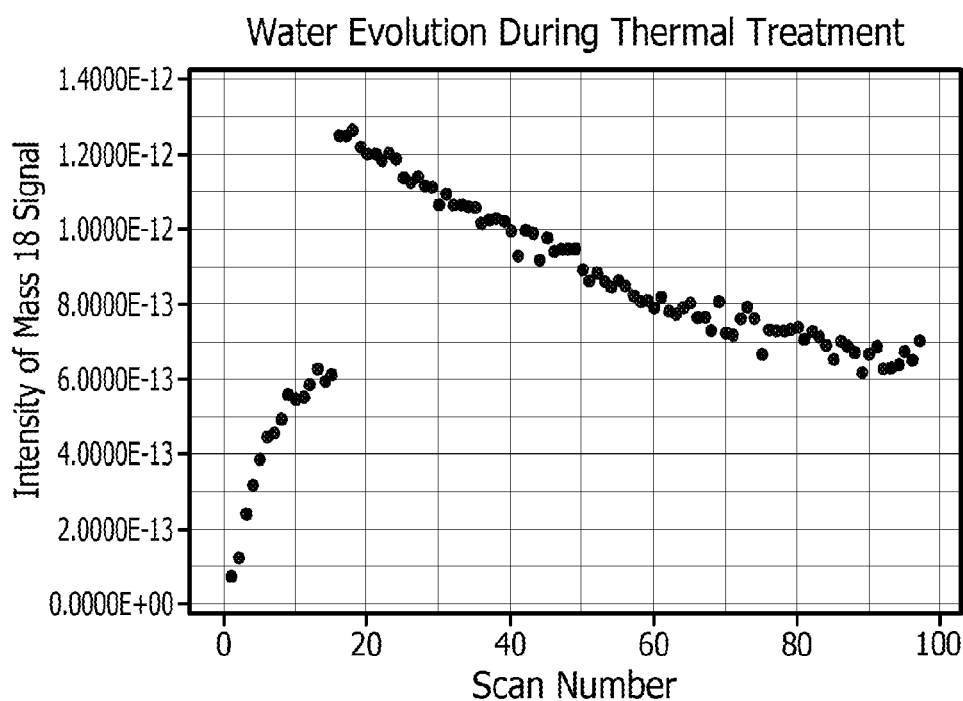

FIG. 8 shows the data collected using the in-situ mass spectrometer overlaid with the thermal treatment temperature profile and clearly shows the evolution of water from the samples. The thermal treatment may be performed over a range of conditions, but at present it has been demonstrated for reduced pressure operation under a flow of ultra-high purity $N_2$ with a pressure of about 2.5 Torr at a flow rate of about 20 sccm $N_2$.

Goniometer measurements of $SiO_2$ samples post SC-1 clean, post HF-etch and post thermal treatment provide the following water contact angle measurements:
$SiO_2$: 29.1° (for reference: $SiO_2$+SC-1+thermal treatment=30.5°)
Si(100): 56.3 (showing oxidation upon air exposure; for reference Si(100)+no thermal treatment dry run sample: 57.9; Si(100) samples stored in air: show continual oxidation after exposure and storage in air; eventually reach steady state near ~41.9° which is very close to the value accepted by those skilled in the art for silicon dioxide).

Figure 9:
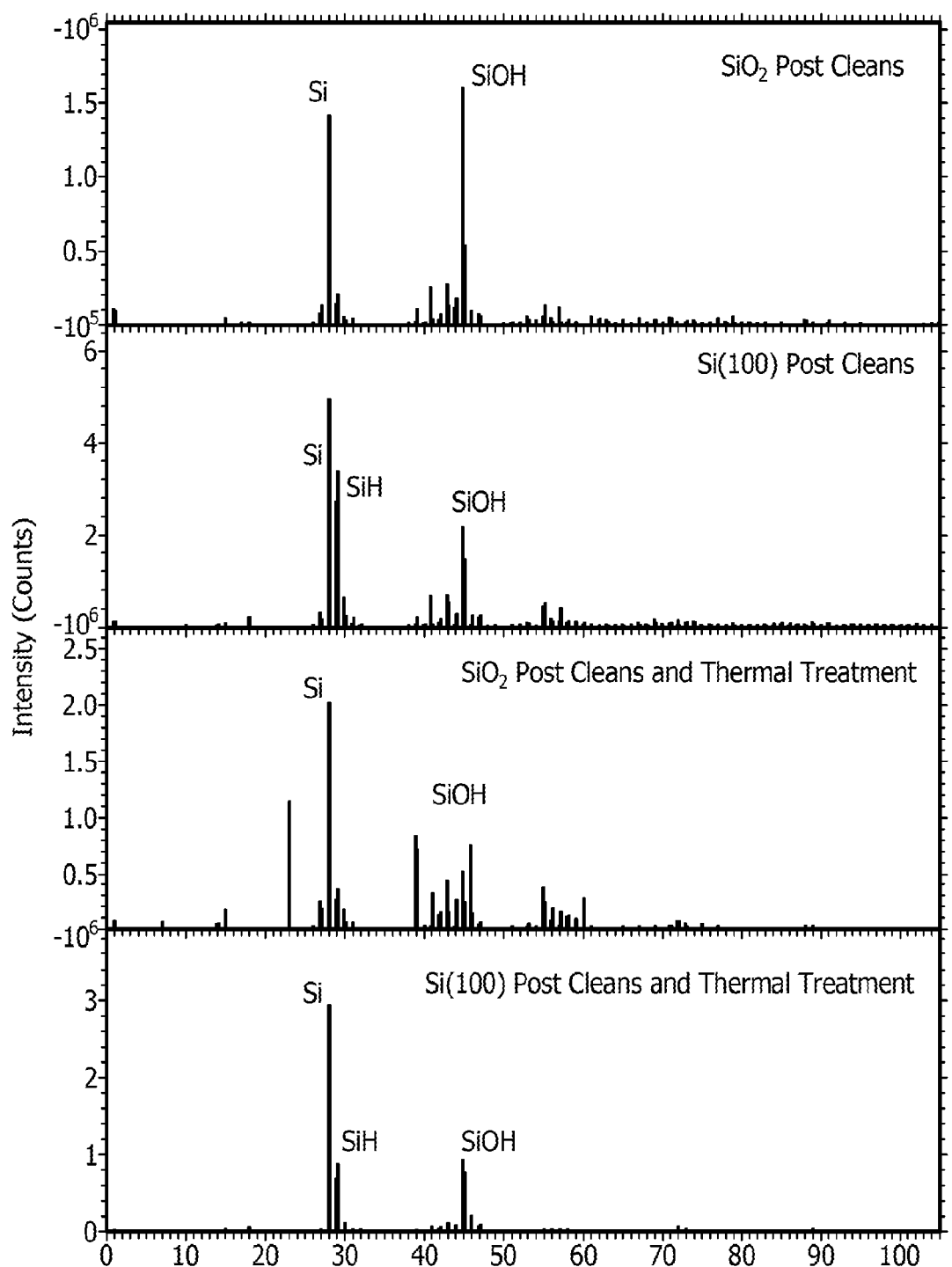
FIG. 9 is a series of TOF-SIMS spectra of a substrate surface after a wet chemical exposure step and after thermal treatment according to an embodiment of the present invention.

The state of the Si(100) and $SiO_2$ surfaces in the post-clean/post thermal treatment states has also been characterized through TOF-SIMS measurements. These measurements allow semi-quantitative characterization of the surface concentrations of hydroxyl, hydride and other species present on the substrates. Representative TOF-SIMS spectra for the Si(100) and $SiO_2$ surfaces post SC-1 clean and HF-etch are shown in FIG. 9. It is noted that here again oxidation peaks are present in the Si(100) spectra as a result of air exposure due to equipment/experimental limitations.

Example 6: Thermal Treatment as-Received 1,000 Å $SiO_2$/Si(100)

Several 1.5"×1.5" coupons of a 1,000 Å thermal $SiO_2$/Si(100) ("1,000 Å $SiO_2$") were cleaved from a 4" wafer, blown off with a stream of high purity nitrogen to remove particles and then loaded into the tube of a tube furnace reactor system under a flow of 250 sccm ultra-high purity $N_2$ gas at room temperature. The tube was then sealed and slowly evacuated to a pressure of 10 mTorr. A flow of 20 sccm $N_2$ was then introduced into the reactor tube and a reduced pressure $N_2$ purge was conducted for 2 minutes (at a pressure of 2.3 Torr). The flow of $N_2$ was then stopped and the tube was evacuated to a pressure of ≤5 mTorr. The previously described cycle purging steps were repeated until the base pressure of the system was achieved.

After base pressure was achieved, a flow of 20 sccm of ultra-high purity $N_2$ was introduced into the reactor system and a reduced pressure $N_2$ purge (at 2.3 Torr) was conducted for 1 hour to reduce the background moisture concentration in the system prior to initiating the thermal treatment. As known to those skilled in the art, use of a load lock system will enable greatly reduced cycle times while still providing the required system purity for the processes described herein to be operative.

Figure 10:
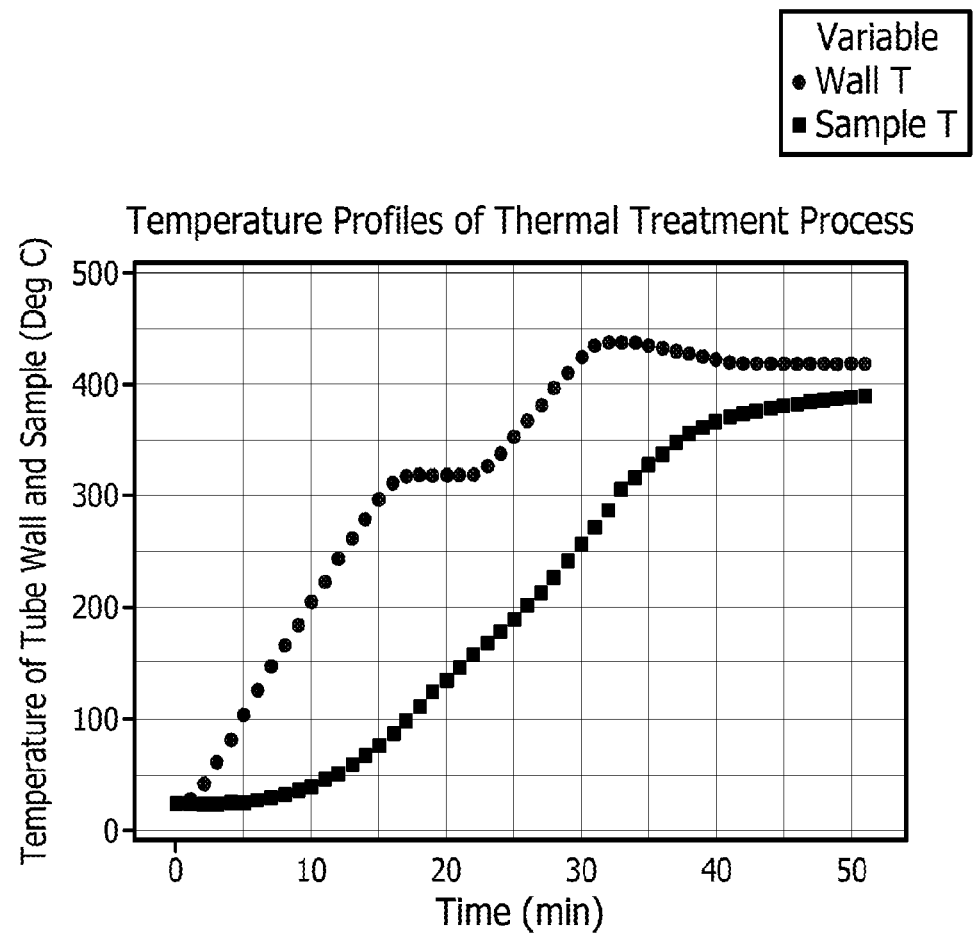
FIG. 10 is a graph illustrating the temperature profile verus time for a thermal treatment step according to an embodiment of the present invention.

The thermal treatment was then performed under a reduced pressure purge of ultra-high purity $N_2$ gas (at 2.3 Torr) using the pre-programmed heating process recipe stored on the temperature controller for the furnace. The heat traces of two independent thermocouples (one representing the external tube temperature—'wall' and one representing the sample temperature) are shown in FIG. 10 as a function of time.

After the thermal treatment process was completed, the 'as-received' 1,000 Å $SiO_2$ samples were cooled to room temperature under a flow of 20 sccm ultra-high purity $N_2$ (at a pressure of 2.3 Torr). The samples were then unloaded under a flow of 500 sccm $N_2$, quickly enclosed in a container and then stored under $N_2$ for shipment to the vendor for analytical characterization of their properties.

The 'as-received' 1,000 Å $SiO_2$ samples were characterized using water contact angle measurements, Atomic Force Microscopy (AFM) and Time-of-Flight Secondary Ion Mass Spectrometry (TOF-SIMS). For comparison, 'as-received' 1,000 Å $SiO_2$ samples that did not receive the thermal treatment processing were also characterized in a similar fashion. The results of these analyses are presented in the table below.

| Contact Angle Measurements and Surface Roughness Measurements | | | |
|---|---|---|---|
| Sample | Thermal Treatment | Water Contact Angle (Degrees) | Surface Roughness (nm) |
| As-Received 1,000 Å SiO2/Si(100) | No | 37.2 | 0.16 |
| As-Received 1,000 Å SiO2/Si(100) | Yes | 38.8 | 0.22 |

Figure 11:
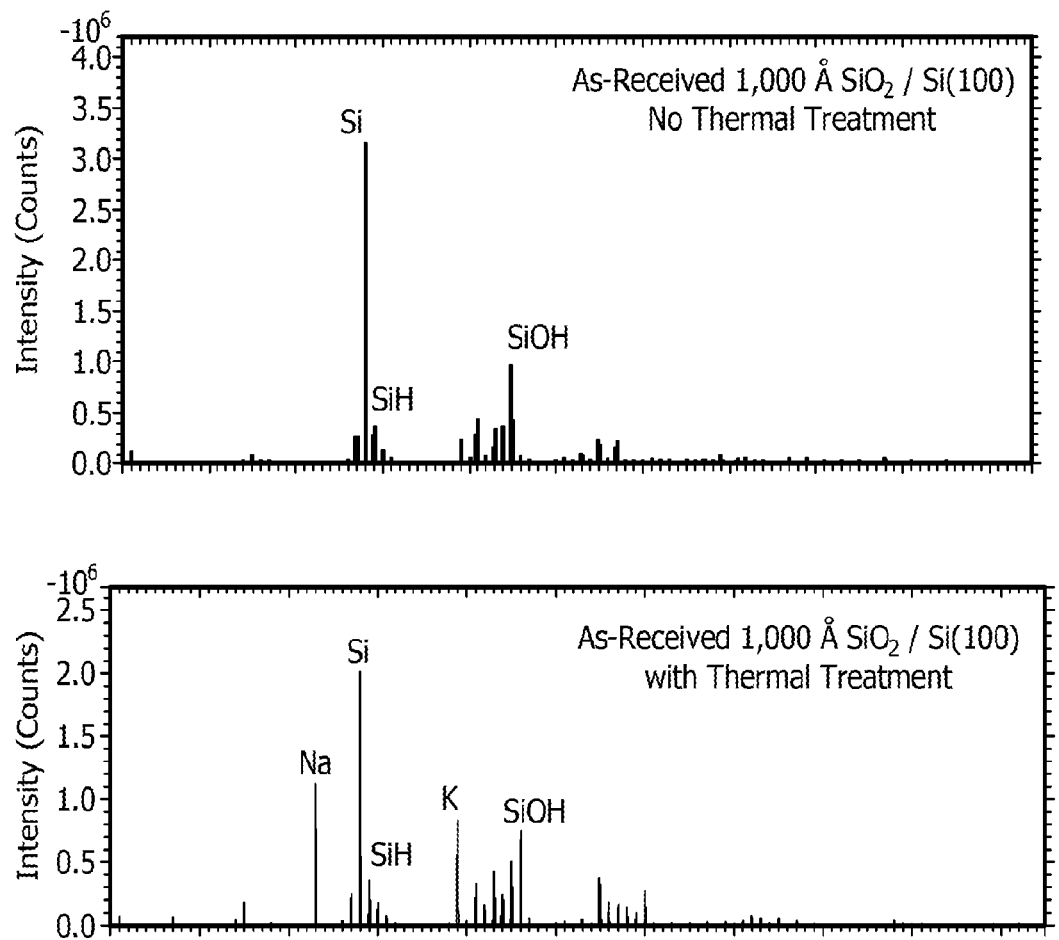
FIG. 11 is a series of TOF-SIMS spectra of a substrate surface as received and after a thermal treatment according to an embodiment of the present invention.

The TOF-SIMS Spectra of the 'as-received' 1,000 Å $SiO_2$/Si(100) samples, with and without thermal treatment for comparison, are depicted in FIG. 11. Referring to FIG. 11, some environmental contamination in the form of sodium (Na) and potassium (K) is also visible in the spectrum for the "as-received" 1,000 Å $SiO_2$/Si(100) post thermal treatment and is likely the result of sampling handling prior to TOF-SIMS measurements.

Comparison of the two TOF-SIMS spectra of FIG. 11 reveals that the surface hydroxyl concentrations are largely similar for the two samples. That is, the thermal treatment has not reduced the hydroxyl concentration of the "as-received" 1,000 Å $SiO_2$/Si(100) sample by a significant amount.

The quantified data for the normalized $SiOH^+$ positive ion, signal intensities (mass 45 amu) and $SiH^+$ positive ion, signal intensities (mass 29 amu) representative of the surface concentrations for the two samples is presented in the table below:

| Normalized $SiOH^+$ and $SiH^+$ intensities for "as-received" 1,000 Å $SiO_2$/Si(100) | | | |
|---|---|---|---|
| Sample | Thermal Treatment | Normalized $SiOH^+$ Ion Intensity | Normalized $SiH^+$ Ion Intensity |
| As-Received 1,000 Å SiO2/Si(100) | No | 959 | 129 |
| As-Received 1,000 Å SiO2/Si(100) | Yes | 864 | 181 |

Example 7: Thermal Treatment Example 2 (SC-1 Cleaned Silicon Dioxide Sample (1,000 Å Thermal $SiO_2$ on Si(100))

Several 1.5"×1.5" coupons of a 1,000 Å thermal $SiO_2$/Si (100) ("1,000 Å $SiO_2$") were cleaved from a 4" wafer, blown off with a stream of high purity nitrogen to remove particles and then loaded into a Teflon boat suitable for immersion in an SC-1 cleaning bath. The boat and samples were then immersed in an SC-1 cleaning solution (100 ml ultra-high purity $NH_4OH$ (28%-30%); 200 ml ultra-high purity $H_2O_2$ (28-30%); 1000 ml distilled, deionized $H_2O$) that was pre-heated to a temperature of 70+/−5° C. where they were cleaned for 10 minutes. The SC-1 cleaned, 1,000 Å $SiO_2$/Si(100) samples were then removed from the cleaning bath and rinsed of chemicals using three dump rinse cycles of distilled, deionized water. The samples were then dried thoroughly using a source of ultra-high purity $N_2$ gas that was filtered for particles.

Several of the SC-1 cleaned 1000 Å $SiO_2$ samples were then loaded into the tube of a tube furnace reactor system under a flow of 250 sccm ultra-high purity $N_2$ gas at room temperature. The tube was then sealed and slowly evacuated to a pressure of 50 mTorr. A flow of 20 sccm $N_2$ was then introduced into the reactor tube and a reduced pressure $N_2$ purge was conducted for 2 minutes (at a pressure of 2.3 Torr). The flow of $N_2$ was then stopped and the tube was evacuated to a pressure of ≤5 mTorr. The previously described cycle purging steps were repeated until the base pressure of the system was achieved.

After base pressure was achieved, a flow of 20 sccm of ultra-high purity $N_2$ was introduced into the reactor system and a reduced pressure $N_2$ purge (at 2.3 Torr) was conducted for 1 hour to reduce the background moisture concentration in the system prior to initiating the thermal treatment. As known to those skilled in the art, use of a load lock system will enable greatly reduced cycle times while still providing the required system purity for the processes described herein to be operative.

The thermal treatment was then performed under a reduced pressure purge of ultra-high purity $N_2$ gas (at 2.3 Torr) using the pre-programmed heating process recipe stored on the temperature controller for the furnace. The heat traces of two independent thermocouples (one representing the external tube temperature—'wall' and one representing the sample temperature) are shown in FIG. 12.

Figure 12:
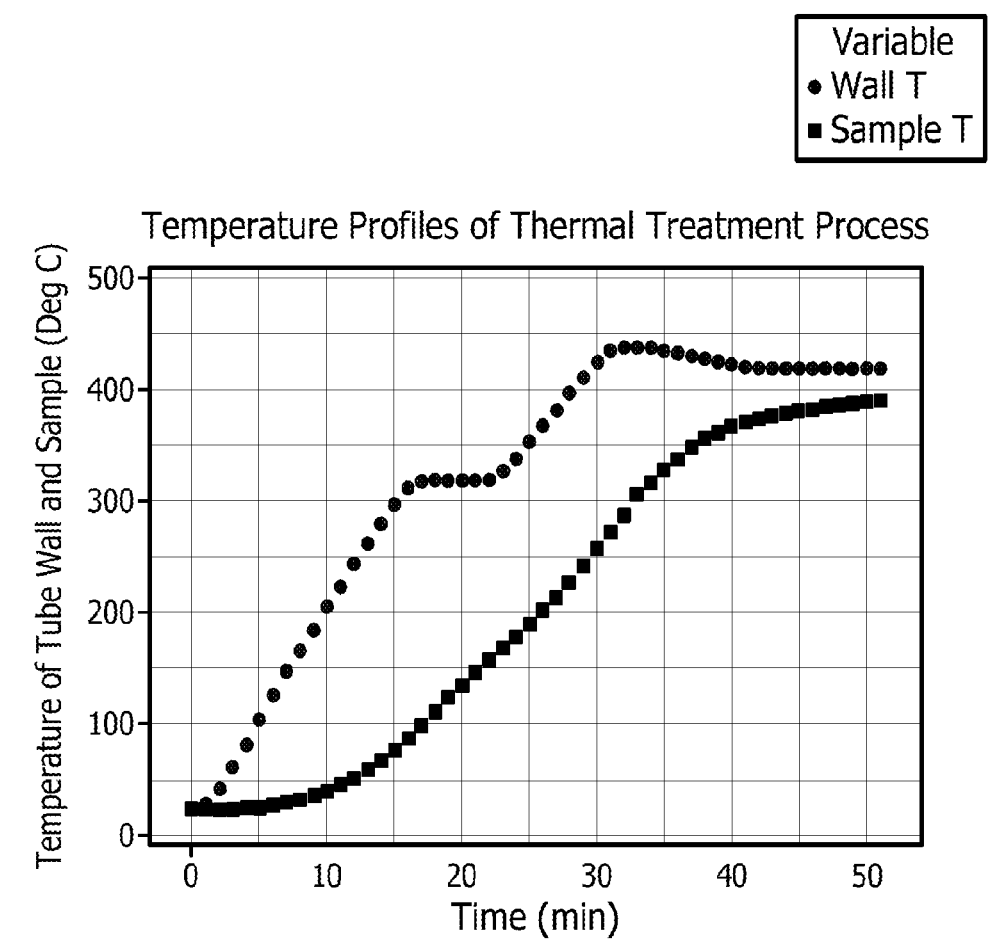
FIG. 12 is a graph illustrating the temperature profile verus time for a thermal treatment step according to an embodiment of the present invention as well as the corresponding QMS spectra showing loss of $H_2O$ signal.
Figure 12:
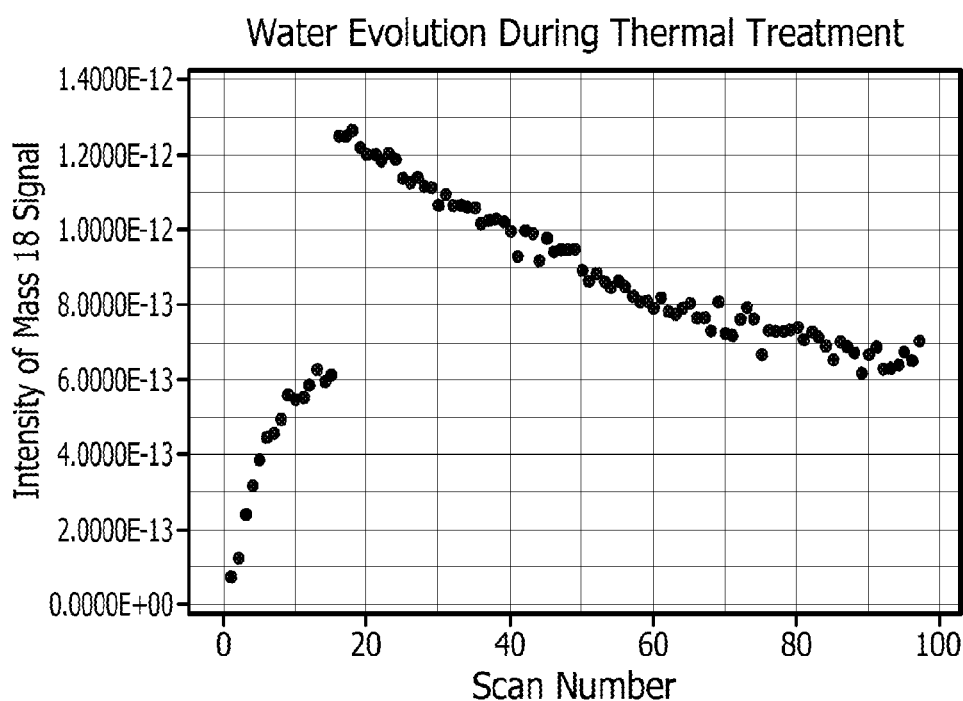

Overlaid in FIG. 12 is a trace of the moisture emission from the sample that occurs during the thermal treatment step (as measured by an in-situ quadrupole mass spectrometer (QMS)). This emission of moisture is consistent with the silanol condensation reaction described previously.

After the thermal treatment process was completed, the 'SC-1 cleaned' 1,000 Å $SiO_2$ samples were cooled to room temperature under a flow of 20 sccm ultra-high purity $N_2$ (at a pressure of 2.3 Torr). The samples were then unloaded under a flow of 500 sccm $N_2$, quickly enclosed in a container and then stored under $N_2$ for shipment to the vendor for analytical characterization of their properties.

The 'SC-1 cleaned' 1,000 Å $SiO_2$ samples were characterized using water contact angle measurements, Atomic Force Microscopy (AFM) and Time-of-Flight Secondary Ion Mass Spectrometry (TOF-SIMS). For comparison, 1,000 Å $SiO_2$ samples that did not receive the thermal treatment processing were also characterized in a similar fashion. The results of these analyses are presented in the table below.

| Contact Angle Measurements and Surface Roughness Measurements | | | |
|---|---|---|---|
| Sample | Thermal Treatment | Water contact Angle (Degrees) | Surface Roughness (nm) |
| SC-1 Cleaned 1,000 Å SiO2/Si(100) | No | 8 | 0.24 |
| SC-1 Cleaned 1,000 Å SiO2/Si(100) | Yes | 26.5 | 0.39 |

Figure 13:
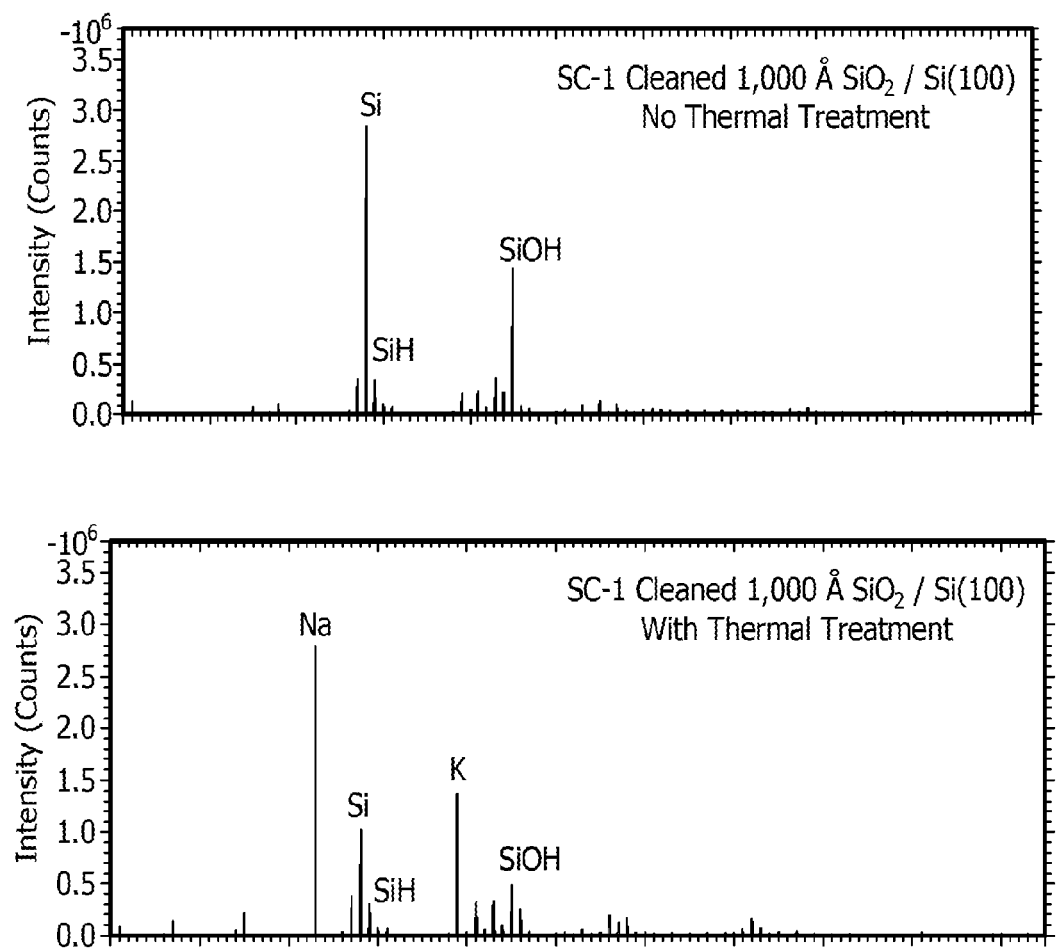
FIG. 13 is a series of TOF-SIMS spectra of a substrate surface after a wet chemical exposure step and after thermal treatment according to an embodiment of the present invention.

The TOF-SIMS Spectra of the 'SC-1 cleaned' 1,000 Å SiO$_2$ woo) samples, with and without thermal treatment for comparison, are presented in FIG. 13. It can be seen in FIG. 13 that some environmental contamination in the form of sodium (Na) and potassium (K) is present in the spectrum for the "SC-1 cleaned" 1,000 Å SiO$_2$/Si(100) post thermal treatment and is likely the result of sampling handling prior to TOF-SIMS measurements.

Comparison of the two TOF-SIMS spectra of FIG. 13 reveals that the surface hydroxyl concentrations are very different between the two samples. That is, the thermal treatment has greatly reduced the hydroxyl concentration of the "SC-1 cleaned" 1,000 Å SiO$_2$/Si(100) sample by a significant amount relative to the sample that was not processed with the thermal treatment.

The quantified data for the normalized SiOH and SiH surface concentrations for the two samples is presented in the table below:

| Normalized SiOH$^+$ and SiH$^+$ intensities for "SC-1 cleaned" 1,000 Å SiO$_2$/Si(100) | | | |
|---|---|---|---|
| Sample | Thermal Treatment | Normalized SiOH$^+$ Ion Intensity | Normalized SiH$^+$ Ion Intensity |
| SC-1 Cleaned 1,000 Å SiO2/Si(100) | No | 1373 | 159 |
| SC-1 Cleaned 1,000 Å SiO2/Si(100) | Yes | 258 | 71.6 |

Example 8: Thermal Treatment of ('SC-1 Cleaned, HF-Etched'), 1,000 Å Thermal SiO$_2$ on Si(100) Sample Several 1.5"×1.5" coupons of a 1,000 Å thermal SiO$_2$/Si(100) ["1,000 Å SiO$_2$") were cleaved from a 4" wafer, blown off with a stream of high purity nitrogen to remove particles and then loaded into a Teflon boat suitable for immersion in an SC-1 cleaning bath. The boat and samples were then immersed in an SC-1 cleaning solution (100 ml ultra-high purity NH$_4$OH (28%-30%); 200 ml ultra-high purity H$_2$O$_2$ (28-30%); 1000 ml distilled, deionized H$_2$O) that was pre-heated to a temperature of 70+/−5° C. where they were cleaned for 10 minutes. The SC-1 cleaned, 1,000 Å SiO$_2$/Si(100) samples were then removed from the cleaning bath and rinsed of chemicals using three dump rinse cycles of distilled, deionized water. The samples were then dried thoroughly using a source of ultra-high purity N$_2$ gas that was filtered for particles.

The dried SC-1 cleaned samples were then placed into a Teflon boat suitable for immersion in an HF-etch batch. The boat and samples were then immersed in an HF-etch bath (51 ml ultra-high purity HF (48-49%); 1000 ml distilled, deionized H$_2$O) that was at 21+/−2° C. where they were etched for 90 seconds. The 'SC-1 cleaned, HF-etched', 1,000 Å SiO$_2$/Si(100) samples were then removed from the HF solution and quickly immersed in distilled, de-ionized water and then dried thoroughly using a stream of ultra-high purity N$_2$ gas that was filtered for particles.

Several of the 'SC-1 cleaned, HF-etched', 1000 Å SiO$_2$ samples were then loaded into the tube of a tube furnace reactor system under a flow of 250 sccm ultra-high purity N$_2$ gas at room temperature with as minimum a delay as possible. The tube was then sealed and slowly evacuated to a pressure of 80 mTorr. A flow of 20 sccm N$_2$ was then introduced into the reactor tube and a reduced pressure N$_2$ purge was conducted for 2 minutes (at a pressure of 2.3 Torr). The flow of N$_2$ was then stopped and the tube was evacuated to a pressure of ≤5 mTorr. The previously described cycle purging steps were repeated until the base pressure of the system was achieved.

After base pressure was achieved, a flow of 20 sccm of ultra-high purity N$_2$ was introduced into the reactor system and a reduced pressure N$_2$ purge (at 2.3 Torr) was conducted for 1 hour to reduce the background moisture concentration in the system prior to initiating the thermal treatment. As known to those skilled in the art, use of a load lock system will enable greatly reduced cycle times while still providing the required system purity for the processes described herein to be operative.

Figure 14:
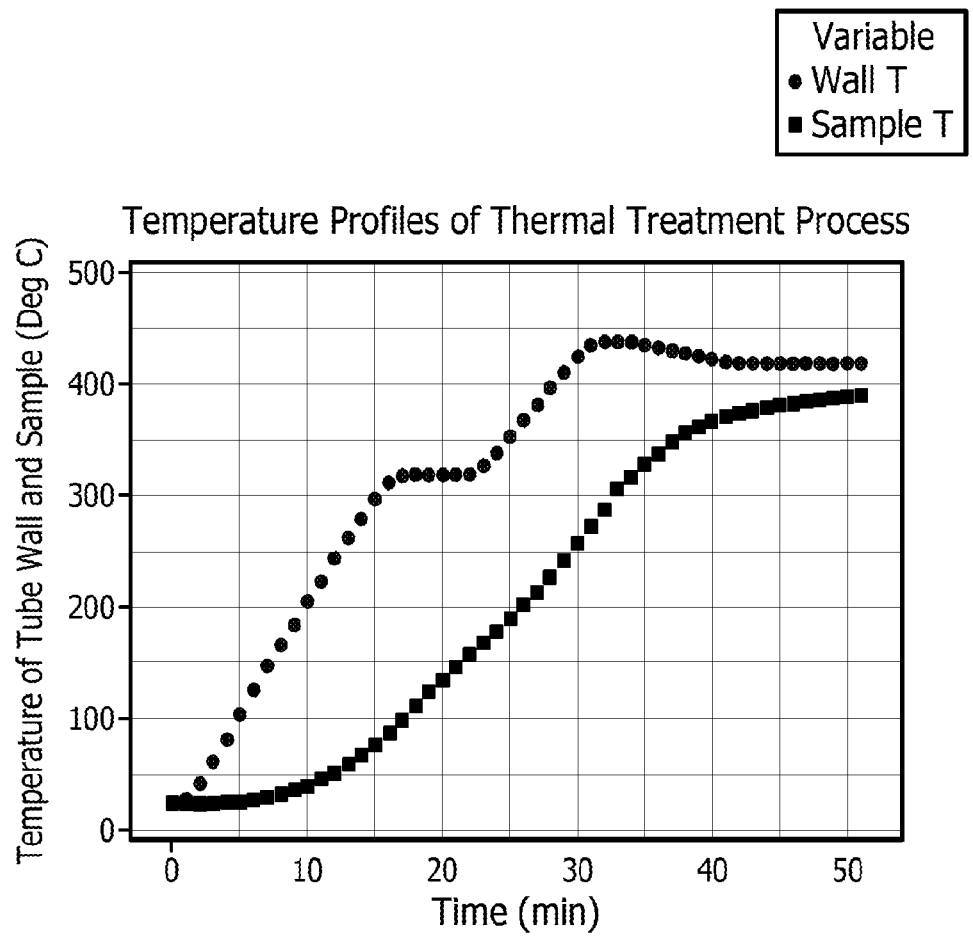
FIG. 14 is a graph illustrating the temperature profile verus time for a thermal treatment step according to an embodiment of the present invention.

The thermal treatment was then performed under a reduced pressure purge of ultra-high purity N$_2$ gas (at 2.3 Torr) using the pre-programmed heating process recipe stored on the temperature controller for the furnace. The heat traces of two independent thermocouples (one representing the external tube temperature—'wall' and one representing the sample temperature) are shown in FIG. 14.

After the thermal treatment process was completed, the 'SC-1 cleaned, HF-etched' 1,000 Å SiO$_2$ samples were cooled to room temperature under a flow of 20 sccm ultra-high purity N$_2$ (at a pressure of 2.3 Torr). The samples were then unloaded under a flow of 500 sccm N$_2$, quickly enclosed in a container and then stored under N$_2$ for shipment to the vendor for analytical characterization of their properties.

The 'SC-1 cleaned, HF-etched' 1,000 Å SiO$_2$ samples were characterized using water contact angle measurements, Atomic Force Microscopy (AFM) and Time-of-Flight Secondary Ion Mass Spectrometry (TOF-SIMS). For comparison, 'SC-1 cleaned, HF-etched' 1,000 Å SiO$_2$ samples that did not receive the thermal treatment processing were also characterized in a similar fashion. The results of these analyses are presented in the table below.

| Contact Angle Measurements and Surface Roughness Measurements | | | |
|---|---|---|---|
| Sample | Thermal Treatment | Water Contact Angle (Degrees) | Surface Roughness (nm) |
| SC-1 Cleaned, HF-etched 1,000 Å SiO2/Si(100) | No | 4.6 | 0.22 |
| SC-1 Cleaned, HF-etched 1,000 Å SiO2/Si(100) | Yes | 39.2 | 0.25 |

Figure 15:
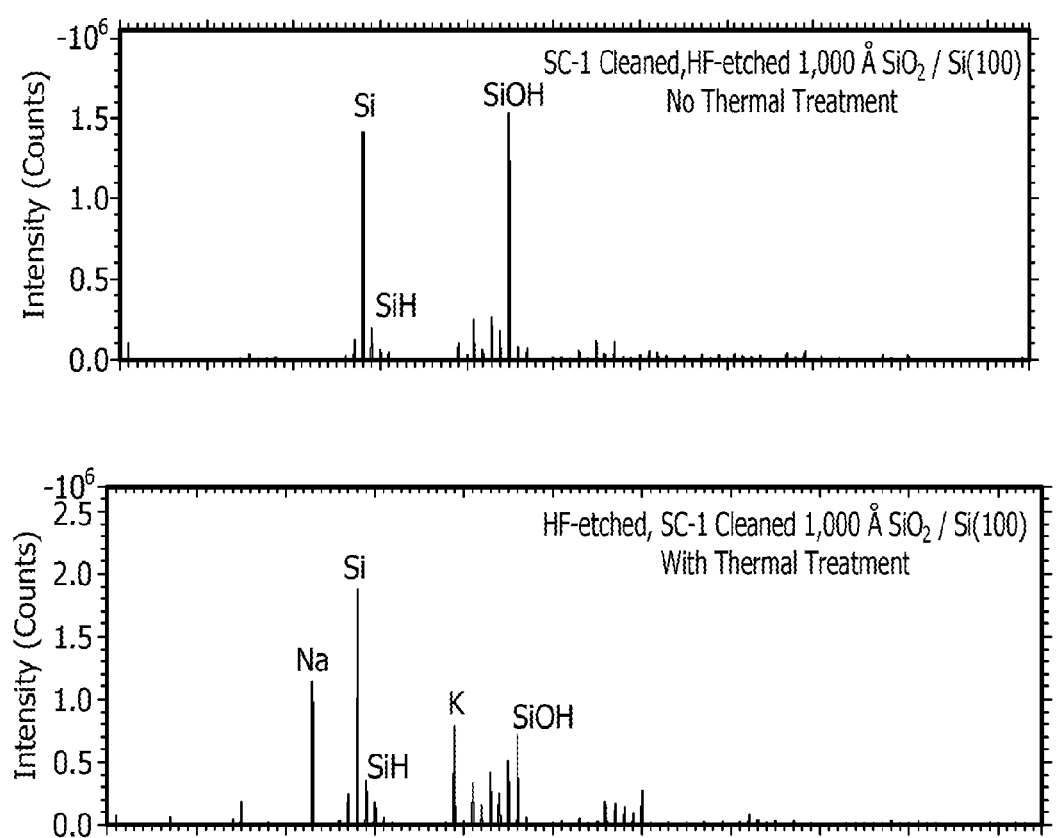
FIG. 15 is a series of TOF-SIMS spectra of a substrate surface after a wet chemical exposure step and after thermal treatment according to an embodiment of the present invention.

The TOF-SIMS Spectra of the 'SC-1 cleaned' 1,000 Å SiO$_2$/Si(100) samples, with and without thermal treatment for comparison, are shown in FIG. 15. Referring to FIG. 15, it can be seen that some environmental contamination in the form of sodium (Na) and potassium (K) is present in the spectrum for the "SC-1 cleaned, HF-etched" 1,000 Å SiO$_2$/Si(100) post thermal treatment and is likely the result of sampling handling prior to TOF-SIMS measurements.

Figure 16:
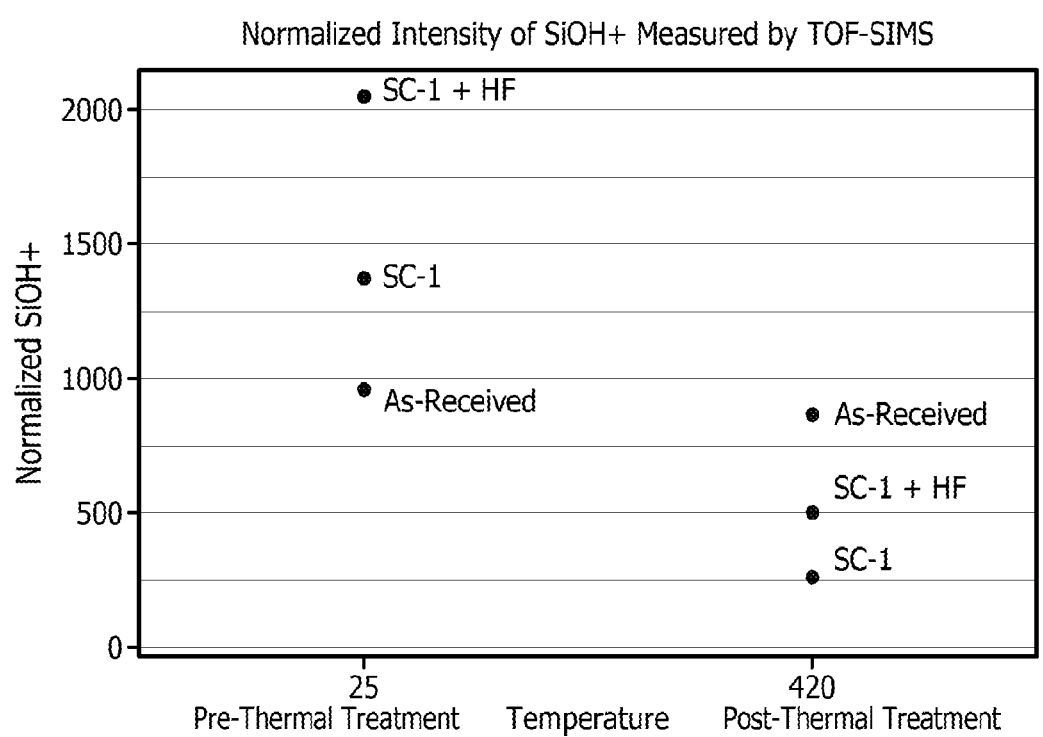
FIG. 16 is a graph illustrating the normalized intensity of SiOH measured by TOF-SIMS for a substrate surface pre- and post-thermal exposure.

Comparison of the two TOF-SIMS spectra reveals that the surface hydroxyl concentrations are very different between the two samples. That is, the thermal treatment has greatly reduced the hydroxyl concentration of the "SC-1 cleaned" 1,000 Å SiO$_2$/Si(100) sample by a significant amount relative to the sample that was not processed with the thermal treatment. The quantified data for the normalized SiOH and SiH surface concentrations for the two samples is presented in the table below and FIG. 16.

Normalized SiOH+ and SiH+ intensities for
"SC-1 cleaned" 1,000 Å SiO2/Si(100)

| Sample | Thermal Treatment | Normalized SiOH+ Ion Intensity | Normalized SiH+ Ion Intensity |
|---|---|---|---|
| SC-1 Cleaned, HF-etched 1,000 Å SiO2/Si(100) | No | 2043 | 76 |
| SC-1 Cleaned, HF-etched 1,000 Å SiO2/Si(100) | Yes | 501 | 154 |

The TOF-SIMS measurements show the normalized SiOH+ ion intensities observed for each of the samples described in Examples 6-8 in the pre-thermal treatment and post-thermal treatment states. The following key observations are deduced from this data set.

First, the as-received sample (which did not have its surface hydroxyl concentration increased beyond its normal state) shows a very small change in surface hydroxyl concentration after the thermal treatment step. There was no major reduction in surface hydroxyl concentration for this sample post thermal treatment Next, both the SC-1 and the SC-1+HF samples have increased surface hydroxyl concentrations relative to the as-received sample that did not receive a step to increase its surface hydroxyl concentration.

Finally, both the SC-1 cleaned and the SC-1 cleaned+HF-etched samples show dramatic decreases in surface hydroxyl concentrations post thermal treatment, to concentrations well below those measured for the as-received sample post thermal treatment.

Step 3: Exposing the Substrate, at a Temperature Equal to or Below the Heating Step, to a Silicon-Containing Compound Selected from the Group Consisting of Formula I and Formula II Example 9: Selectively Form an Organosilane-Based Passivation Layer on the $SiO_2$ Surfaces Provided by the Above Steps, but not on the Si(100) Surfaces The surfaces provided by the above steps were then processed further to react the remaining hydroxyl groups on the $SiO_2$ surfaces with organosilane precursor molecules using vapor phase reactions, while avoiding reactions between the hydride groups on the Si(100) surface. The resulting $SiO_2$ surfaces are thus passivated as fully as possible by eliminating (to a very large degree) the hydroxyl groups that are available to serve as reactive nucleation sites during subsequent film deposition processes.

The specific molecules tested in these examples include:
$ISi(CH_3)_3$; $BrSi(CH_3)_3$; $ClSi(CH_3)_3$; $(CH_3)_2NSi(CH_3)_3$
$ClSi(CH_2CH_2CH_3)_3$
$[ClSi(CH_3)_2]_2(CH_2)_2$
$CH_3)_2NSi(CH_2CH_2CH_3)_3$
$[ClSi(CH_3)_2]_2(CH_2)_2$ and $(CH_3)_2NSi(CH_3)_3$ (used in combination)

There are many potential vapor phase processes that can be utilized to selectively form passivation layers using molecules of the type disclosed above. A few specific examples are provided in the following section.

Example A: Monopodal Precursor

A mixture of $SiO_2$ and Si(100) samples that have been processed as detailed above are disposed in the reactor system at the conclusion of thermal treatment under a flow of 20 sccm ultra-high purity $N_2$ at a pressure of 2.5 Torr and a temperature of 420° C. While maintaining a flow of ultra-high purity $N_2$ at reduced pressure, the samples are cooled to 270° C. and equilibrated at that temperature for 10 minutes. The $SiO_2$ samples are then selectively passivated by exposing them to the following reaction sequence:

(1) The $N_2$ flow to the system is stopped and the reactor tube and gas panel are evacuated until the system base pressure is achieved (2) The gas panel is isolated from the reactor system (static vacuum conditions) and the lines are charged with vapor phase $(CH_3)_2NSi(CH_3)_3$ to the compounds room temperature vapor pressure of ~72 Torr, while the tube containing the samples is still being pumped on.

(3) The tube is then isolated from the vacuum pump and the valve isolating the tube from the vapor phase $(CH_3)_2NSi(CH_3)_3$ is opened to introduce $(CH_3)_2NSi(CH_3)_3$ into the heated tube.

(4) The tube is charged with a working pressure of 20 Torr (comprised of $(CH_3)_2NSi(CH_3)_3$) at which time the valve to the bubbler containing the liquid $(CH_3)_2NSi(CH_3)_3$ and the valve isolating the gas panel from the tube are both closed.

(5) The chemical charge of $(CH_3)_2NSi(CH_3)_3$ in the heated tube is reacted with the $SiO_2$ substrate surfaces for a period of twenty minutes. During this time, the $(CH_3)_2NSi(CH_3)_3$ remaining in the gas panel is removed in preparation for the next chemical dose.

(6) After the reaction has been allowed for 20 minutes, a flow of 20 sccm ultra-high purity $N_2$ is initiated in the gas panel and then directed to the reactor system wherein the pressure is increased to 200 Torr prior to opening the isolation valve and evacuating the chemical/ultra-high purity $N_2$ mixture from the tube under a continuing flow of $N_2$.

(7) The $N_2$ flow is maintained at a pressure of 2.5 Torr for 1 minute and then terminated. The tube and gas panel are then evacuated to base pressure (time to evacuate is strongly dependent upon the precursor being utilized, but typically 1-3 minutes is required).

(8) Steps (2)-(7) are then repeated two times to selectively form a trimethylsilyl surface passivation on the $SiO_2$ surfaces while not forming a passivation on the Si(100)-H surface (9) After the three chemical exposure cycles were completed, the tube and the gas panel were evacuated to base pressure prior to introducing a flow of ~20 sccm $N_2$ through the tube at a pressure of 2.5 Torr. This condition was maintained while the samples were cooled to room temperature.

After the samples have cooled to room temperature they are removed from the reactor system so that they can be characterized. Representative data from the experiment described in this Example is presented in FIG. 17, which is comprised of the following data sets:

(a) Control samples for each of the two experiments ('dry run' and 'live' run); as-received; post SC-1 clean; post SC-1 clean+HF-etch (b) 'Dry run' samples (processed through Steps I-III and then through the example outlined in steps (1)-(9), but with only $N_2$—no $(CH_3)_2NSi(CH_3)_3$ was introduced during the experiment): this defines the impact of all of the pre-treatment steps (Steps I-III) on the starting surfaces (I.e. the hydroxyl surface terminations on the $SiO_2$ surface and the hydride surface termination on the Si(100) surface)

'Live run' samples (processed through the above steps and then run through the example outlined in steps (1)-(9) of Example A.

Figure 17:
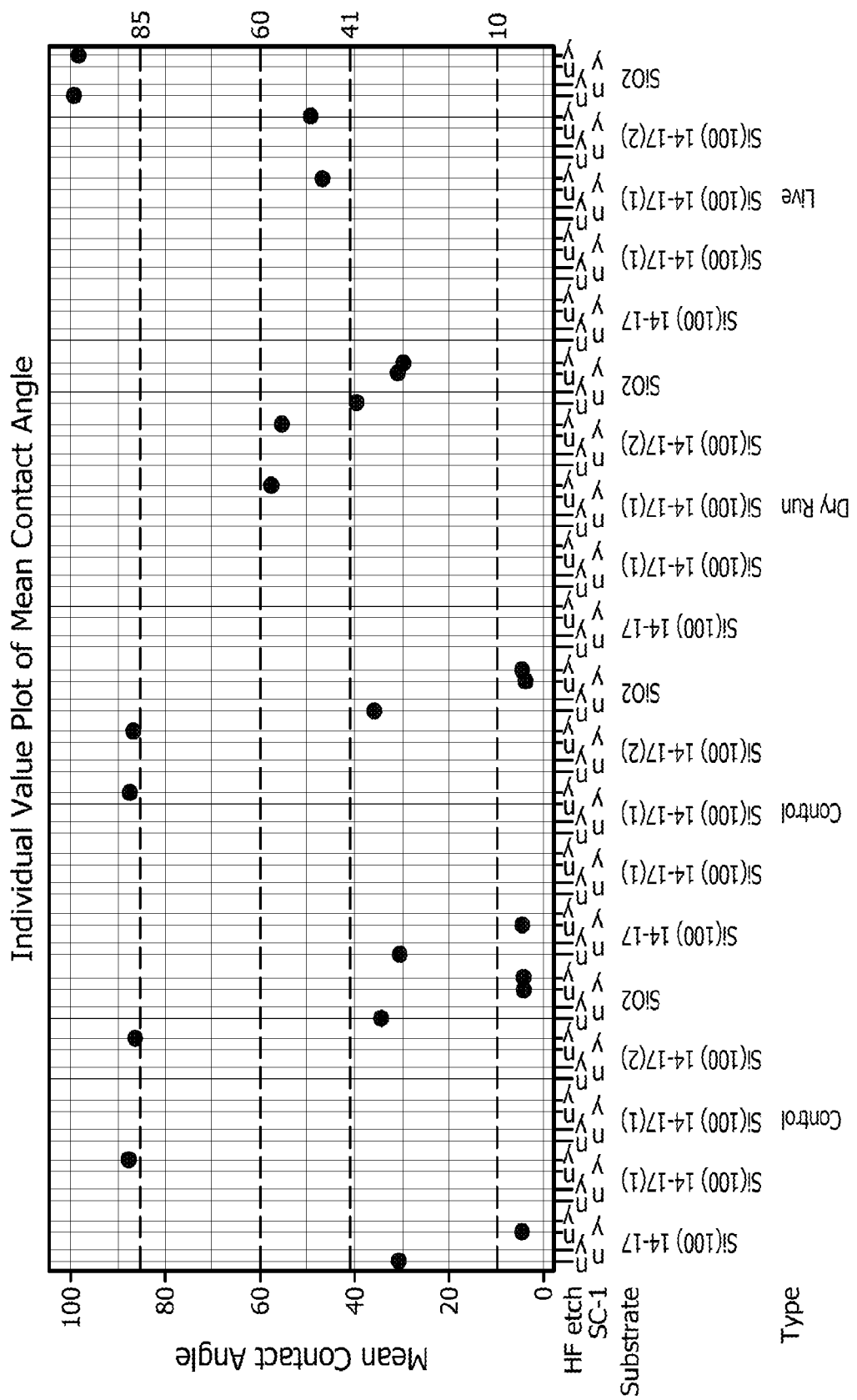
FIG. 17 is a graph plotting the mean contact angles of various substrate surfaces after cleaning, thermal, and passivation steps in embodiments of the present invention.

Referring to FIG. 17, the measurements of the control samples from both experiments are very similar and reflect the high degree of repeatability of the cleaning processes that were developed. The most important data set is that of the live run samples. They exhibit properties that are very much in agreement with the conclusion that trimethylsilyl surface passivation has been selectively formed on the $SiO_2$ surfaces, but not on the Si(100) surfaces. Namely, the $SiO_2$ surfaces exhibit high water contact angles (approaching 100°) after processing, suggestive that the desired passivation layer has been formed on the $SiO_2$ surfaces, while the Si(100) surfaces exhibit significantly reduced water contact angles (suggestive that no passivation layer has been formed on the Si(100) surfaces).

The decrease in the Si(100) contact angle is related to the air oxidation of the Si(100) sample surfaces upon their removal from the reactor system. This has been proven by tracking the water contact angle of the Si(100) samples from both the dry and live runs as a function of time, as well as by generating data related to samples that were cleaned and etched but never put in the reactor system (i.e. allowed to stand in air post the HF-etch step). In all cases, the contact angle continues to decrease until it approaches ~41.9°, the value accepted by those skilled in the art for the water contact angle of silicon dioxide. Furthermore, Si(100) samples that do not receive an HF-etch exhibit water contact angles >96°, very similar to the $SiO_2$ surfaces (as would be expected by one skilled in the art since they will be hydroxylated $SiO_2$ surfaces in the absence of the HF-etch step). This behavior is consistent with the lack of formation of any trimethylsilyl surface passivation on the Si(100) surfaces.

Example B: Bipodal Precursor

Figure 18:
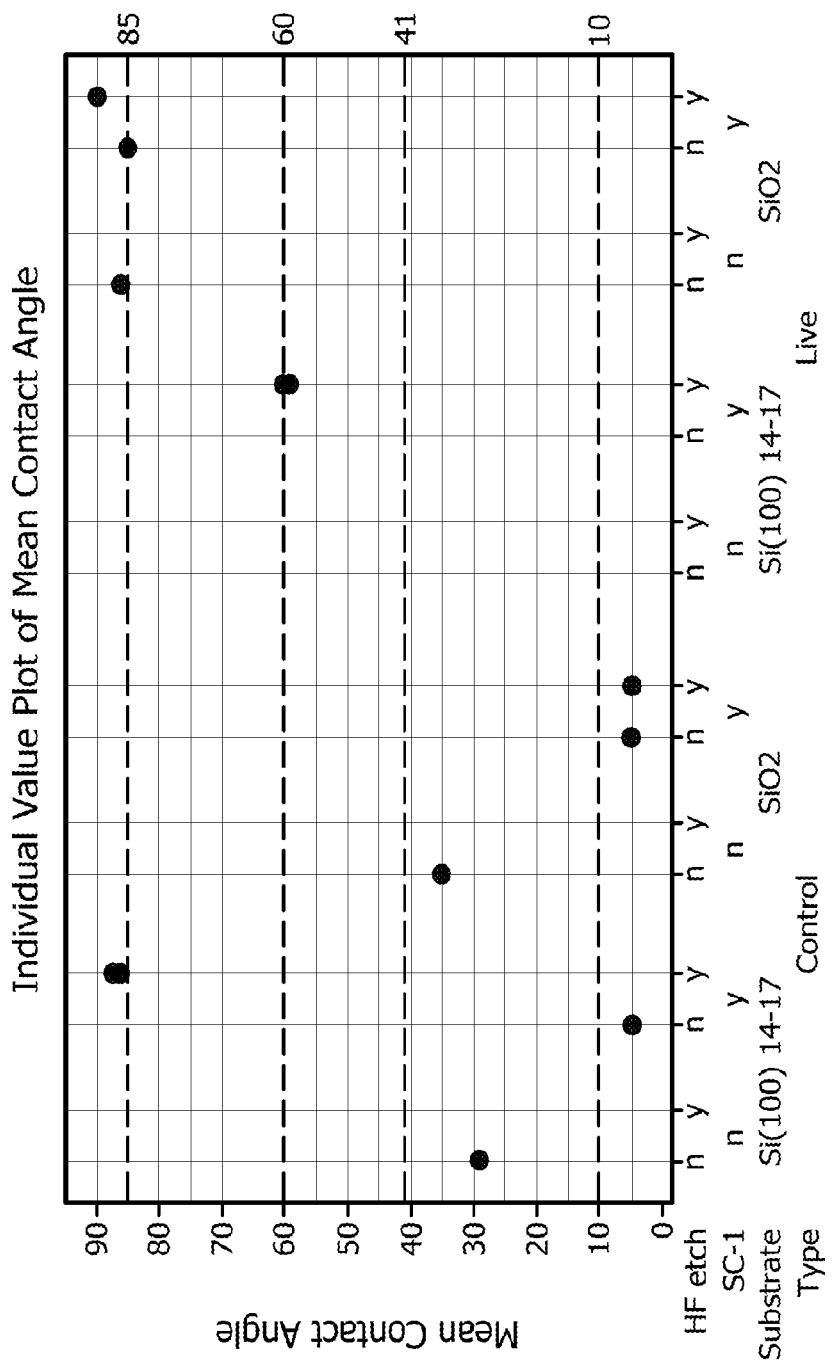
FIG. 18 is a graph plotting the mean contact angles of various substrate surfaces after cleaning, thermal, and passivation steps in embodiments of the present invention.

A mixture of $SiO_2$ and Si(100) samples that have been processed through the steps detailed above are disposed in the reactor system at the conclusion of the thermal treatment step under a flow of 20 sccm ultra-high purity $N_2$ at a pressure of 2.5 Torr and a temperature of 420° C. While maintaining a flow of ultra-high purity $N_2$ at reduced pressure, the samples are cooled to 405° C. and equilibrated at that temperature for 10 minutes. The $SiO_2$ samples are then selectively passivated by exposing them to the following reaction sequence:

(1) The $N_2$ flow to the system is stopped and the reactor tube and gas panel are evacuated until the system base pressure is achieved
(2) The gas panel is isolated from the reactor system (static vacuum conditions) and the lines are charged with vapor phase $[ClSi(CH_3)_2]_2(CH_2)_2$ to the compounds room temperature vapor pressure of 0.4 Torr, while the tube containing the samples is still being pumped on.
(3) The tube is then isolated from the vacuum pump and the valve isolating the tube from the vapor phase $[ClSi(CH_3)_2]_2(CH_2)_2$ is opened to begin allowing [ClSi $(CH_3)_2]_2(CH_2)_2$ into the heated tube.
(4) The tube is charged with a working pressure of 0.200 to 0.245 Torr (comprised of $[ClSi(CH_3)_2]_2(CH_2)_2$) at which time the valve to the bubbler containing the liquid $[ClSi(CH_3)_2]_2(CH_2)_2$ and the valve isolating the gas panel from the tube are both closed.
(5) The chemical charge of $[ClSi(CH_3)_2]_2(CH_2)_2$ in the heated tube is reacted with the $SiO_2$ substrate surfaces for a period of twenty minutes. During this time, the $[ClSi(CH_3)_2]_2(CH_2)_2$ remaining in the gas panel is evacuated using the vacuum bypass manifold in preparation for the next chemical dose.
(6) After the reaction has been allowed for 10 minutes, a flow of 20 sccm ultra-high purity $N_2$ is initiated in the gas panel and then directed to the reactor system wherein the pressure is increased to 200 Torr prior to opening the isolation valve and evacuating the chemical/ultra-high purity $N_2$ mixture from the tube under a continuing flow of $N_2$.
(7) The $N_2$ flow is maintained at a pressure of 2.5 Torr for 1 minute and then terminated. The tube and gas panel are then evacuated to base pressure (time to evacuate is strongly dependent upon the precursor being utilized, but typically 1-3 minutes is required).
(8) Steps (2)-(7) are then repeated nine times to selectively form a bis-dimethylsilylethane surface passivation on the $SiO_2$ surfaces while not forming a passivation on the Si(100)-H surface.
(9) After the desired number of cycles have been completed, the tube and the gas panel are evacuated to base pressure, then a flow of ~20 sccm $N_2$ is directed through the gas panel to the tube at a pressure of 2.5 Torr and is maintained as the tube containing the samples is cooled to room temperature After the samples have cooled to room temperature they are removed from the reactor system so that they can be characterized. Representative data from the experiment just described is presented in FIG. 18. It is comprised of the following data sets:

(a) Control samples for each of the two experiments ('dry run' and 'live' run); as-received; post SC-1 clean; post SC-1 clean+HF-etch
(b) 'Live run' samples (processed through Steps I-III and then run through the example outlined in steps (1)-(9) of Example B The data presented for this example and shown in FIG. 18 is quite similar to that shared for Example 1 in that the measurements from the control samples are nearly identical to those shared for Example A, that the Si(100) Live Run samples exhibit nearly identical contact angles to those observed for the Si(100) samples in Example A (suggestive of air oxidation in this case, once again) and that there is a large and positive change in contact angle for the $SiO_2$ samples after exposure to the passivation precursor.

Example 10: Selective Formation of Trimethylsilyl Surface Passivation on 'SC-1 Cleaned, HF-etched', 1,000 Å $SiO_2$/Si(100) and Not on Si(100) Using $(CH_3)_2NSi(CH_3)_3$ (Dimethylaminotrimethylsilane) at 270° C. with Thermal Treatment Processing Several 1.5"×1.5" coupons of a 1,000 Å thermal $SiO_2$/Si (100) ["1,000 Å $SiO_2$"] and Si(100) were cleaved from 4" wafers, blown off with a stream of high purity nitrogen to remove particles and then loaded into a Teflon boat suitable for immersion in an SC-1 cleaning bath. The boat and samples were then immersed in an SC-1 cleaning solution (100 ml ultra-high purity $NH_4OH$ (28%-30%); 200 ml ultra-high purity $H_2O_2$ (28-30%); 1000 ml distilled, deionized $H_2O$) that was pre-heated to a temperature of 70+/−5° C. where they were cleaned for 10 minutes. The SC-1 cleaned, 1,000 Å $SiO_2$/(100) and Si(100) samples were then removed from the cleaning bath and rinsed of chemicals using three dump rinse cycles of distilled, deionized water.

The samples were then dried thoroughly using a source of ultra-high purity $N_2$ gas that was filtered for particles.

The dried SC-1 cleaned samples were then placed into a Teflon boat suitable for immersion in an HF-etch batch. The boat and samples were then immersed in an HF-etch bath (51 ml ultra-high purity HF (48-49%); 1000 ml distilled, deionized $H_2O$) that was at 21+/−2° C. where they were etched for 90 seconds. The 'SC-1 cleaned, HF-etched', 1,000 Å $SiO_2$/Si(100) and Si(100) samples were then removed from the HF solution and quickly immersed in distilled, de-ionized water and then dried thoroughly using a source of ultra-high purity $N_2$ gas that was filtered for particles.

Several of the 'SC-1 cleaned, HF-etched', 1000 Å $SiO_2$ and Si(100) samples were then loaded into the tube of a tube furnace reactor system under a flow of 250 sccm ultra-high purity $N_2$ gas at room temperature with as minimum a delay as possible. The tube was then sealed and slowly evacuated to a pressure of 80 mTorr. A flow of 20 sccm $N_2$ was then introduced into the reactor tube and a reduced pressure $N_2$ purge was conducted for 2 minutes (at a pressure of 2.3 Torr). The flow of $N_2$ was then stopped and the tube was evacuated to a pressure of ≤5 mTorr. The previously described cycle purging steps were repeated until the base pressure of the system was achieved.

After base pressure was achieved, a flow of 20 sccm of ultra-high purity $N_2$ was introduced into the reactor system and a reduced pressure $N_2$ purge (at 2.3 Torr) was conducted for 1 hour to reduce the background moisture concentration in the system prior to initiating the thermal treatment. As known to those skilled in the art, use of a load lock system will enable greatly reduced cycle times while still providing the required system purity for the processes described herein to be operative.

Figure 19:
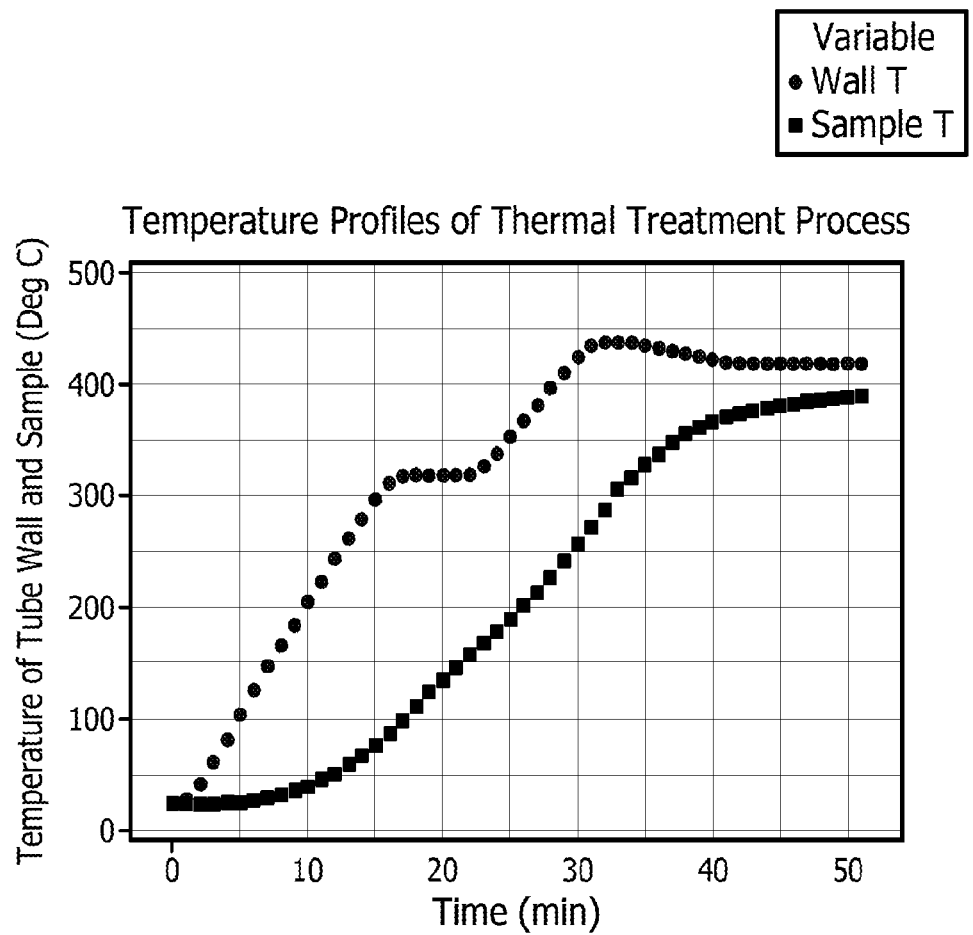
FIG. 19 is a graph illustrating the temperature profile verus time for a thermal treatment step according to an embodiment of the present invention.

The thermal treatment was then performed under a reduced pressure purge of ultra-high purity $N_2$ gas (at 2.3 Torr) using the pre-programmed heating process recipe stored on the temperature controller for the furnace. The heat traces of two independent thermocouples (one representing the external tube temperature—'wall' and one representing the sample temperature) are shown in FIG. 19.

After the thermal treatment was completed, a flow of 20 sccm ultra-high purity $N_2$ was maintained through the tube at a pressure of 2.5 Torr while the sample temperature was reduced to 270° C. The samples were equilibrated at 270° C. for 10 minutes, the $N_2$ flow was terminated and the tube was fully evacuated to a pressure of about 1 mTorr. The tube was then charged with a first chemical dose of dimethylaminotrimethylsilane [$(CH_3)_2NSi(CH_3)_3$] to a pressure of 19.9 Torr and then isolated at this pressure for 20 minutes. The first chemical dose was then removed from the chamber using a combination of reduced pressure $N_2$ purging and evacuation that encompassed first introducing a dynamic flow of 20 sccm $N_2$ at a pressure of 2.5 Torr for one minute, followed by evacuation of the tube to a pressure not greater than 10 mTorr for two minutes. The second chemical dose of $(CH_3)_2NSi(CH_3)_3$ was then introduced in a manner identical to the first dose except that the pressure of the second dose was 20.8 Torr. The second dose was then removed in the same manner as the first chemical dose prior to the introduction of the third chemical dose. The third chemical dose of $(CH_3)_2NSi(CH_3)_3$ was then introduced in a manner identical to the first and second doses except that the pressure of the third dose was 20.5 Torr. The third chemical dose was then removed in the same manner as the first and second chemical doses, completing the selective formation of the trimethylsilyl surface passivation on the 'SC-1 cleaned, HF-etched', 1,000 Å $SiO_2$ samples, but not on the Si(100) samples.

After the selective passivation formation was completed, the 'SC-1 cleaned, HF-etched' 1,000 Å $SiO_2$ and Si(100) samples were cooled to room temperature under a flow of 20 sccm ultra-high purity $N_2$ at a pressure of 2.3 Torr. The samples were then unloaded under a flow of 500 sccm $N_2$, quickly enclosed in a container and then stored under $N_2$ for shipment to the vendor for analytical characterization of their properties.

The 'SC-1 cleaned, HF-etched' 1,000 Å $SiO_2$ and Si(100) samples were characterized using water contact angle measurements, Atomic Force Microscopy (AFM) and Time-of-Flight Secondary Ion Mass Spectrometry (TOF-SIMS). For comparison, 'SC-1 cleaned, HF-etched' 1,000 Å $SiO_2$ samples that did not receive the thermal treatment processing were also characterized in a similar fashion. The results of these analyses are presented in the tables below:

Contact Angle Measurements and Surface Roughness Measurements

| Sample | Thermal Treatment | Water Contact Angle (Degrees) | Surface Roughness (nm) |
| --- | --- | --- | --- |
| SC-1 Cleaned, HF-etched 1,000 Å SiO2/Si(100) | Yes | 96.8 | 0.23 |
| SC-1 Cleaned, HF-etched Si(100) | Yes | 45.6 | 0.18 |

The samples were also analyzed by X-Ray Photoelectron Spectroscopy (XPS) and the results are presented in the table below:

| Sample | Carbon (atomic %) | Oxygen (atomic %) | Silicon (atomic %) | O/Si Ratio |
| --- | --- | --- | --- | --- |
| SC-1 Cleaned, HF-etched 1,000 Å SiO2/Si(100) | 3.7 | 65.2 | 30.8 | 2.11 |
| SC-1 Cleaned, HF-etched Si(100) | 7.7 | 25.2 | 66.7 | 0.38 |

Figure 20:
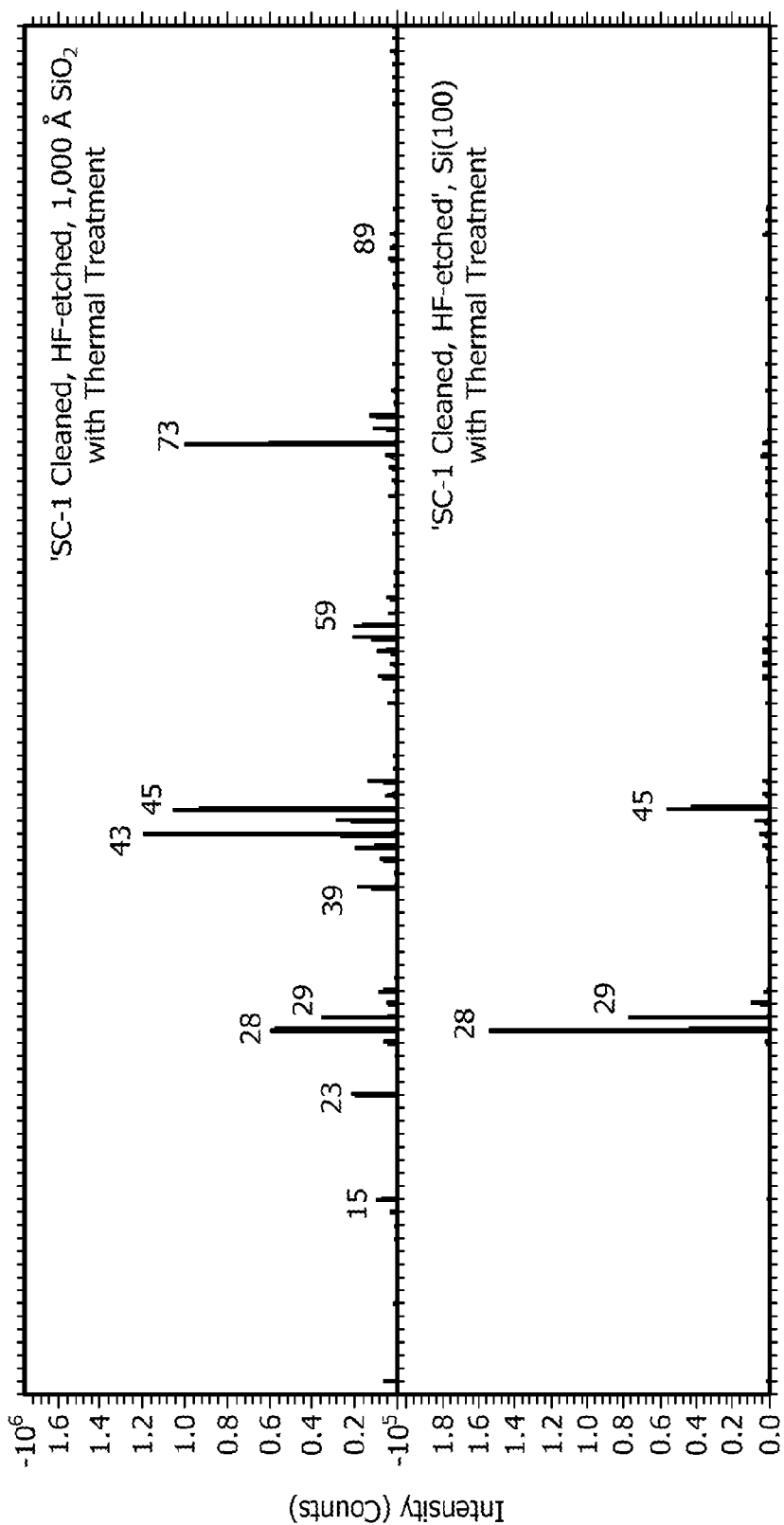
FIG. 20 is a series of TOF-SIMS spectra of a substrate surface after a wet chemical exposure step and after thermal treatment according to an embodiment of the present invention.

The TOF-SIMS spectra for the 'SC-1 cleaned, HF-etched' 1,000 Å $SiO_2$ and Si(100) samples are presented in FIG. 20. The lack of observation of the peaks associated with trimethylsilyl surface passivation in the Si(100) TOF-SIMS spectrum in FIG. 20 is evidence that the formation of the passivation layer was limited to the 'SC-1 cleaned, HF-etched' 1,000 Å $SiO_2$/Si(100) substrate. That is, the passivation was formed selectively on the desired surface and not on the Si(100) surface. This conclusion is also supported by the water contact angle measurements for the samples and the AFM surface roughness measurements for the samples.

Normalized Ion Intensities for positive ions with mass 45 amu, 29 amu, 43 amu, 59 amu and 73 amu for "SC-1 cleaned, HF-etched" 1,000 Å $SiO_2$/Si(100) and Si(100) are shown in the table below.

| Sample | Thermal Treatment | mass 45 amu | mass 29 amu | mass 43 amu | mass 59 amu | mass 73 amu |
| --- | --- | --- | --- | --- | --- | --- |
| SC-1 cleaned, HF-etched 1,000 Å SiO2/Si(100) | Yes | 477 | 466 | 1223 | 118 | 1187 |

| Sample | Thermal Treatment | mass 45 amu | mass 29 amu | mass 43 amu | mass 59 amu | mass 73 amu |
|---|---|---|---|---|---|---|
| SC-1 cleaned, HF-etched Si(100) | Yes | 1690 | 1213 | 99 | 5 | 10 |

The observation of trace signals for some of the ions associated with trimethylsilyl surface passivation on the Si(100) sample is consistent with the levels observed on the control samples (for which no dimethylaminotrimethylsilane was introduced into the reactor system) as can be observed in the table below.

| Sample | Thermal Treatment | mass 45 amu | mass 29 amu | mass 43 amu | mass 59 amu | mass 73 amu |
|---|---|---|---|---|---|---|
| SC-1 Cleaned, HF-etched 1,000 Å SiO2/Si(100) | Yes | 501 | 154 | 211 | 6.91 | 22.1 |
| SC-1 Cleaned, HF-etched Si(100) | Yes | 1327 | 1073 | 113 | 4.6 | 1.2 |

Example 11 (Comparative): Selective Formation of Trimethylsilyl Surface Passivation on 'SC-1 Cleaned, HF-Etched', 1,000 Å $SiO_2$/Si(100) and not on Si(100) Using $(CH_3)_2NSi(CH_3)_3$ (Dimethylaminotrimethylsilane) at 270° C. without Thermal Treatment Processing Several 1.5"×1.5" coupons of a 1,000 Å thermal $SiO_2$/Si (100) ["1,000 Å $SiO_2$"] and Si(100) were cleaved from 4" wafers, blown off with a stream of high purity nitrogen to remove particles and then loaded into a Teflon boat suitable for immersion in an SC-1 cleaning bath. The boat and samples were then immersed in an SC-1 cleaning solution (100 ml ultra-high purity $NH_4OH$ (28%-30%); 200 nil ultra-high purity $H_2O_2$ (28-30%); 1000 ml distilled, deionized $H_2O$) that was pre-heated to a temperature of 70+/−5° C. where they were cleaned for 10 minutes. The SC-1 cleaned, 1,000 Å $SiO_2$/(100) and Si(100) samples were then removed from the cleaning bath and rinsed of chemicals using three dump rinse cycles of distilled, deionized water. The samples were then dried thoroughly using a source of ultra-high purity $N_2$ gas that was filtered for particles.

The dried SC-1 cleaned samples were then placed into a Teflon boat suitable for immersion in an HF-etch batch. The boat and samples were then immersed in an HF-etch bath (51 ml ultra-high purity HF (48-49%); 1000 nil distilled, deionized $H_2O$) that was at 21+/−2° C. where they were etched for 90 seconds. The 'SC-1 cleaned, HF-etched', 1,000 Å $SiO_2$/Si(100) and Si(100) samples were then removed from the HF solution and quickly immersed in distilled, de-ionized water and then dried thoroughly using a source of ultra-high purity $N_2$ gas that was filtered for particles.

Several of the 'SC-1 cleaned, HF-etched', 1000 Å $SiO_2$ and Si(100) samples were then loaded into the tube of a tube furnace reactor system under a flow of 250 sccm ultra-high purity $N_2$ gas at room temperature with as minimum a delay as possible. The tube was then sealed and slowly evacuated to a pressure of 80 mTorr. A flow of 20 sccm $N_2$ was then introduced into the reactor tube and a reduced pressure $N_2$ purge was conducted for 2 minutes (at a pressure of 2.3 Torr). The flow of $N_2$ was then stopped and the tube was evacuated to a pressure of ≤5 mTorr. The previously described cycle purging steps were repeated until the base pressure of the system was achieved.

After base pressure was achieved, a flow of 20 sccm of ultra-high purity $N_2$ was introduced into the reactor system and a reduced pressure $N_2$ purge (at 2.3 Torr) was conducted for 1 hour to reduce the background moisture concentration in the system prior to initiating the thermal treatment. As known to those skilled in the art, use of a load lock system will enable greatly reduced cycle times while still providing the required system purity for the processes described herein to be operative.

The samples were equilibrated at 270° C. for 10 minutes, the $N_2$ flow was terminated and the tube was fully evacuated to a pressure of no more than 1 mTorr. The tube was then charged with a first chemical dose of dimethylaminotrimethylsilane [$(CH_3)_2NSi(CH_3)_3$] to a pressure of 20.8 Torr and then isolated at this pressure for 20 minutes. The first chemical dose was then removed from the chamber using a combination of reduced pressure $N_2$ purging and evacuation that encompassed first introducing a dynamic flow of 20 sccm $N_2$ at a pressure of 2.5 Torr for one minute, followed by evacuation of the tube to a pressure not greater than 10 mTorr for two minutes. The second chemical dose of $(CH_3)_2NSi(CH_3)_3$ was then introduced in a manner identical to the first dose except that the pressure of the second dose was 21.0 Torr. The second dose was then removed in the same manner as the first chemical dose prior to the introduction of the third chemical dose. The third chemical dose of $(CH_3)_2NSi(CH_3)_3$ was then introduced in a manner identical to the first and second doses except that the pressure of the third dose was 21.4 Torr. The third chemical dose was then removed in the same manner as the first and second chemical doses, completing the selective formation of the trimethylsilyl surface passivation on the 'SC-1 cleaned, HF-etched', 1,000 Å $SiO_2$ samples, but not on the Si(100) samples.

After the selective passivation formation was completed, the 'SC-1 cleaned, HF-etched' 1,000 Å $SiO_2$ and Si(100) samples were cooled to room temperature under a flow of 20 sccm ultra-high purity $N_2$ at a pressure of 2.3 Torr. The samples were then unloaded under a flow of 500 sccm $N_2$, quickly enclosed in a container and then stored under $N_2$ for shipment to the vendor for analytical characterization of their properties.

The 'SC-1 cleaned, HF-etched' 1,000 Å $SiO_2$ and Si(100) samples were characterized using water contact angle measurements, Atomic Force Microscopy (AFM) and Time-of-Flight Secondary Ion Mass Spectrometry (TOF-SIMS). For comparison, 'SC-1 cleaned, HF-etched' 1,000 Å $SiO_2$ samples that did not receive the thermal treatment processing were also characterized in a similar fashion. The results of these analyses are presented in the tables below:

Contact Angle Measurements and Surface Roughness Measurements

| Sample | Thermal Treatment | Water Contact Angle (Degrees) | Surface Roughness (nm) |
|---|---|---|---|
| SC-1 Cleaned, HF-etched 1,000 Å SiO2/Si(100) | No | 101 | 0.27 |
| SC-1 Cleaned, HF-etched Si(100) | No | 54 | 0.2 |

The samples were also analyzed by X-Ray Photoelectron Spectroscopy (XPS) and the results are presented in the table below.

| Sample | Carbon (atomic %) | Oxygen (atomic %) | Silicon (atomic %) | O/Si Ratio |
|---|---|---|---|---|
| SC-1 Cleaned, HF-etched 1,000 Å SiO2/Si(100) | 2.5 | 66.2 | 31.2 | 2.12 |
| SC-1 Cleaned, HF-etched Si(100) | 6 | 27.7 | 65.9 | 0.42 |

Figure 21:
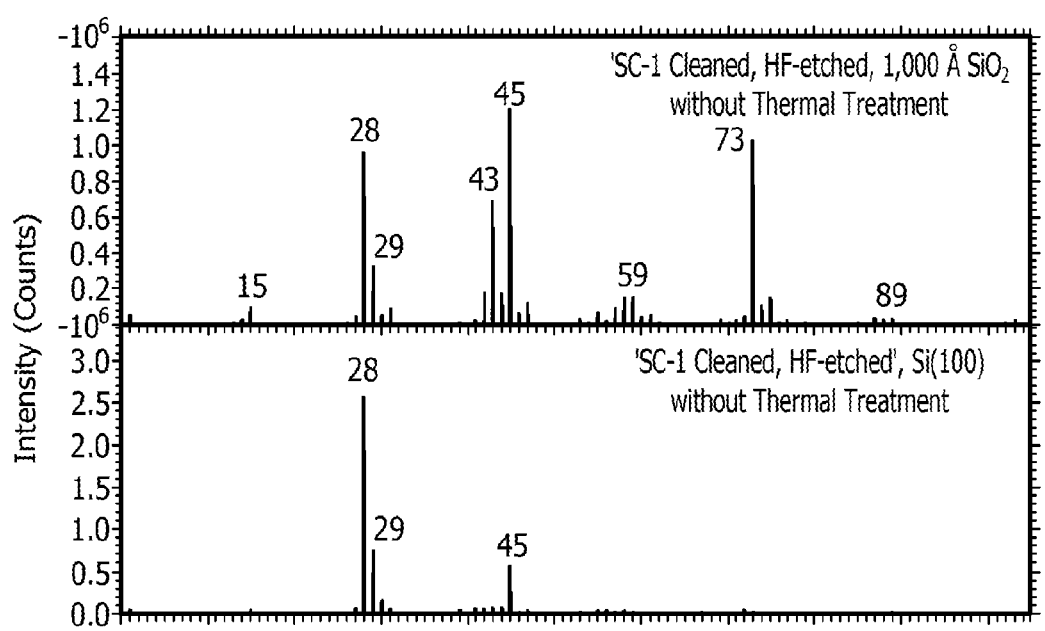
FIG. 21 is a series of TOF-SIMS spectra of a substrate surface after a wet chemical exposure steps (without thermal treatment) according to an embodiment of the present invention.

The TOF-SIMS spectra for the 'SC-1 cleaned, HF-etched' 1,000 Å $SiO_2$ and Si(100) samples are presented in FIG. 21. Referring to FIG. 21, the lack of observation of the peaks associated with trimethylsilyl surface passivation in the Si(100) TOF-SIMS spectrum is evidence that the formation of the passivation layer was limited to the 'SC-1 cleaned, HF-etched' 1,000 Å $SiO_2$/Si(100) substrate. That is, the passivation was formed selectively on the desired surface and not on the Si(100) surface. Comparison with the samples of example 1 reveals that the residual hydroxyl concentration on the surface of the sample that did not receive the thermal treatment is markedly higher than that of the sample that did receive the thermal treatment in accordance with the teachings of the present invention.

Normalized Ion Intensities for positive ions with mass 45 amu, 29 amu, 43 amu, 59 amu and 73 amu for "SC-1 cleaned, HF-etched" 1,000 Å $SiO_2$/Si(100) and Si(100) are "shown in the table below.

| Sample | Thermal Treatment | mass 45 amu | mass 29 amu | mass 43 amu | mass 59 amu | mass 73 amu |
|---|---|---|---|---|---|---|
| SC-1 Cleaned, HF-etched 1,000 Å SiO2/Si(100) | No | 672 | 493 | 1433 | 149 | 1477 |
| SC-1 Cleaned, HF-etched Si(100) | No | 863 | 1803 | 121 | 98 | 24.5 |

Example 12: Selective Formation of Bis-Dimethylsilylethane Surface Passivation on 'SC-1 Cleaned, HF-Etched', 1,000 Å $SiO_2$/Si(100) and not on Si(100) Using $[Cl(CH_3)_2Si]_2(CH_2)_2$ (1,2-bis-chlorodimethylsilylethane) at 370° C. with Thermal Treatment Processing Several 1.5"×1.5" coupons of a 1,000 Å thermal $SiO_2$/Si(100) ["1,000 Å $SiO_2$"] and Si(100) were cleaved from 4" wafers, blown off with a stream of high purity nitrogen to remove particles and then loaded into a Teflon boat suitable for immersion in an SC-1 cleaning bath. The boat and samples were then immersed in an SC-1 cleaning solution (100 ml ultra-high purity $NH_4OH$ (28%-30%); 200 ml ultra-high purity $H_2O_2$ (28-30%); 1000 ml distilled, deionized $H_2O$) that was pre-heated to a temperature of 70+/−5° C. where they were cleaned for 10 minutes. The SC-1 cleaned, 1,000 Å $SiO_2$/Si(100) and Si(100) samples were then removed from the cleaning bath and rinsed of chemicals using three dump rinse cycles of distilled, deionized water. The samples were then dried thoroughly using a source of ultra-high purity $N_2$ gas that was filtered for particles.

The dried SC-1 cleaned samples were then placed into a Teflon boat suitable for immersion in an HF-etch batch. The boat and samples were then immersed in an HF-etch bath (51 ml ultra-high purity HF (48-49%); 1000 ml distilled, deionized $H_2O$) that was at 21+/−2° C. where they were etched for 90 seconds. The 'SC-1 cleaned, HF-etched', 1,000 Å $SiO_2$/Si(100) and Si(100) samples were then removed from the HF solution and quickly immersed in distilled, de-ionized water and then dried thoroughly using a source of ultra-high purity $N_2$ gas that was filtered for particles.

Several of the 'SC-1 cleaned, HF-etched', 1000 Å $SiO_2$ and Si(100) samples were then loaded into the tube of a tube furnace reactor system under a flow of 250 sccm ultra-high purity $N_2$ gas at room temperature with as minimum a delay as possible. The tube was then sealed and slowly evacuated to a pressure of 80 mTorr. A flow of 20 sccm $N_2$ was then introduced into the reactor tube and a reduced pressure $N_2$ purge was conducted for 2 minutes (at a pressure of 2.3 Torr). The flow of $N_2$ was then stopped and the tube was evacuated to a pressure of ≤5 mTorr. The previously described cycle purging steps were repeated until the base pressure of the system was achieved.

After base pressure was achieved, a flow of 20 sccm of ultra-high purity $N_2$ was introduced into the reactor system and a reduced pressure $N_2$ purge (at 2.3 Torr) was conducted for 1 hour to reduce the background moisture concentration in the system prior to initiating the thermal treatment. As known to those skilled in the art, use of a load lock system will enable greatly reduced cycle times while still providing the required system purity for the processes described herein to be operative.

Figure 22:
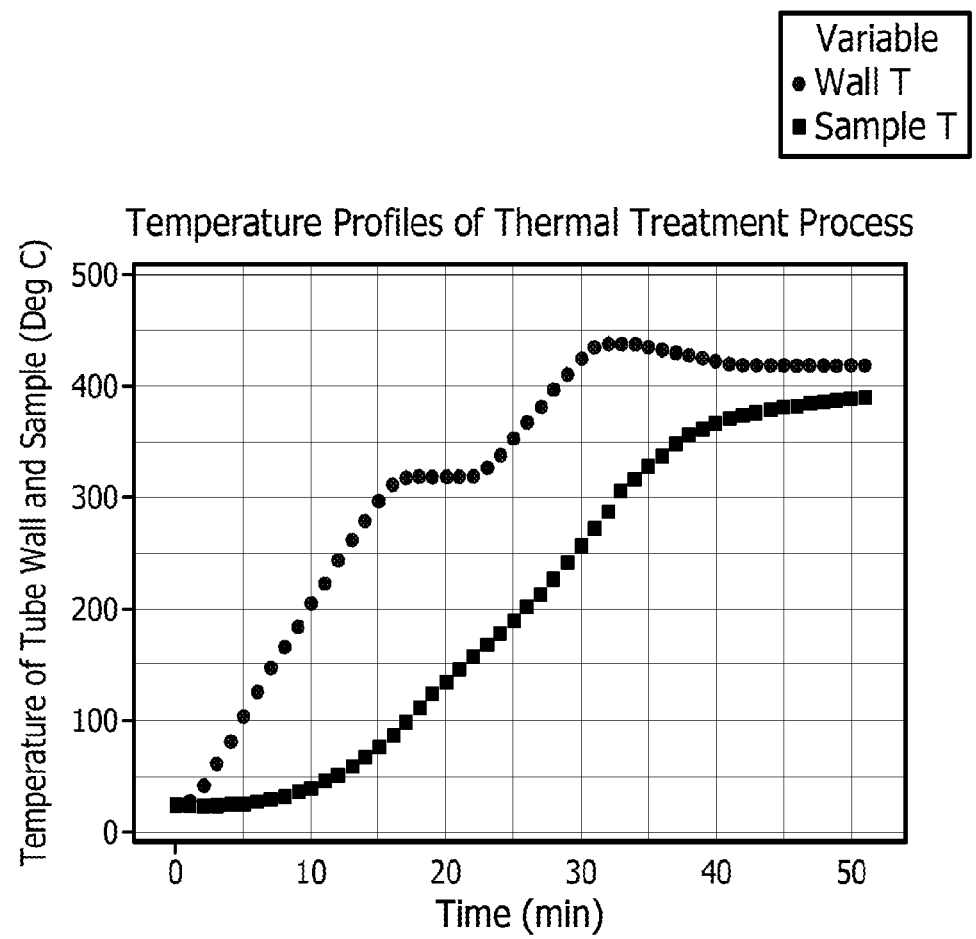
FIG. 22 is a graph illustrating the temperature profile verus time for a thermal treatment step according to an embodiment of the present invention.

The thermal treatment was then performed under a reduced pressure purge of ultra-high purity $N_2$ gas (at 2.3 Torr) using the pre-programmed heating process recipe stored on the temperature controller for the furnace. The heat traces of two independent thermocouples (one representing the external tube temperature—'wall' and one representing the sample temperature) are shown in FIG. 22.

After the thermal treatment was completed, a flow of 20 sccm ultra-high purity $N_2$ was maintained through the tube at a pressure of 2.5 Torr while the sample temperature was reduced to 370° C. The samples were equilibrated at 370° C. for 10 minutes, the $N_2$ flow was terminated and the tube was fully evacuated to a pressure of no more than 1 mTorr. The tube was then charged with a first chemical dose of 1,2-bis-chlorodimethylsilylethane $[(Cl(CH_3)_2Si]_2(CH_2)_2]$ to a pressure of 0.24 Torr and then isolated at this pressure for 10 minutes. The first chemical dose was then removed from the chamber using a combination of reduced pressure $N_2$ purging and evacuation that encompassed first introducing a dynamic flow of 20 sccm $N_2$ at a pressure of 2.5 Torr for one minute, followed by evacuation of the tube to a pressure not greater than 10 mTorr for two minutes. The second chemical dose of $(Cl(CH_3)_2Si]_2(CH_2)_2$ was then introduced in a manner identical to the first dose except that the pressure of the second dose was 0.25 Torr. The second dose was then removed in the same manner as the first chemical dose prior to the introduction of the third chemical dose. The third through twelfth chemical doses of $(Cl(CH_3)_2Si]_2(CH_2)_2$ were then introduced in a manner identical to the first and second doses except that the pressure of these doses varied slightly between 0.24 Torr and 0.26 Torr. The third through twelfth doses were then removed in the same manner as the first and second chemical doses, completing the selective formation of the bis-dimethylsilylethane surface passivation on the 'SC-1 cleaned, HF-etched', 1,000 Å $SiO_2$ samples, but not on the Si(100) samples.

After the selective passivation formation was completed, the 'SC-1 cleaned, HF-etched' 1,000 Å $SiO_2$ and Si(100) samples were cooled to room temperature under a flow of 20 sccm ultra-high purity $N_2$ at a pressure of 2.3 Torr. The samples were then unloaded under a flow of 500 sccm $N_2$, quickly enclosed in a container and then stored under $N_2$ for shipment to the vendor for analytical characterization of their properties.

The 'SC-1 cleaned, HF-etched' 1,000 Å $SiO_2$ and Si(100) samples were characterized using water contact angle measurements, Atomic Force Microscopy (AFM) and Time-of-Flight Secondary Ion Mass Spectrometry (TOF-SIMS). The results of these analyses are presented in the tables below:

Contact Angle Measurements and Surface Roughness Measurements

| Sample | Thermal Treatment | Water Contact Angle (Degrees) | Surface Roughness (nm) |
| --- | --- | --- | --- |
| SC-1 Cleaned, HF-etched 1,000 Å SiO2/Si(100) | Yes | 85.9 | 0.28 |
| SC-1 Cleaned, HF-etched Si(100) | Yes | 56.4 | 0.18 |

The samples were also analyzed by X-Ray Photoelectron Spectroscopy (XPS) and the results are presented in the table below:

| Sample | Carbon (atomic %) | Oxygen (atomic %) | Silicon (atomic %) | O/Si Ratio |
| --- | --- | --- | --- | --- |
| SC-1 Cleaned, HF-etched 1,000 Å SiO2/Si(100) | 2 | 66.3 | 31.7 | 2.09 |
| SC-1 Cleaned, HF-etched Si(100) | 5 | 28.6 | 65.7 | 0.44 |

Figure 23:
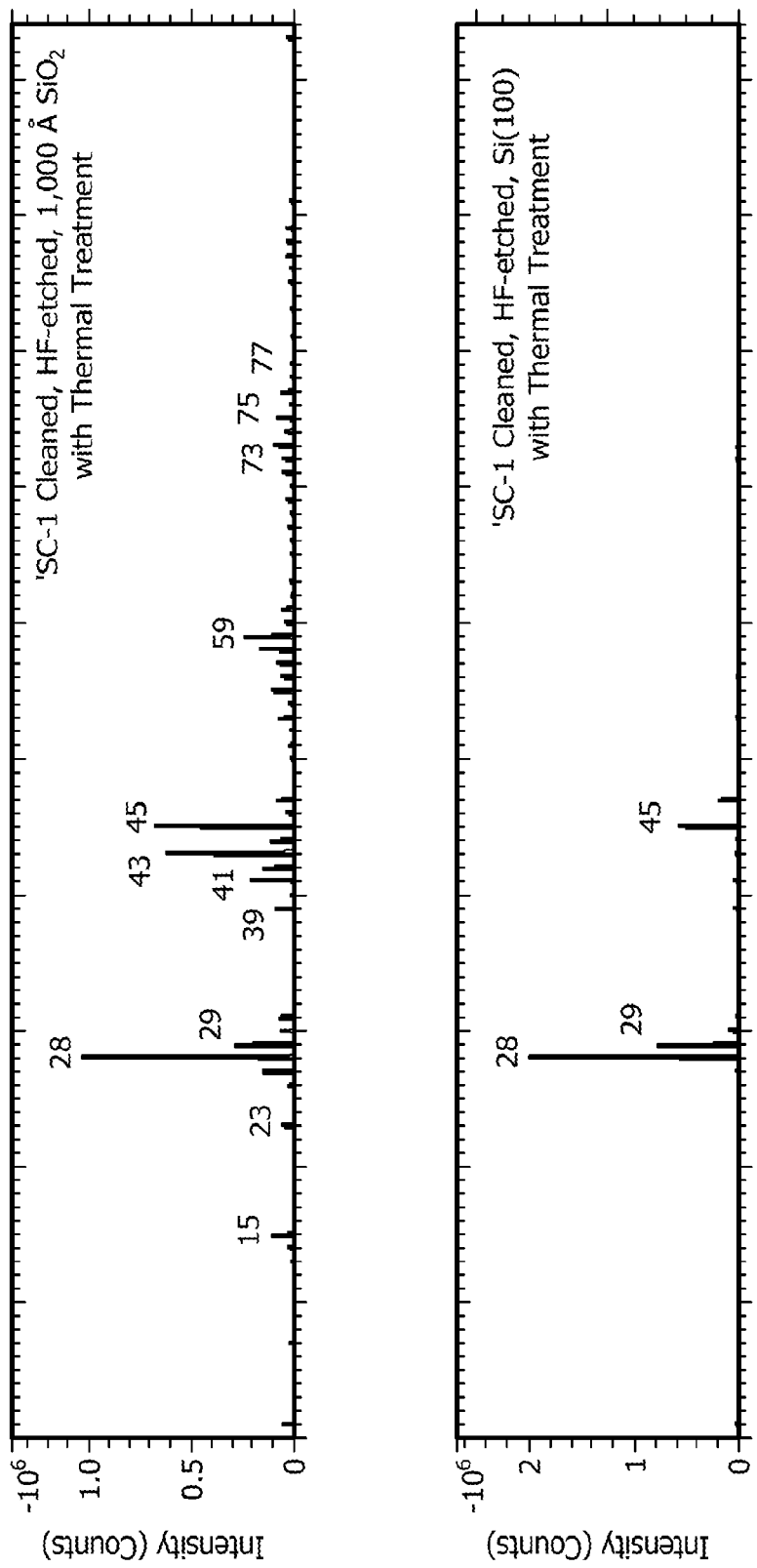
FIG. 23 is a series of TOF-SIMS spectra of a substrate surface after a wet chemical exposure step and after thermal treatment according to an embodiment of the present invention.

The TOF-SIMS spectra for the 'SC-1 cleaned, HF-etched' 1,000 Å $SiO_2$ and Si(100) samples are presented in FIG. 23.

Referring to FIG. 23, the lack of observation of the peaks associated with bis-dimethylsilylethane surface passivation in the Si(100) TOF-SIMS spectrum is evidence that the formation of the passivation layer was limited to the 'SC-1 cleaned, HF-etched' 1,000 Å $SiO_2$/Si(100) substrate. That is, the passivation was formed selectively on the desired surface and not on the Si(100) surface.

Normalized Ion Intensities for positive ions with mass 45 amu, 29 amu, 43 amu, 59 amu and 73 amu for "SC-1 cleaned, HF-etched" 1,000 Å $SiO_2$/Si(100) and Si(100) are shown in the table below.

| Sample | Thermal Treatment | mass 45 amu | mass 29 amu | mass 43 amu | mass 59 amu | mass 73 amu |
| --- | --- | --- | --- | --- | --- | --- |
| SC-1 Cleaned, HF-etched 1000 Å SiO2/Si(100) | Yes | 745 | 292 | 757 | 283 | 126 |
| SC-1 Cleaned, HF-etched Si(100) | Yes | 1200 | 1527 | 63 | 2.2 | 0.4 |

Example 13 (Comparative): Selective Formation of Bis-Dimethylsilylethane Surface Passivation on 'SC-1 Cleaned, HF-Etched', 1,000 Å $SiO_2$/Si(100) and not on Si(100) Using $[Cl(CH_3)_2Si]_2(CH_2)_2$ (1,2-bis-chlorodimethylsilylethane) at 370° C. without Thermal Treatment Processing Several 1.5"×1.5" coupons of a 1,000 Å thermal $SiO_2$/Si (100) ["1,000 Å $SiO_2$"] and Si(100) were cleaved from 4" wafers, blown off with a stream of high purity nitrogen to remove particles and then loaded into a Teflon boat suitable for immersion in an SC-1 cleaning bath. The boat and samples were then immersed in an SC-1 cleaning solution (100 ml ultra-high purity $NH_4OH$ (28%-30%); 200 ml ultra-high purity $H_2O_2$ (28-30%); 1000 nil distilled, deionized $H_2O$) that was pre-heated to a temperature of 70+/−5° C. where they were cleaned for 10 minutes. The SC-1 cleaned, 1,000 Å $SiO_2$/(100) and Si(100) samples were then removed from the cleaning bath and rinsed of chemicals using three dump rinse cycles of distilled, deionized water. The samples were then dried thoroughly using a source of ultra-high purity $N_2$ gas that was filtered for particles.

The dried SC-1 cleaned samples were then placed into a Teflon boat suitable for immersion in an HF-etch batch. The boat and samples were then immersed in an HF-etch bath (51 ml ultra-high purity HF (48-49%); 1000 ml distilled, deionized $H_2O$) that was at 21+/−2° C. where they were etched for 90 seconds. The 'SC-1 cleaned, HF-etched', 1,000 Å $SiO_2$/Si(100) and Si(100) samples were then removed from the HF solution and quickly immersed in distilled, de-ionized water and then dried thoroughly using a source of ultra-high purity $N_2$ gas that was filtered for particles.

Several of the 'SC-1 cleaned, HF-etched', 1000 Å $SiO_2$ and Si(100) samples were then loaded into the tube of a tube furnace reactor system under a flow of 250 sccm ultra-high purity $N_2$ gas at room temperature with as minimum a delay as possible. The tube was then sealed and slowly evacuated to a pressure of 80 mTorr. A flow of 20 sccm $N_2$ was then introduced into the reactor tube and a reduced pressure $N_2$ purge was conducted for 2 minutes (at a pressure of 2.3 Torr). The flow of $N_2$ was then stopped and the tube was evacuated to a pressure of ≤5 mTorr. The previously described cycle purging steps were repeated until the base pressure of the system was achieved.

After base pressure was achieved, a flow of 20 sccm of ultra-high purity $N_2$ was introduced into the reactor system and a reduced pressure $N_2$ purge (at 2.3 Torr) was conducted for 1 hour to reduce the background moisture concentration in the system prior to initiating the thermal treatment. As known to those skilled in the art, use of a load lock system will enable greatly reduced cycle times while still providing the required system purity for the processes described herein to be operative.

The samples were equilibrated at 370° C. for 10 minutes, the $N_2$ flow was terminated and the tube was fully evacuated to a pressure of no more than 1 mTorr. The tube was then charged with a first chemical dose of 1,2-bis-chlorodimethylsilylethane [$(Cl(CH_3)_2Si]_2(CH_2)_2$] to a pressure of 0.24 Torr and then isolated at this pressure for 10 minutes. The first chemical dose was then removed from the chamber using a combination of reduced pressure $N_2$ purging and evacuation that encompassed first introducing a dynamic flow of 20 sccm $N_2$ at a pressure of 2.5 Torr for one minute, followed by evacuation of the tube to a pressure not greater than 10 mTorr for two minutes. The second chemical dose of $(Cl(CH_3)_2Si]_2(CH_2)_2$ was then introduced in a manner identical to the first dose except that the pressure of the second dose was 0.23 Torr. The second dose was then removed in the same manner as the first chemical dose prior to the introduction of the third chemical dose. The third through twelfth chemical doses of $(Cl(CH_3)_2Si]_2(CH_2)_2$ were then introduced in a manner identical to the first and second doses except that the pressure of these doses varied slightly between 0.23 Torr and 0.25 Torr. The third through twelfth doses were then removed in the same manner as the first and second chemical doses, completing the selective formation of the bis-dimethylsilylethane surface passivation on the 'SC-1 cleaned, HF-etched', 1,000 Å $SiO_2$ samples, but not on the Si(100) samples.

After the selective passivation formation was completed, the 'SC-1 cleaned, HF-etched' 1,000 Å $SiO_2$ and Si(100) samples were cooled to room temperature under a flow of 20 sccm ultra-high purity $N_2$ at a pressure of 2.3 Torr. The samples were then unloaded under a flow of 500 sccm $N_2$, quickly enclosed in a container and then stored under $N_2$ for shipment to the vendor for analytical characterization of their properties.

The samples were also analyzed by X-Ray Photoelectron Spectroscopy (XPS) and the results are presented in the table below.

| Sample | Carbon (atomic %) | Oxygen (atomic %) | Silicon (atomic %) | O/Si Ratio |
|---|---|---|---|---|
| SC-1 Cleaned, HF-etched 1,000 Å SiO2/Si(100) | 2.4 | 65.2 | 32.3 | 2.02 |
| SC-1 Cleaned, HF-etched Si(100) | 6.2 | 24.8 | 68.8 | 0.36 |

Figure 24:
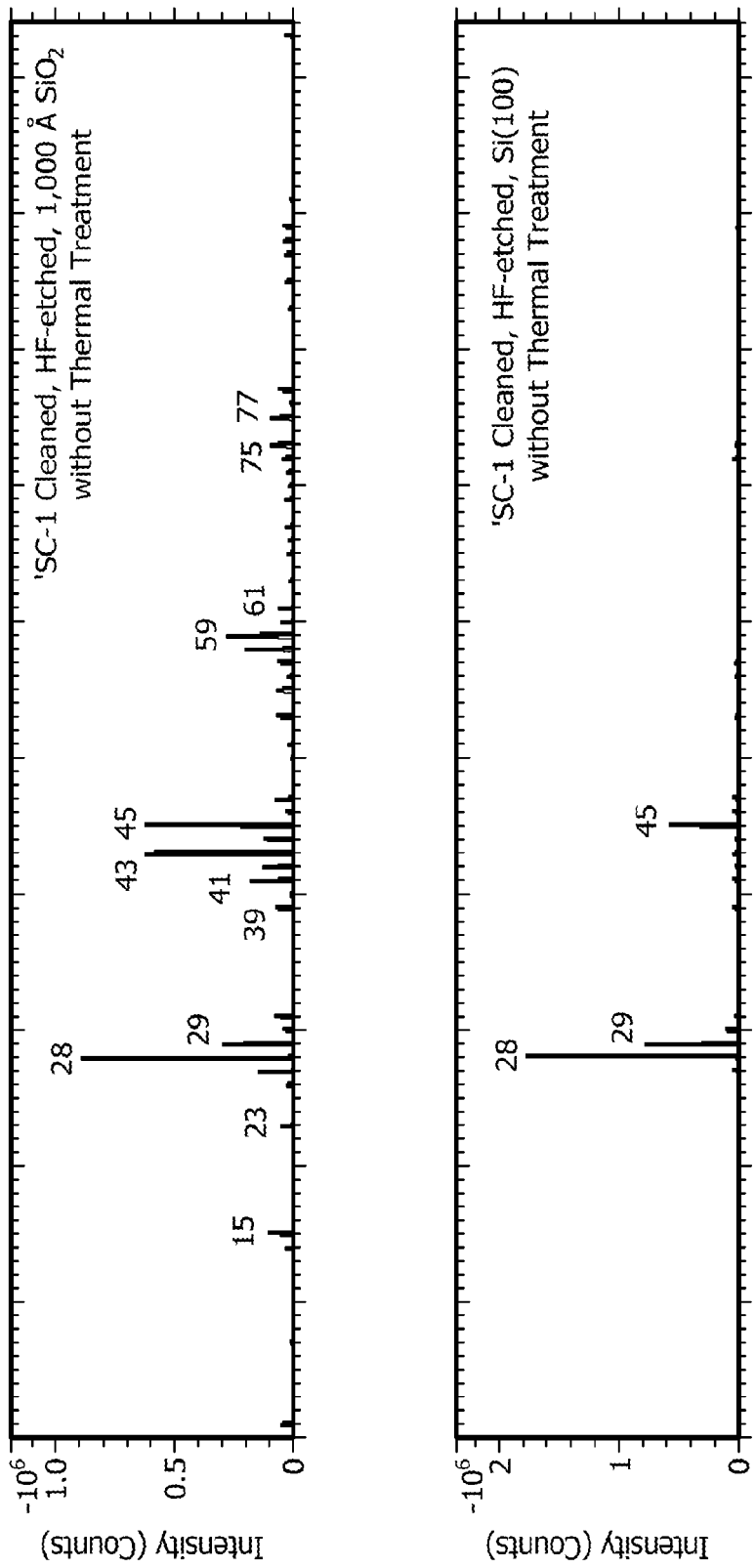
FIG. 24 is a series of TOF-SIMS spectra of a substrate surface after a wet chemical exposure steps (without thermal treatment) according to an embodiment of the present invention.

The TOF-SIMS spectra for the 'SC-1 cleaned, HF-etched' 1,000 Å $SiO_2$ and Si(100) samples are presented in FIG. 24. Referring to FIG. 24, the lack of observation of the peaks associated with bis-dimethylsilylethane surface passivation in the Si(100) TOF-SIMS spectrum is evidence that the formation of the passivation layer was limited to the 'SC-1 cleaned, HF-etched' 1,000 Å $SiO_2$/Si(100) substrate. That is, the passivation was formed selectively on the desired surface and not on the Si(100) surface.

Normalized Ion Intensities for positive ions with mass 45 amu, 29 amu, 43 amu, 59 amu and 73 amu for "SC-1 cleaned, HF-etched" 1,000 Å $SiO_2$/Si(100) and Si(100) are shown in the table below.

| Sample | Thermal Treatment | mass 45 amu | mass 29 amu | mass 43 amu | mass 59 amu | mass 73 amu |
|---|---|---|---|---|---|---|
| SC-1 Cleaned, HF-etched 1,000 Å SiO2/Si(100) | No | 718 | 333 | 917 | 445 | 127 |
| SC-1 Cleaned, HF-etched Si(100) | No | 1253 | 1683 | 72 | 1.9 | 0.4 |

The 'SC-1 cleaned, HF-etched' 1,000 Å $SiO_2$ and Si(100) samples were characterized using water contact angle measurements, Atomic Force Microscopy (AFM) and Time-of-Flight Secondary Ion Mass Spectrometry (TOF-SIMS). The results of these analyses are presented in the table below.

Contact Angle Measurements and Surface Roughness Measurements

| Sample | Thermal Treatment | Water Contact Angle (Degrees) | Surface Roughness (nm) |
|---|---|---|---|
| SC-1 Cleaned, HF-etched 1,000 Å SiO2/Si(100) | No | 90.5 | 0.24 |
| SC-1 Cleaned, HF-etched Si(100) | No | 51.8 | 0.16 |

Example 14 (Comparative): Selective Formation of Bis-Dimethylsilylethane Surface Passivation on 'as-Received', 1,000 Å $SiO_2$/Si(100) and not on Si(100) Using [$Cl(CH_3)_2Si]_2(CH_2)_2$ (1,2-bis-chlorodimethylsilylethane) at 370° C. with Thermal Treatment Processing Several 1.5"×1.5" coupons of a 1,000 Å thermal $SiO_2$/Si (100) ["1,000 Å $SiO_2$"] and Si(100) were cleaved from 4" wafers, blown off with a stream of high purity nitrogen to remove particles.

Several of these 'as-received', 1000 Å $SiO_2$ and "SC-1 cleaned, HF-etched" Si(100) samples were then loaded into the tube of a tube furnace reactor system under a flow of 250 sccm ultra-high purity $N_2$ gas at room temperature with as minimum a delay as possible. The tube was then sealed and slowly evacuated to a pressure of 80 mTorr. A flow of 20 sccm $N_2$ was then introduced into the reactor tube and a reduced pressure $N_2$ purge was conducted for 2 minutes (at a pressure of 2.3 Torr). The flow of $N_2$ was then stopped and the tube was evacuated to a pressure of ≤5 mTorr. The previously described cycle purging steps were repeated until the base pressure of the system was achieved.

After base pressure was achieved, a flow of 20 sccm of ultra-high purity $N_2$ was introduced into the reactor system and a reduced pressure $N_2$ purge (at 2.3 Torr) was conducted for 1 hour to reduce the background moisture concentration in the system prior to initiating the thermal treatment. As known to those skilled in the art, use of a load lock system will enable greatly reduced cycle times while still providing the required system purity for the processes described herein to be operative.

Figure 25:
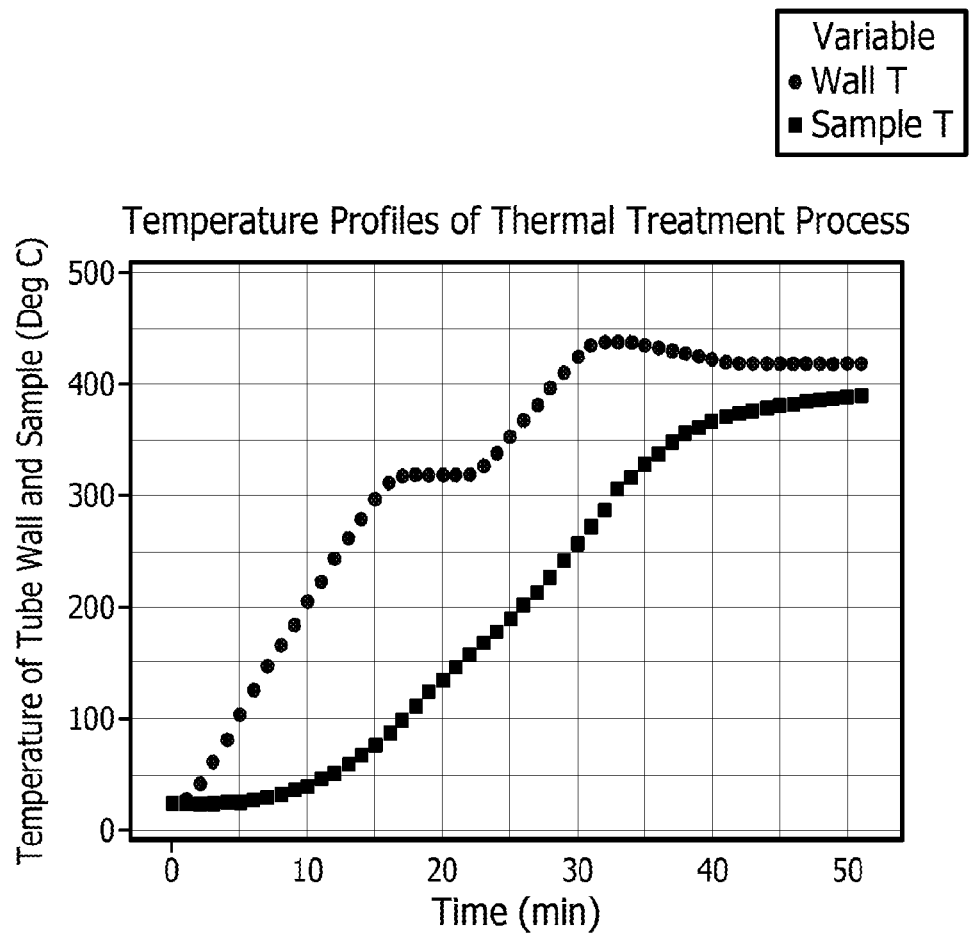
FIG. 25 is a graph illustrating the temperature profile verus time for a thermal treatment step according to an embodiment of the present invention.

The thermal treatment was then performed under a reduced pressure purge of ultra-high purity $N_2$ gas (at 2.3 Torr) using the pre-programmed heating process recipe stored on the temperature controller for the furnace. The heat traces of two independent thermocouples (one representing the external tube temperature—'wall' and one representing the sample temperature) are shown in FIG. 25.

After the thermal treatment was completed, a flow of 20 sccm ultra-high purity $N_2$ was maintained through the tube at a pressure of 2.5 Torr while the sample temperature was reduced to 370° C. The samples were equilibrated at 370° C. for 10 minutes, the $N_2$ flow was terminated and the tube was fully evacuated to a pressure of no more than 1 mTorr. The tube was then charged with a first chemical dose of 1,2-bis-chlorodimethylsilylethane [$(Cl(CH_3)_2Si]_2(CH_2)_2$] to a pressure of 0.24 Torr and then isolated at this pressure for 10 minutes. The first chemical dose was then removed from the chamber using a combination of reduced pressure $N_2$ purging and evacuation that encompassed first introducing a dynamic flow of 20 sccm $N_2$ at a pressure of 2.5 Torr for one minute, followed by evacuation of the tube to a pressure not greater than 10 mTorr for two minutes. The second chemical dose of $(Cl(CH_3)_2Si]_2(CH_2)_2$ was then introduced in a manner identical to the first dose except that the pressure of the second dose was 0.25 Torr. The second dose was then removed in the same manner as the first chemical dose prior to the introduction of the third chemical dose. The third through twelfth chemical doses of $(Cl(CH_3)_2Si]_2(CH_2)_2$ were then introduced in a manner identical to the first and second doses except that the pressure of these doses varied slightly between 0.24 Torr and 0.26 Torr. The third through twelfth doses were then removed in the same manner as the first and second chemical doses, completing the selective formation of the bis-dimethylsilylethane surface passivation on the 'SC-1 cleaned, HF-etched', 1,000 Å $SiO_2$ samples, but not on the Si(100) samples.

After the selective passivation formation was completed, the 'as-received' 1,000 Å $SiO_2$ and Si(100) samples were cooled to room temperature under a flow of 20 sccm ultra-high purity $N_2$ at a pressure of 2.3 Torr. The samples were then unloaded under a flow of 500 sccm $N_2$, quickly enclosed in a container and then stored under $N_2$ for shipment to the vendor for analytical characterization of their properties.

The 'as-received' 1,000 Å $SiO_2$ and Si(100) samples were characterized using water contact angle measurements, Atomic Force Microscopy (AFM) and Time-of-Flight Secondary Ion Mass Spectrometry (TOF-SIMS). For comparison, 'as-received' 1,000 Å $SiO_2$ samples that did not receive the thermal treatment processing were also characterized in a similar fashion. The results of these analyses are presented in the tables below:

| Contact Angle Measurements and Surface Roughness Measurements | | | |
|---|---|---|---|
| Sample | Thermal Treatment | Water Contact Angle (Degrees) | Surface Roughness (nm) |
| As-Received 1,000 Å SiO2/Si(100) | Yes | 83.9 | 0.23 |
| SC-1 Cleaned, HF-etched Si(100) | Yes | 56.4 | 0.18 |

The samples were also analyzed by X-Ray Photoelectron Spectroscopy (XPS) and the results are presented in the table below:

| Sample | Carbon (atomic %) | Oxygen (atomic %) | Silicon (atomic %) | O/Si Ratio |
|---|---|---|---|---|
| As-Received 1,000 Å SiO2/Si(100) | 2.2 | 65.7 | 31.9 | 2.06 |
| SC-1 Cleaned, HF-etched Si(100) | 5 | 28.6 | 65.7 | 0.44 |

Figure 26:
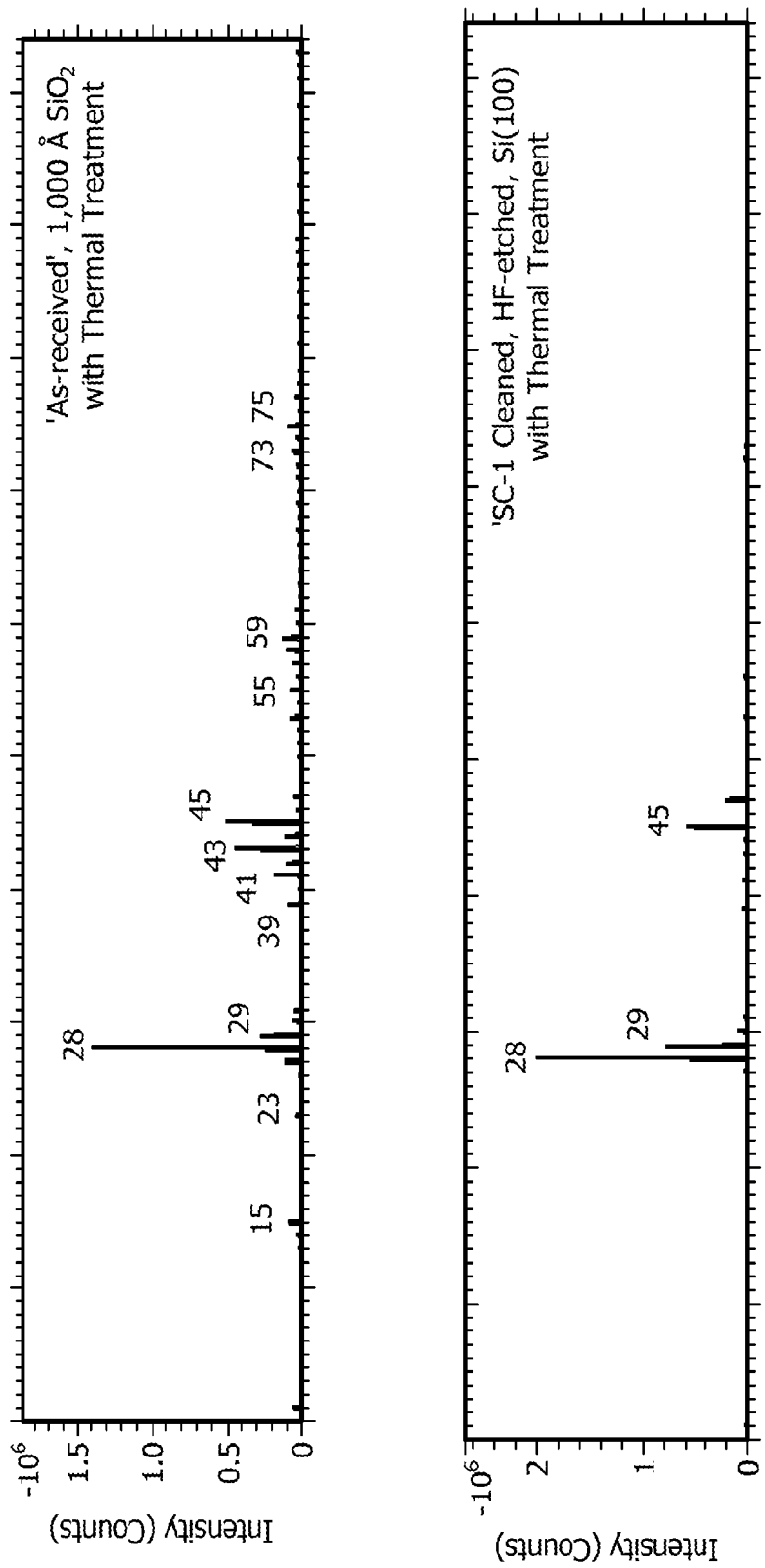
FIG. 26 is a series of TOF-SIMS spectra of a substrate surface as received after a thermal treatment and of a substrate after a wet chemical treatment plus thermal treatment according to an embodiment of the present invention.

The TOF-SIMS spectra for the 'as-received' 1,000 Å $SiO_2$ and Si(100) samples are presented in FIG. 26. Referring to FIG. 26, the lack of observation of the peaks associated with bis-dimethylsilylethane surface passivation in the Si(100) TOF-SIMS spectrum is evidence that the formation of the passivation layer was limited to the 'as-received' 1,000 Å $SiO_2/Si(100)$ substrate. That is, the passivation was formed selectively on the desired surface and not on the Si(100) surface.

Normalized Ion Intensities for positive ions with mass 45 amu, 29 amu, 43 amu, 59 amu and 73 amu for "as-received" 1,000 Å $SiO_2/Si(100)$ and Si(100) are shown in the table below.

| Sample | Thermal Treatment | mass 45 amu | mass 29 amu | mass 43 amu | mass 59 amu | mass 73 amu |
|---|---|---|---|---|---|---|
| As-Received 1,000 Å SiO2/Si(100) | Yes | 673 | 301 | 630 | 190 | 94 |
| SC-1 Cleaned, HF-etched Si(100) | Yes | 1200 | 1527 | 63 | 2.2 | 0.4 |

Example 15 (Comparative): Selective Formation of Bis-Dimethylsilylethane Surface Passivation on 'as-Received', 1,000 Å $SiO_2/Si(100)$ and not on Si(100) Using [$Cl(CH_3)_2Si]_2(CH_2)_2$ (1,2-bis-chlorodimethylsilylethane) at 370° C. without Thermal Treatment Processing Several 1.5"×1.5" coupons of a 1,000 Å thermal $SiO_2/Si(100)$ ["1,000 Å $SiO_2$"] and Si(100) were cleaved from 4" wafers, blown off with a stream of high purity nitrogen to remove particles.

Several of these 'as-received', 1000 Å SiO$_2$ and "SC-1 cleaned, HF-etched" Si(100) samples were then loaded into the tube of a tube furnace reactor system under a flow of 250 sccm ultra-high purity N$_2$ gas at room temperature with as minimum a delay as possible. The tube was then sealed and slowly evacuated to a pressure of 40 mTorr. A flow of 20 sccm N$_2$ was then introduced into the reactor tube and a reduced pressure N$_2$ purge was conducted for 2 minutes (at a pressure of 2.3 Torr). The flow of N$_2$ was then stopped and the tube was evacuated to a pressure of ≤5 mTorr. The previously described cycle purging steps were repeated until the base pressure of the system was achieved.

After base pressure was achieved, a flow of 20 sccm of ultra-high purity N$_2$ was introduced into the reactor system and a reduced pressure N$_2$ purge (at 2.3 Torr) was conducted for 1 hour to reduce the background moisture concentration in the system prior to initiating the thermal treatment. As known to those skilled in the art, use of a load lock system will enable greatly reduced cycle times while still providing the required system purity for the processes described herein to be operative.

The samples were equilibrated at 370° C. for 10 minutes, the N$_2$ flow was terminated and the tube was fully evacuated to a pressure of no more than 1 mTorr. The tube was then charged with a first chemical dose of 1,2-bis-chlorodimethylsilylethane [(Cl(CH$_3$)$_2$Si]$_2$(CH$_2$)$_2$] to a pressure of 0.23 Torr and then isolated at this pressure for 10 minutes. The first chemical dose was then removed from the chamber using a combination of reduced pressure N$_2$ purging and evacuation that encompassed first introducing a dynamic flow of 20 sccm N$_2$ at a pressure of 2.5 Torr for one minute, followed by evacuation of the tube to a pressure not greater than 10 mTorr for two minutes. The second chemical dose of (Cl(CH$_3$)$_2$Si]$_2$(CH$_2$)$_2$ was then introduced in a manner identical to the first dose except that the pressure of the second dose was 0.23 Torr. The second dose was then removed in the same manner as the first chemical dose prior to the introduction of the third chemical dose. The third through twelfth chemical doses of (Cl(CH$_3$)$_2$Si]$_2$(CH$_2$)$_2$ were then introduced in a manner identical to the first and second doses except that the pressure of these doses varied slightly between 0.23 Torr and 0.25 Torr. The third through twelfth doses were then removed in the same manner as the first and second chemical doses, completing the selective formation of the bis-dimethylsilylethane surface passivation on the 'SC-1 cleaned, HF-etched', 1,000 Å SiO$_2$ samples, but not on the Si(100) samples.

After the selective passivation formation was completed, the 'as-received' 1,000 Å SiO$_2$ and Si(100) samples were cooled to room temperature under a flow of 20 sccm ultra-high purity N$_2$ at a pressure of 2.3 Torr. The samples were then unloaded under a flow of 500 sccm N$_2$, quickly enclosed in a container and then stored under N$_2$ for shipment to the vendor for analytical characterization of their properties.

The 'as-received' 1,000 Å SiO$_2$ and Si(100) samples were characterized using water contact angle measurements, Atomic Force Microscopy (AFM) and Time-of-Flight Secondary Ion Mass Spectrometry (TOF-SIMS). For comparison, 'as-received' 1,000 Å SiO$_2$ samples that did not receive the thermal treatment processing were also characterized in a similar fashion. The results of these analyses are presented in the table below.

Contact Angle Measurements and Surface Roughness Measurements

| Sample | Thermal Treatment | Water Contact Angle (Degrees) | Surface Roughness (nm) |
|---|---|---|---|
| As-Received 1,000 Å 1,000 Å SiO2/Si(100) | No | 83.7 | 0.21 |
| SC-1 Cleaned, HF-etched Si(100) | No | 51.8 | 0.16 |

The samples were also analyzed by X-Ray Photoelectron Spectroscopy (XPS) and the results are presented in the table below.

| Sample | Carbon (atomic %) | Oxygen (atomic %) | Silicon (atomic %) | O/Si Ratio |
|---|---|---|---|---|
| As-Received 1,000 Å SiO2/Si(100) | 2.3 | 65.6 | 32.3 | 2.04 |
| SC-1 Cleaned, HF-etched Si(100) | 6.2 | 24.8 | 68.8 | 0.36 |

Figure 27:
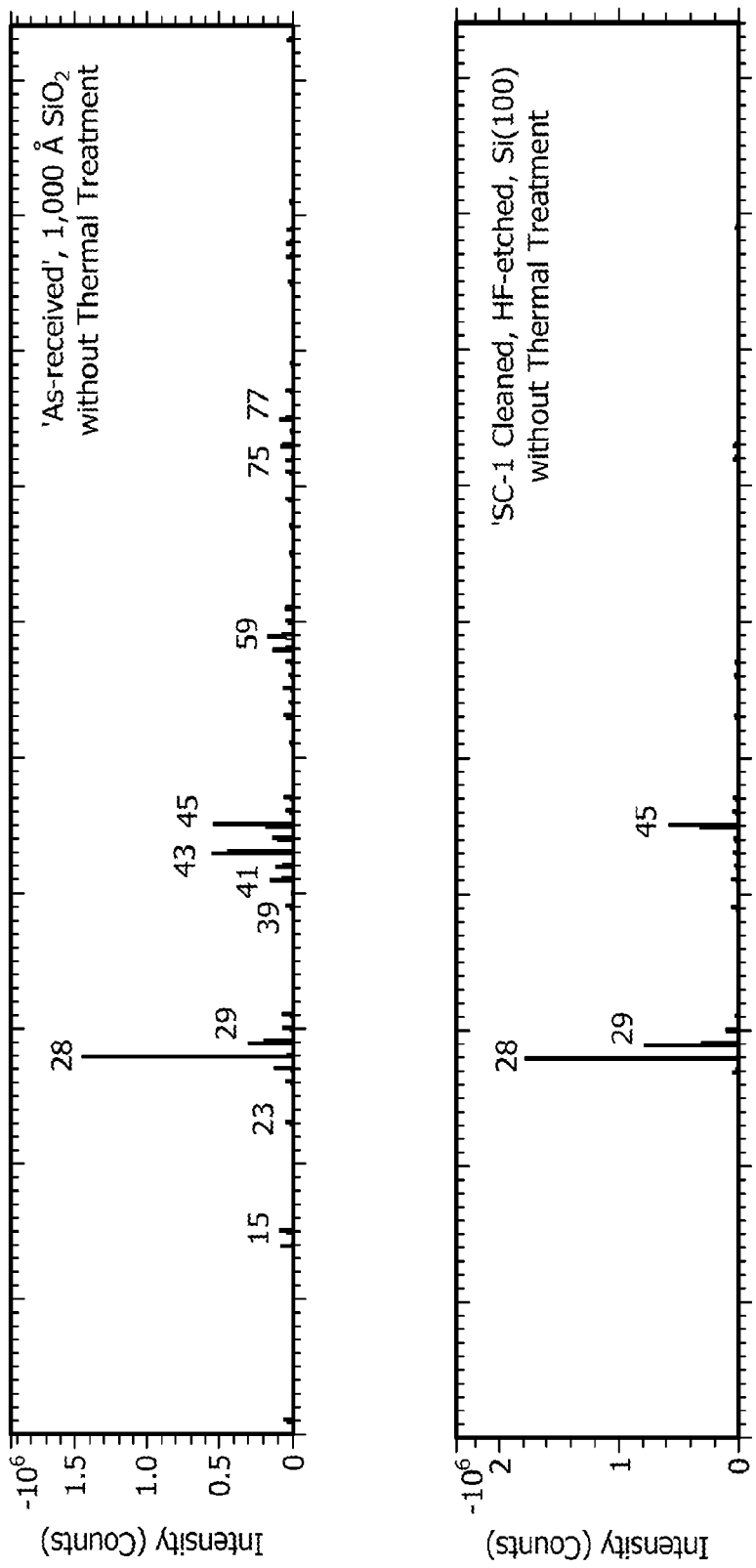
FIG. 27 is a series of TOF-SIMS spectra of a substrate surface as received after a thermal treatment and of a substrate after a wet chemical treatment plus thermal treatment according to an embodiment of the present invention.

The TOF-SIMS spectra for the 'as-received' 1,000 Å SiO$_2$ and Si(100) samples are presented in FIG. 27. Referring to FIG. 27, the lack of observation of the peaks associated with bis-dimethylsilylethane surface passivation in the Si(100) TOF-SIMS spectrum is evidence that the formation of the passivation layer was limited to the 'as-received' 1,000 Å SiO$_2$/Si(100) substrate. That is, the passivation was formed selectively on the desired surface and not on the Si(100) surface.

Normalized Ion Intensities for positive ions with mass 45 amu, 29 amu, 43 amu, 59 amu and 73 amu or "as-received" 1,000 Å SiO$_2$/Si(100) and Si(100) are shown in the table below.

| Sample | Thermal Treatment | mass 45 amu | mass 29 amu | mass 43 amu | mass 59 amu | mass 73 amu |
|---|---|---|---|---|---|---|
| As-Received 1,000 Å SiO2/Si(100) | No | 710 | 351 | 810 | 253 | 115 |
| SC-1 Cleaned, HF-etched Si(100) | No | 1253 | 1683 | 72 | 1.9 | 0.4 |

Example 16 (Comparative): Selective Formation of Trimethylsilyl Surface Passivation on 'SC-1 Cleaned, HF-Etched', 1,000 Å SiO$_2$/Si(100) and not on Si(100) Using (CH$_3$)$_2$NSi(CH$_3$)$_3$ (Dimethylaminotrimethylsilane) at 270° C. with 515° C. Thermal Treatment Several 1.5"×1.5" coupons of a 1,000 Å thermal SiO$_2$/Si (100) ["1,000 Å SiO$_2$"] and Si(100) were cleaved from 4" wafers, blown off with a stream of high purity nitrogen to remove particles and then loaded into a Teflon boat suitable for immersion in an SC-1 cleaning bath. The boat and samples were then immersed in an SC-1 cleaning solution (100 ml ultra-high purity $NH_4OH$ (28%-30%); 200 ml ultra-high purity $H_2O_2$ (28-30%); 1000 ml distilled, deionized $H_2O$) that was pre-heated to a temperature of 70+/−5° C. where they were cleaned for 10 minutes. The SC-1 cleaned, 1,000 Å $SiO_2$/Si(100) and Si(100) samples were then removed from the cleaning bath and rinsed of chemicals using three dump rinse cycles of distilled, deionized water. The samples were then dried thoroughly using a source of ultra-high purity $N_2$ gas that was filtered for particles.

The dried SC-1 cleaned samples were then placed into a Teflon boat suitable for immersion in an HF-etch batch. The boat and samples were then immersed in an HF-etch bath (51 ml ultra-high purity HF (48-49%); 1000 ml distilled, deionized $H_2O$) that was at 21+/−2° C. where they were etched for 90 seconds. The 'SC-1 cleaned, HF-etched', 1,000 Å $SiO_2$/Si(100) and Si(100) samples were then removed from the HF solution and quickly immersed in distilled, de-ionized water and then dried thoroughly using a source of ultra-high purity $N_2$ gas that was filtered for particles.

Several of the 'SC-1 cleaned, HF-etched', 1000 Å $SiO_2$ and Si(100) samples were then loaded into the tube of a tube furnace reactor system under a flow of 250 sccm ultra-high purity $N_2$ gas at room temperature with as minimum a delay as possible. The tube was then sealed and slowly evacuated to a pressure of 80 mTorr. A flow of 20 sccm $N_2$ was then introduced into the reactor tube and a reduced pressure $N_2$ purge was conducted for 2 minutes (at a pressure of 2.3 Torr). The flow of $N_2$ was then stopped and the tube was evacuated to a pressure of ≤5 mTorr. The previously described cycle purging steps were repeated until the base pressure of the system was achieved.

After base pressure was achieved, a flow of 20 sccm of ultra-high purity $N_2$ was introduced into the reactor system and a reduced pressure $N_2$ purge (at 2.3 Torr) was conducted for 1 hour to reduce the background moisture concentration in the system prior to initiating the thermal treatment. As known to those skilled in the art, use of a load lock system will enable greatly reduced cycle times while still providing the required system purity for the processes described herein to be operative.

A 515° C. thermal treatment was then performed under a reduced pressure purge of ultra-high purity $N_2$ gas (at 2.3 Torr) by ramping the samples to 515° C. at the maximum ramping rate of the furnace (ca. 20° C./minute).

After the thermal treatment was completed, a flow of 20 sccm ultra-high purity $N_2$ was maintained through the tube at a pressure of 2.5 Torr while the sample temperature was reduced to 270° C. The samples were equilibrated at 270° C. for 10 minutes, the $N_2$ flow was terminated and the tube was fully evacuated to a pressure of no more than 1 mTorr. The tube was then charged with a first chemical dose of dimethylaminotrimethylsilane [$(CH_3)_2NSi(CH_3)_3$] to a pressure of 20.0 Torr and then isolated at this pressure for 20 minutes. The first chemical dose was then removed from the chamber using a combination of reduced pressure $N_2$ purging and evacuation that encompassed first introducing a dynamic flow of 20 sccm $N_2$ at a pressure of 2.5 Torr for one minute, followed by evacuation of the tube to a pressure not greater than 10 mTorr for two minutes. The second chemical dose of $(CH_3)_2NSi(CH_3)_3$ was then introduced in a manner identical to the first dose except that the pressure of the second dose was 20.8 Torr. The second dose was then removed in the same manner as the first chemical dose prior to the introduction of the third chemical dose. The third chemical dose of $(CH_3)_2NSi(CH_3)_3$ was then introduced in a manner identical to the first and second doses except that the pressure of the third dose was 20.0 Torr. The third chemical dose was then removed in the same manner as the first and second chemical doses, completing the selective formation of the trimethylsilyl surface passivation on the 'SC-1 cleaned, HF-etched', 1,000 Å $SiO_2$ samples, but not on the Si(100) samples.

After the selective passivation formation was completed, the 'SC-1 cleaned, HF-etched' 1,000 Å $SiO_2$ and Si(100) samples were cooled to room temperature under a flow of 20 sccm ultra-high purity $N_2$ at a pressure of 2.3 Torr. The samples were then unloaded under a flow of 500 sccm $N_2$, quickly enclosed in a container and then stored under $N_2$ for shipment to the vendor for analytical characterization of their properties.

The 'SC-1 cleaned, HF-etched' 1,000 Å $SiO_2$ and Si(100) samples were characterized using water contact angle measurements, Atomic Force Microscopy (AFM) and Time-of-Flight Secondary Ion Mass Spectrometry (TOF-SIMS). For comparison, 'As-received' 1,000 Å $SiO_2$ samples were also characterized in a similar fashion. The results of these analyses are presented in the tables below:

| Contact Angle Measurements and Surface Roughness Measurements | | | |
|---|---|---|---|
| Sample | Thermal Treatment (515° C.) | Water Contact Angle (Degrees) | Surface Roughness (nm) |
| As-Received 1,000 Å SiO2/Si(100) | Yes | 76.1 | 0.32 |
| SC-1 Cleaned, HF-etched 1,000 Å SiO2/Si(100) | Yes | 51.8 | 0.34 |
| SC-1 Cleaned, HF-etched Si(100) | Yes | 28.2 | 0.18 |

The samples were also analyzed by X-Ray Photoelectron Spectroscopy (XPS) and the results are presented in the table below:

| Sample | Carbon (atomic %) | Oxygen (atomic %) | Silicon (atomic %) | O/Si Ratio |
|---|---|---|---|---|
| As-Received 1,000 Å SiO2/Si(100) | 3.4 | 65.4 | 31 | 2.11 |
| SC-1 Cleaned, HF-etched 1,000 Å SiO2/Si(100) | 2 | 66.5 | 31.2 | 2.12 |
| SC-1 Cleaned, HF-etched Si(100) | 4.4 | 34.9 | 60.3 | 0.58 |

Figure 28:
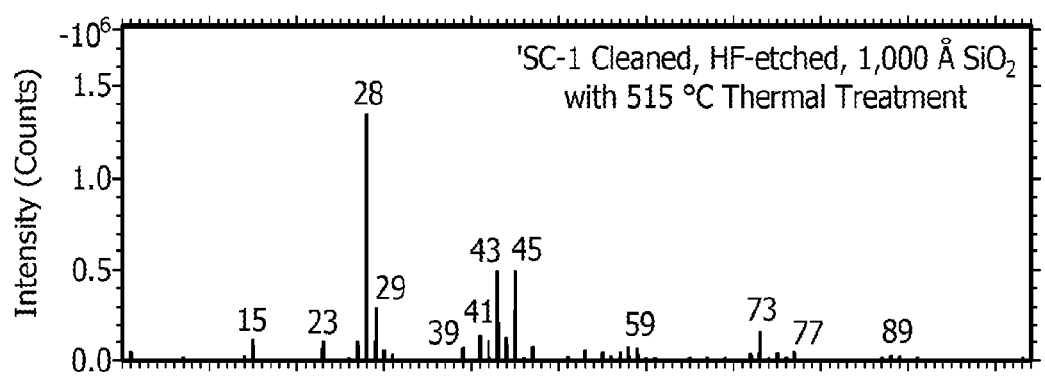
FIG. 28 is a TOF-SIMS spectra of a substrate surface after wet chemical and thermal treatment according to an embodiment of the present invention.
Figure 29:
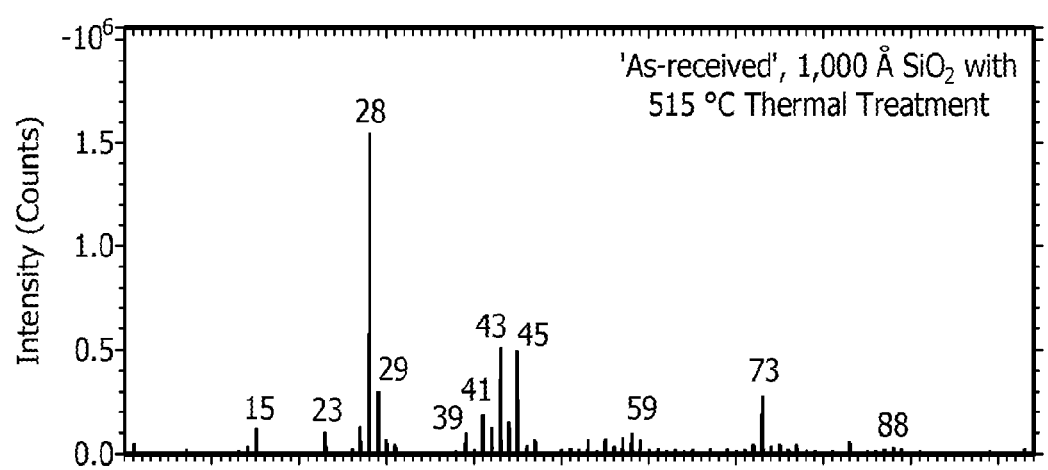
FIG. 29 is a TOF-SIMS spectra of a substrate surface as received plus thermal treatment (no wet chemical exposure) according to an embodiment of the present invention.
Figure 30:
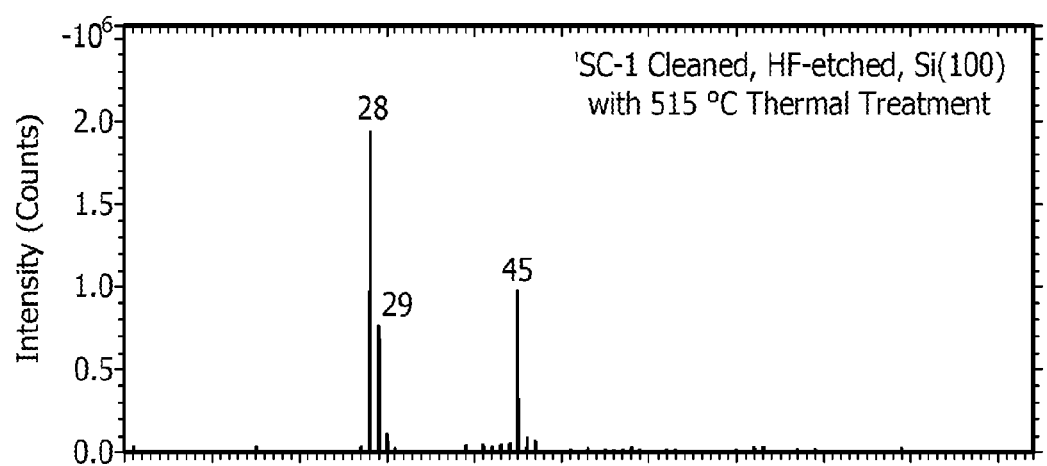
FIG. 30 is a TOF-SIMS spectra of a substrate surface after wet chemical exposure and thermal treatment according to an embodiment of the present invention.

The TOF-SIMS spectra for the 'SC-1 cleaned, HF-etched' 1,000 Å $SiO_2$, the 'as-received' 1,000 Å $SiO_2$ and Si(100) samples are presented in FIGS. 28 to 30. Referring to FIGS. 28 to 30, the lack of observation of the peaks associated with trimethylsilyl surface passivation in the Si(100) TOF-SIMS spectrum is evidence that the formation of the passivation layer was limited to the 'SC-1 cleaned, HF-etched' 1,000 Å $SiO_2$/(100) substrate. That is, the passivation was formed selectively on the desired surface and not on the Si(100) surface.

Normalized Ion Intensities for positive ions with mass 45 amu, 29 amu, 43 amu, 59 amu and 73 amu for "SC-1 cleaned, HF-etched" 1,000 Å $SiO_2$/Si(100) and Si(100) are shown in the table below.

| Sample | Thermal Treatment (515° C.) | mass 45 amu | mass 29 amu | mass 43 amu | mass 59 amu | mass 73 amu |
|---|---|---|---|---|---|---|
| As-Received 1,000 Å SiO2/Si(100) | Yes | 490 | 284 | 627 | 636 | 357 |
| SC-1 Cleaned, HF-etched 1000 Å SiO2/Si(100) | Yes | 630 | 348 | 757 | 87 | 262 |
| SC-1 Cleaned, HF-etched Si(100) | Yes | 1650 | 1380 | 54 | 15 | 3 |

Example 17: Selective Formation of bis-dimethylsilylethane/trimethylsilyl Surface Passivation on 'SC-1 Cleaned, HF-Etched', 1,000 Å $SiO_2$/Si(100) and on 'as-Received', 1,000 Å $SiO_2$/Si(100) Using $[Cl(CH_3)_2Si]_2(CH_2)_2$(1,2-bis-chlorodimethylsilylethane) and $(CH_3)_2NSi(CH_3)_3$ (Dimethylaminotrimethylsilane) at 370° C. with Thermal Treatment Processing Several 1.5"×1.5" coupons of a 1,000 Å thermal $SiO_2$/Si(100) ["1,000 Å $SiO_2$"] and Si(100) were cleaved from 4" wafers, blown off with a stream of high purity nitrogen to remove particles and then some of them were then loaded into a Teflon boat suitable for immersion in an SC-1 cleaning bath. The boat and samples were then immersed in an SC-1 cleaning solution (100 ml ultra-high purity $NH_4OH$ (28%-30%); 200 ml ultra-high purity $H_2O_2$ (28-30%); 1000 ml distilled, deionized $H_2O$) that was pre-heated to a temperature of 70+/−5° C. where they were cleaned for 10 minutes. The SC-1 cleaned, 1,000 Å $SiO_2$/Si(100) and Si(100) samples were then removed from the cleaning bath and rinsed of chemicals using three dump rinse cycles of distilled, deionized water. The samples were then dried thoroughly using a source of ultra-high purity $N_2$ gas that was filtered for particles.

The dried SC-1 cleaned samples were then placed into a Teflon boat suitable for immersion in an HF-etch batch. The boat and samples were then immersed in an HF-etch bath (51 ml ultra-high purity HF (48-49%); 1000 ml distilled, deionized $H_2O$) that was at 21+/−2° C. where they were etched for 90 seconds. The 'SC-1 cleaned, HF-etched', 1,000 Å $SiO_2$/Si(100) and Si(100) samples were then removed from the HF solution and quickly immersed in distilled, de-ionized water and then dried thoroughly using a source of ultra-high purity $N_2$ gas that was filtered for particles.

Several of the 'SC-1 cleaned, HF-etched', 1000 Å $SiO_2$ and 'as-received', 1,000 Å $SiO_2$/Si(100) samples were then loaded into the tube of a tube furnace reactor system under a flow of 250 sccm ultra-high purity $N_2$ gas at room temperature with as minimum a delay as possible. The tube was then sealed and slowly evacuated to a pressure of 8060 mTorr. A flow of 20 sccm $N_2$ was then introduced into the reactor tube and a reduced pressure $N_2$ purge was conducted for 2 minutes (at a pressure of 2.3 Torr). The flow of $N_2$ was then stopped and the tube was evacuated to a pressure of ≤5 mTorr. The previously described cycle purging steps were repeated until the base pressure of the system was achieved.

After base pressure was achieved, a flow of 20 sccm of ultra-high purity $N_2$ was introduced into the reactor system and a reduced pressure $N_2$ purge (at 2.3 Torr) was conducted for 1 hour to reduce the background moisture concentration in the system prior to initiating the thermal treatment. As known to those skilled in the art, use of a load lock system will enable greatly reduced cycle times while still providing the required system purity for the processes described herein to be operative.

Figure 31:
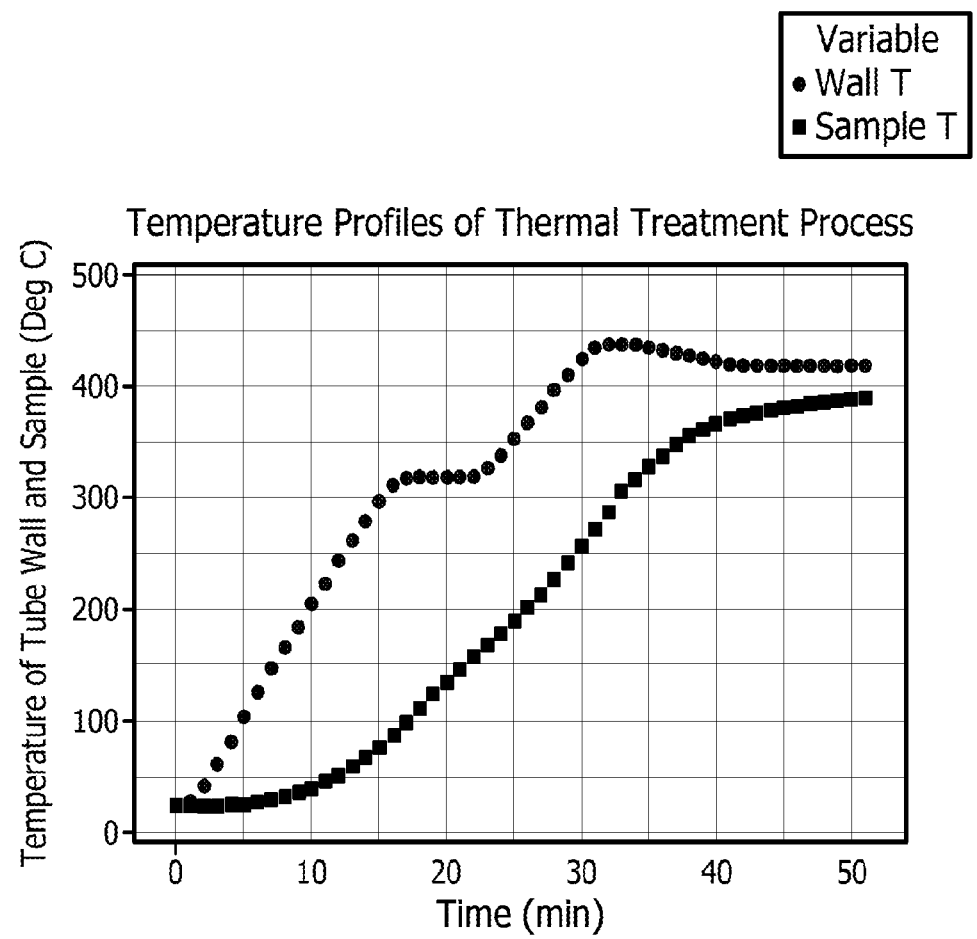
FIG. 31 is a graph illustrating the temperature profile verus time for a thermal treatment step according to an embodiment of the present invention.

The thermal treatment was then performed under a reduced pressure purge of ultra-high purity $N_2$ gas (at 2.3 Torr) using the pre-programmed heating process recipe stored on the temperature controller for the furnace. The heat traces of two independent thermocouples (one representing the external tube temperature—'wall' and one representing the sample temperature) are shown in FIG. 31.

After the thermal treatment was completed, a flow of 20 sccm ultra-high purity $N_2$ was maintained through the tube at a pressure of 2.5 Torr while the sample temperature was reduced to 370° C. The samples were equilibrated at 370° C. for 10 minutes, the $N_2$ flow was terminated and the tube was fully evacuated to a pressure of no more than 1 mTorr. The tube was then charged with a first chemical dose of 1,2-bis-chlorodimethylsilylethane $[(Cl(CH_3)_2Si]_2(CH_2)_2]$ to a pressure of 0.25 Torr and then isolated at this pressure for 10 minutes. The first chemical dose was then removed from the chamber using a combination of reduced pressure $N_2$ purging and evacuation that encompassed first introducing a dynamic flow of 20 sccm $N_2$ at a pressure of 2.5 Torr for one minute, followed by evacuation of the tube to a pressure not greater than 10 mTorr for two minutes. The second chemical dose of $(Cl(CH_3)_2Si]_2(CH_2)_2$ was then introduced in a manner identical to the first dose except that the pressure of the second dose was 0.25 Torr. The second dose was then removed in the same manner as the first chemical dose prior to the introduction of the third chemical dose. The third through twelfth chemical doses of $(Cl(CH_3)_2Si]_2(CH_2)_2$ were then introduced in a manner identical to the first and second doses except that the pressure of these doses varied slightly between 0.25 Torr and 0.26 Torr. The third through twelfth doses were then removed in the same manner as the first and second chemical doses. The reactor tube was then evacuated to base pressure over a period of 15 minutes prior to the start of chemical dosing with dimethylaminotrimethylsilane. The tube was then charged with a first chemical dose of dimethylaminotrimethylsilane $[(CH_3)_2NSi(CH_3)_3]$ to a pressure of 20.4 Torr and then isolated at this pressure for 10 minutes. The first chemical dose was then removed from the chamber using a combination of reduced pressure $N_2$ purging and evacuation that encompassed first introducing a dynamic flow of 20 sccm $N_2$ at a pressure of 2.5 Torr for one minute, followed by evacuation of the tube to a pressure not greater than 10 mTorr for two minutes. The second chemical dose of $(CH_3)_2NSi(CH_3)_3$ was then introduced in a manner identical to the first dose except that the pressure of the second dose was 20.3 Torr. The second dose was then removed in the same manner as the first chemical dose prior to the introduction of the third chemical dose. The third chemical dose of $(CH_3)_2NSi(CH_3)_3$ was then introduced in a manner identical to the first and second doses except that the pressure of the third dose was 19.8 Torr. The third chemical dose was then removed in the same manner as the first and second chemical doses, completing the selective formation of the trimethylsilyl surface passivation on the 'SC-1 cleaned, HF-etched', 1,000 Å $SiO_2$ samples and 'as-received' 1,000 Å $SiO_2$ samples.

After the selective passivation formation was completed, the 'SC-1 cleaned, HF-etched' 1,000 Å $SiO_2$ and 'as-received' 1,000 Å $SiO_2$ samples were cooled to room temperature under a flow of 20 sccm ultra-high purity $N_2$ at a pressure of 2.3 Torr. The samples were then unloaded under a flow of 500 sccm $N_2$, quickly enclosed in a container and then stored under $N_2$ for shipment to the vendor for analytical characterization of their properties.

The 'SC-1 cleaned, HF-etched' 1,000 Å $SiO_2$ and 'as-received' 1,000 Å $SiO_2$ samples were characterized using water contact angle measurements, Atomic Force Microscopy (AFM) and Time-of-Flight Secondary Ion Mass Spectrometry (TOF-SIMS). The results of these analyses are presented in the table below and in FIG. 32.

| Contact Angle Measurements and Surface Roughness Measurements | | | |
| --- | --- | --- | --- |
| Sample | Thermal Treatment | Water Contact Angle (Degrees) | Surface Roughness (nm) |
| As-Received 1,000 Å SiO2/Si(100) | No | 94 | 0.24 |
| SC-1 Cleaned, HF-etched 1,000 Å SiO2/Si(100) | No | 98.8 | 0.3 |

The samples were also analyzed by X-Ray Photoelectron Spectroscopy (XPS) and the results are presented in the table below:

| Sample | Carbon (atomic %) | Oxygen (atomic %) | Silicon (atomic %) | O/Si Ratio |
| --- | --- | --- | --- | --- |
| As-Received 1,000 Å SiO2/Si(100) | 5 | 64.6 | 30.4 | 2.125 |
| SC-1 Cleaned, HF-etched 1,000 Å SiO2/Si(100) | 4.4 | 65 | 30.7 | 2.117263844 |

Figure 32:
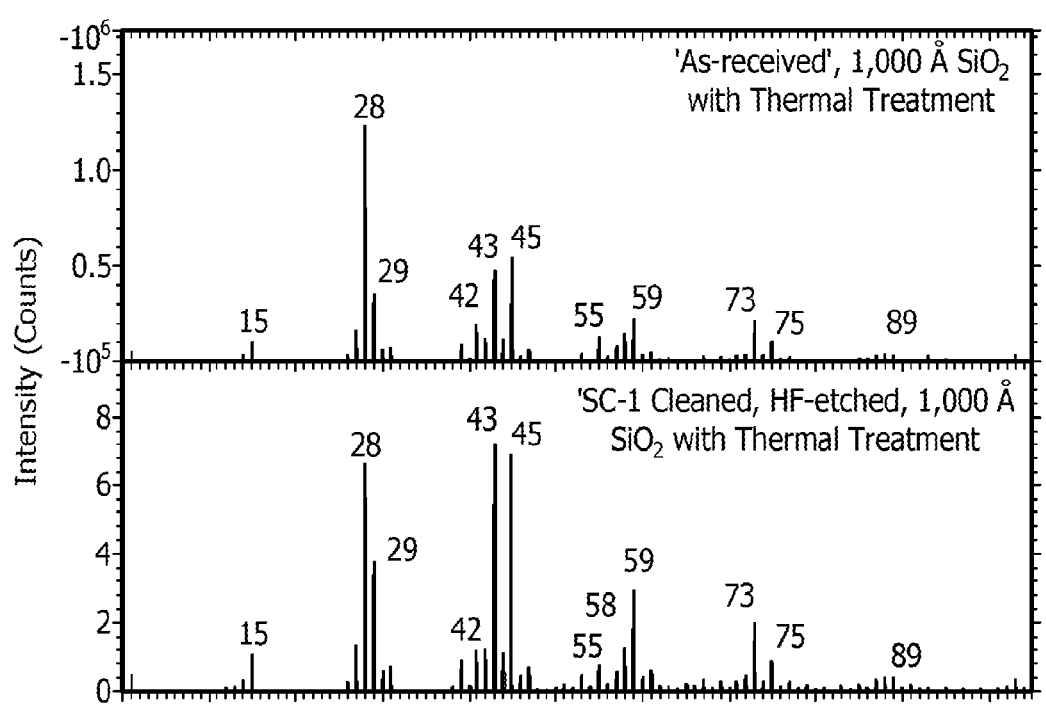
FIG. 32 is a series of TOF-SIMS spectra of a substrate surface as received after a thermal treatment and of a substrate after a wet chemical treatment plus thermal treatment according to an embodiment of the present invention.

Referring to FIG. 32, it is clear from the spectra that there is a much higher surface coverage of passivating species on the "SC-1 cleaned, HF-etched" 1,000 Å $SiO_2$/Si(100) sample relative to the 'as-received' 1,000 Å $SiO_2$ sample. The distributions of positive ions from each sample are consistent with the presence of both bis-dimethylsilylethane and trimethylsilyl passivating species as can be inferred from comparison with the TOF-SIMS spectra for samples that were treated with bis-dimethylsilylethane and trimethylsilyl precursor compounds (Examples 10 and 15).

Normalized ion intensities for positive ions with mass 45 amu, 29 amu, 43 amu, 59 amu and 73 amu for "SC-1 cleaned, HF-etched" 1,000 Å $SiO_2$/Si(100) and 'as-received' 1,000 Å $SiO_2$ samples are presented in the table below.

Example 18: Selective Formation of bis-dimethylsilylethane/trimethylsilyl Surface Passivation on 'SC-1 Cleaned, HF-Etched', 1,000 Å $SiO_2$/Si(100) and not on Si(100) Using $[Cl(CH_3)_2Si]_2(CH_2)_2$ (1,2-bis-chlorodimethylsilylethane) and $(CH_3)_2NSi(CH_3)_3$ (Dimethylaminotrimethylsilane) at 370° C. without Thermal Treatment Processing Several 1.5"×1.5" coupons of a 1,000 Å thermal $SiO_2$/Si(100) ["1,000 Å $SiO_2$"] and Si(100) were cleaved from 4" wafers, blown off with a stream of high purity nitrogen to remove particles and then some of them were then loaded into a Teflon boat suitable for immersion in an SC-1 cleaning bath. The boat and samples were then immersed in an SC-1 cleaning solution (100 ml ultra-high purity $NH_4OH$ (28%-30%); 200 ml ultra-high purity $H_2O_2$ (28-30%); 1000 ml distilled, deionized $H_2O$) that was pre-heated to a temperature of 70+/−5° C. where they were cleaned for 10 minutes. The SC-1 cleaned, 1,000 Å $SiO_2$/Si(100) and Si(100) samples were then removed from the cleaning bath and rinsed of chemicals using three dump rinse cycles of distilled, deionized water. The samples were then dried thoroughly using a source of ultra-high purity $N_2$ gas that was filtered for particles.

The dried SC-1 cleaned samples were then placed into a Teflon boat suitable for immersion in an HF-etch batch. The boat and samples were then immersed in an HF-etch bath (51 ml ultra-high purity HF (48-49%); 1000 ml distilled, deionized $H_2O$) that was at 21+/−2° C. where they were etched for 90 seconds. The 'SC-1 cleaned, HF-etched', 1,000 Å $SiO_2$/Si(100) and Si(100) samples were then removed from the HF solution and quickly immersed in distilled, de-ionized water and then dried thoroughly using a source of ultra-high purity $N_2$ gas that was filtered for particles.

Several of the 'SC-1 cleaned, HF-etched', 1000 Å $SiO_2$ and 'as-received', 1,000 Å $SiO_2$/Si(100) samples were then loaded into the tube of a tube furnace reactor system under a flow of 250 sccm ultra-high purity $N_2$ gas at room temperature with as minimum a delay as possible. The tube was then sealed and slowly evacuated to a pressure of 8060 mTorr. A flow of 20 sccm $N_2$ was then introduced into the reactor tube and a reduced pressure $N_2$ purge was conducted for 2 minutes (at a pressure of 2.3 Torr). The flow of $N_2$ was then stopped and the tube was evacuated to a pressure of ≤5 mTorr. The previously described cycle purging steps were repeated until the base pressure of the system was achieved.

| Sample | Thermal Treatment | mass 45 amu | mass 29 amu | mass 43 amu | mass 59 amu | mass 73 amu |
| --- | --- | --- | --- | --- | --- | --- |
| As-Received 1000 Å SiO2/Si(100) | Yes | 533 | 389 | 895 | 226 | 318 |
| SC-1 Cleaned, HF-etched 1,000 Å SiO2/Si(100) | Yes | 733 | 405.3 | 1000 | 315 | 218 |

After base pressure was achieved, a flow of 20 sccm of ultra-high purity N$_2$ was introduced into the reactor system and a reduced pressure N$_2$ purge (at 2.3 Torr) was conducted for 1 hour to reduce the background moisture concentration in the system prior to initiating the thermal treatment. As known to those skilled in the art, use of a load lock system will enable greatly reduced cycle times while still providing the required system purity for the processes described herein to be operative.

Under a flow of 20 sccm ultra-high purity N$_2$ through the tube at a pressure of 2.5 Torr while the sample temperature was raised to 370° C. The samples were equilibrated at 370° C. for 10 minutes, the N$_2$ flow was terminated and the tube was fully evacuated to a pressure of no more than 1 mTorr. The tube was then charged with a first chemical dose of 1,2-bis-chlorodimethylsilylethane [(Cl(CH$_3$)$_2$Si]$_2$(CH$_2$)$_2$] to a pressure of 0.25 Torr and then isolated at this pressure for 10 minutes. The first chemical dose was then removed from the chamber using a combination of reduced pressure N$_2$ purging and evacuation that encompassed first introducing a dynamic flow of 20 sccm N$_2$ at a pressure of 2.5 Torr for one minute, followed by evacuation of the tube to a pressure not greater than 10 mTorr for two minutes. The second chemical dose of (Cl(CH$_3$)$_2$Si]$_2$(CH$_2$)$_2$ was then introduced in a manner identical to the first dose except that the pressure of the second dose was 0.26 Torr. The second dose was then removed in the same manner as the first chemical dose prior to the introduction of the third chemical dose. The third through twelfth chemical doses of (Cl(CH$_3$)$_2$Si]$_2$(CH$_2$)$_2$ were then introduced in a manner identical to the first and second doses except that the pressure of these doses varied slightly between 0.25 Torr and 0.26 Torr. The third through twelfth doses were then removed in the same manner as the first and second chemical doses. The reactor tube was then evacuated to base pressure over a period of 15 minutes prior to the start of chemical dosing with dimethylaminotrimethylsilane. The tube was then charged with a first chemical dose of dimethylaminotrimethylsilane [(CH$_3$)$_2$NSi(CH$_3$)$_3$] to a pressure of 20.4 Torr and then isolated at this pressure for 10 minutes. The first chemical dose was then removed from the chamber using a combination of reduced pressure N$_2$ purging and evacuation that encompassed first introducing a dynamic flow of 20 sccm N$_2$ at a pressure of 2.5 Torr for one minute, followed by evacuation of the tube to a pressure not greater than 10 mTorr for two minutes. The second chemical dose of (CH$_3$)$_2$NSi(CH$_3$)$_3$ was then introduced in a manner identical to the first dose except that the pressure of the second dose was 20.3 Torr. The second dose was then removed in the same manner as the first chemical dose prior to the introduction of the third chemical dose. The third chemical dose of (CH$_3$)$_2$NSi(CH$_3$)$_3$ was then introduced in a manner identical to the first and second doses except that the pressure of the third dose was 19.8 Torr. The third chemical dose was then removed in the same manner as the first and second chemical doses, completing the selective formation of the trimethylsilyl surface passivation on the 'SC-1 cleaned, HF-etched', 1,000 Å SiO$_2$ samples and 'as-received' 1,000 Å SiO$_2$ samples.

After the selective passivation formation was completed, the 'SC-1 cleaned, HF-etched' 1,000 Å SiO$_2$ and 'as-received' 1,000 Å SiO$_2$ samples were cooled to room temperature under a flow of 20 sccm ultra-high purity N$_2$ at a pressure of 2.3 Torr. The samples were then unloaded under a flow of 500 sccm N$_2$, quickly enclosed in a container and then stored under N$_2$ for shipment to the vendor for analytical characterization of their properties.

The 'SC-1 cleaned, HF-etched' 1,000 Å SiO$_2$ and 'as-received' 1,000 Å SiO$_2$ samples were characterized using water contact angle measurements, Atomic Force Microscopy (AFM) and Time-of-Flight Secondary Ion Mass Spectrometry (TOF-SIMS). The results of these analyses are presented in the table below and FIG. 33.

| Contact Angle Measurements and Surface Roughness Measurements | | | |
| --- | --- | --- | --- |
| Sample | Thermal Treatment | Water Contact Angle (Degrees) | Surface Roughness (nm) |
| As-Received 1,000 Å SiO2/Si(100) | Yes | 95 | 0.23 |
| SC-1 Cleaned, HF-etched 1,000 Å SiO2/Si(100) | Yes | 99.6 | 0.32 |

The samples were also analyzed by X-Ray Photoelectron Spectroscopy (XPS) and the results are presented in the table below.

| Sample | Carbon (atomic %) | Oxygen (atomic %) | Silicon (atomic %) | O/Si Ratio |
| --- | --- | --- | --- | --- |
| As-Received 1,000 Å SiO2/Si(100) | 4.8 | 64.9 | 30.4 | 2.134868421 |
| SC-1 Cleaned, HF-etched 1,000 Å SiO2/Si(100) | 4.5 | 65 | 30.5 | 2.131147541 |

Figure 33:
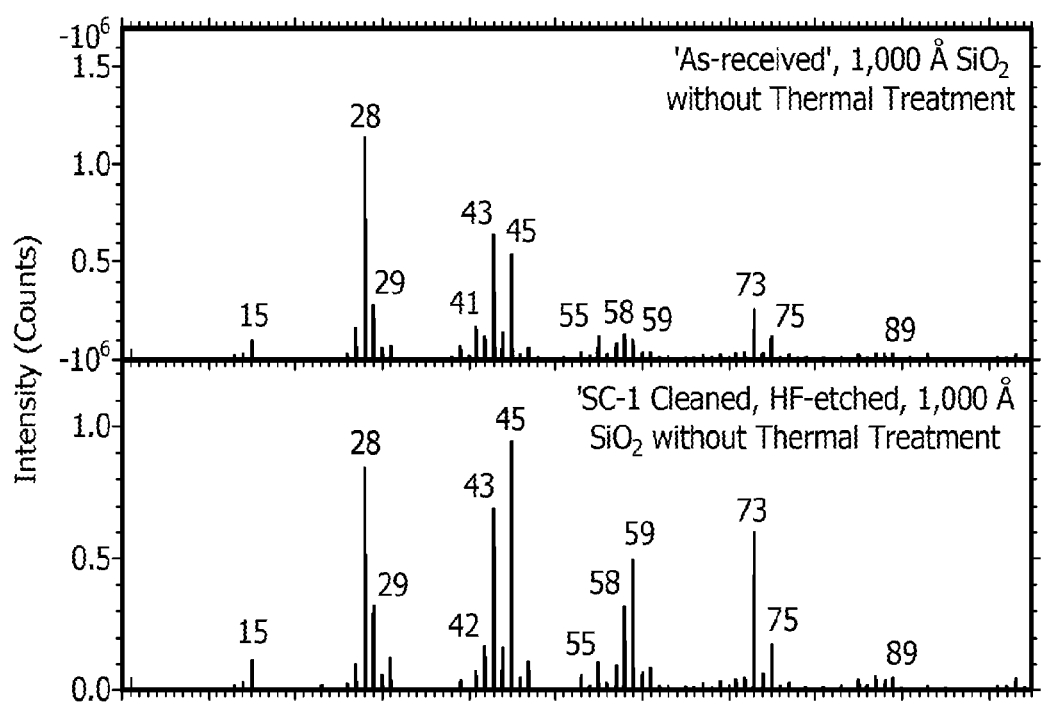
FIG. 33 is a series of TOF-SIMS spectra of a substrate surface as received without a thermal treatment and of a substrate after a wet chemical treatment also without thermal treatment according to an embodiment of the present invention.

Referring to FIG. 33, it is clear from the spectra that there is a much higher surface coverage of passivating species on the "SC-1 cleaned, HF-etched" 1,000 Å SiO$_2$/(100) sample relative to the 'as-received' 1,000 Å SiO$_2$ sample. The distributions of positive ions from each sample are consistent with the presence of both bis-dimethylsilylethane and trimethylsilyl passivating species as can be inferred from comparison with the TOF-SIMS spectra for samples that were treated with bis-dimethylsilylethane and trimethylsilyl precursor compounds (Examples 10-15).

Normalized ion intensities for positive ions with mass 45 amu, 29 amu, 43 amu, 59 amu and 73 amu or "SC-1 cleaned, HF-etched" 1,000 Å SiO$_2$/Si(100) and 'as-received' 1,000 Å SiO$_2$ samples are presented in the table below.

| Sample | Thermal Treatment | mass 45 amu | mass 29 amu | mass 43 amu | mass 59 amu | mass 73 amu |
|---|---|---|---|---|---|---|
| As-Received 1,000 Å SiO2/Si(100) | No | 554 | 379 | 961 | 262 | 371 |
| SC-1 Cleaned, HF-etched 1,000 Å SiO2/Si(100) | No | 615 | 412 | 1233 | 467 | 697 |

Example 19: Selective Formation of tri-n-propylsilyl Surface Passivation on 'SC-1 Cleaned, HF-Etched', 1,000 Å $SiO_2$/Si(100), "as-Received" 1,000 Å $SiO_2$/Si(100) and not on Si(100) Using $(CH_3)_2NSi(CH_2CH_2CH_3)_3$ (dimethylaminotri-n-propylsilane) at 270° C. with Thermal Treatment Processing The "SC-1 cleaned, HF-etched" 1,000 Å $SiO_2$ samples were subjected to the same processes as described for the samples in Example 12 prior to the formation of the passivation layer. A tri-n-propylsilyl passivation layer was then selectively formed on the "SC-1 cleaned, HF-etched" 1,000 Å $SiO_2$ samples, but not on the "SC-1 cleaned, HF-etched" Si(100) samples using the following process.

After the thermal treatment was completed, a flow of 20 sccm ultra-high purity $N_2$ was maintained through the tube at a pressure of 2.5 Torr while the sample temperature was reduced to 270° C. The samples were equilibrated at 270° C. for 10 minutes, the $N_2$ flow was terminated and the tube was fully evacuated to a pressure of no more than 1 mTorr. The tube was then charged with a first chemical dose of dimethylamino(tri-n-propyl) silane $(CH_3CH_2CH_2)_3SiN(CH_3)_2$ to a pressure of 0.089 Torr and then isolated at this pressure for 10 minutes. The first chemical dose was then removed from the chamber using a combination of reduced pressure $N_2$ purging and evacuation that encompassed first introducing a dynamic flow of 20 sccm $N_2$ at a pressure of 2.5 Torr for one minute, followed by evacuation of the tube to a pressure not greater than 10 mTorr for two minutes. The second chemical dose of $(CH_3CH_2CH_2)_3SiN(CH_3)_2$ was then introduced in a manner identical to the first dose except that the pressure of the second dose was 0.073 Torr. The second dose was then removed in the same manner as the first chemical dose prior to the introduction of the third chemical dose. The third through eleventh chemical doses of $(CH_3CH_2CH_2)_3SiN(CH_3)_2$ were then introduced in a manner identical to the first and second doses except that the pressure of these doses varied slightly between 0.070 Torr and 0.090 Torr. The third through eleventh doses were then removed in the same manner as the first and second chemical doses, completing the selective formation of the tri-n-propylsilyl surface passivation on the 'SC-1 cleaned, HF-etched', 1,000 Å $SiO_2$ samples and 'as-received' 1,000 Å $SiO_2$ samples.

After the selective passivation formation was completed, the 'SC-1 cleaned, HF-etched' 1,000 Å $SiO_2$ and 'as-received' 1,000 Å $SiO_2$ samples were cooled to room temperature under a flow of 20 sccm ultra-high purity $N_2$ at a pressure of 2.3 Torr. The samples were then unloaded under a flow of 500 sccm $N_2$, quickly enclosed in a container and then stored under $N_2$ for shipment to the vendor for analytical characterization of their properties.

The 'SC-1 cleaned, HF-etched' 1,000 Å $SiO_2$ and 'as-received' 1,000 Å $SiO_2$ samples were characterized using water contact angle measurements, Atomic Force Microscopy (AFM) and Time-of-Flight Secondary Ion Mass Spectrometry (TOF-SIMS). The results of these analyses are presented in the table below and FIG. 34:

| | Contact Angle Measurements and Surface Roughness Measurements | | |
|---|---|---|---|
| Sample | Thermal Treatment | Water Contact Angle (Degrees) | Surface Roughness (nm) |
| As-Received 1,000 Å SiO2/Si(100) | Yes | 98.9 | 0.22 |
| SC-1 Cleaned, HF-etched 1,000 Å SiO2/Si(100) | Yes | 95.4 | 0.29 |

The samples were also analyzed by X-Ray Photoelectron Spectroscopy (XPS) and the results are presented in the table below:

| Sample | Carbon (atomic %) | Oxygen (atomic %) | Silicon (atomic %) | O/Si Ratio |
|---|---|---|---|---|
| As-Received 1,000 Å SiO2/Si(100) | 4.8 | 65.3 | 30.5 | 2.140983607 |
| SC-1 Cleaned, HF-etched 1,000 Å SiO2/Si(100) | 4.2 | 65.1 | 30.5 | 2.13442623 |

Figure 34:
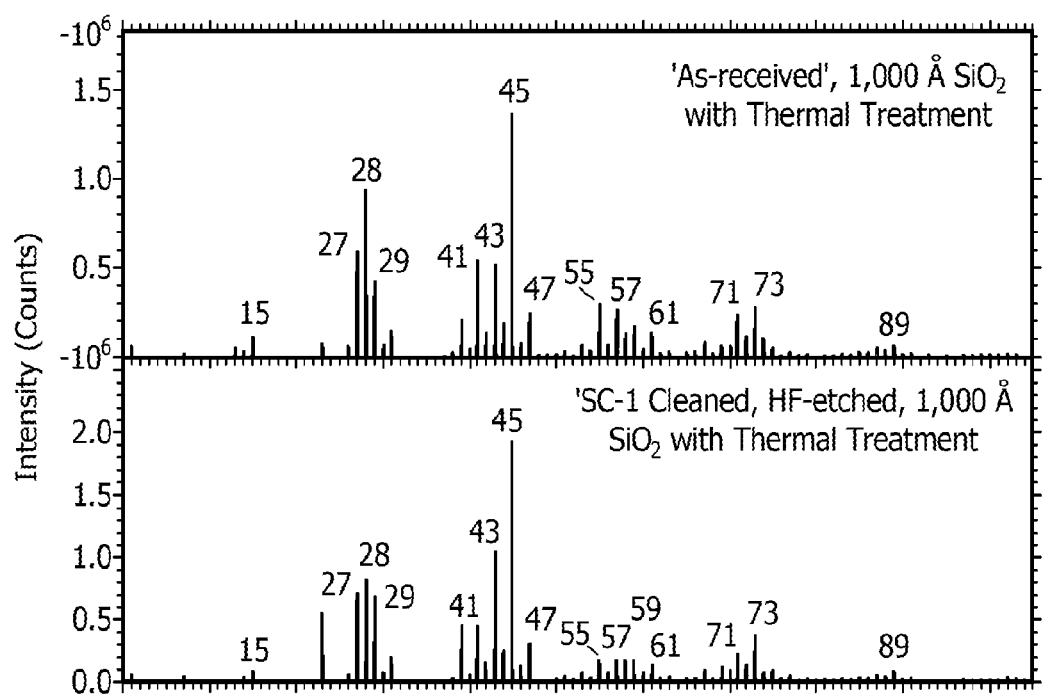
FIG. 34 is a series of TOF-SIMS spectra of a substrate surface as received with a thermal treatment and of a substrate after a wet chemical treatment also with thermal treatment according to an embodiment of the present invention.

The TOF-SIMS spectra for the 'SC-1 cleaned, HF-etched' 1,000 Å $SiO_2$ and the 'as-received' 1,000 Å $SiO_2$ samples are shown in FIG. 34. It is clear from the spectra that there is a much higher surface coverage of passivating species on the "SC-1 cleaned, HF-etched" 1,000 Å $SiO_2/Si(100)$ sample relative to the 'as-received' 1,000 Å $SiO_2$ sample.

Normalized ion intensities for positive ions with mass 45 amu, 29 amu, 43 amu, 59 amu and 73 amu for "SC-1 cleaned, HF-etched" 1,000 Å $SiO_2/Si(100)$ and 'as-received' 1,000 Å $SiO_2$ samples are presented in the table below.

| Sample | Thermal Treatment | mass 45 amu | mass 29 amu | mass 43 amu | mass 59 amu | mass 73 amu |
|---|---|---|---|---|---|---|
| As-Received 1,000 Å SiO2/Si(100) | Yes | 489 | 325 | 502 | 115 | 202.3 |
| SC-1 Cleaned, HF-etched 1,000 Å SiO2/Si(100) | Yes | 489 | 243 | 482 | 155 | 254 |

Example 20: Selective Formation of tri-n-propylsilyl Surface Passivation on 'SC-1 Cleaned, HF-Etched', 1,000 Å $SiO_2/Si(100)$, "as-Received" 1,000 Å $SiO_2/Si(100)$ and not on Si(100) Using $(CH_3)_2NSi(CH_2CH_2CH_3)_3$ (dimethylaminotri-n-propylsilane) at 270° C. without Thermal Treatment Processing The "SC-1 cleaned, HF-etched" 1,000 Å $SiO_2$ samples were subjected to the same processes as described for the samples in Example 13 prior to the formation of the passivation layer. A tri-n-propylsilyl passivation layer was then selectively formed on the "SC-1 cleaned, HF-etched" 1,000 Å $SiO_2$ samples, but not on the "SC-1 cleaned, HF-etched" Si(100) samples using the following process.

Several of the 'SC-1 cleaned, HF-etched', 1000 Å $SiO_2$ and 'as-received', 1,000 Å $SiO_2/Si(100)$ samples were then loaded into the tube of a tube furnace reactor system under a flow of 250 sccm ultra-high purity $N_2$ gas at room temperature with as minimum a delay as possible. The tube was then sealed and slowly evacuated to a pressure of 60 mTorr. A flow of 20 sccm $N_2$ was then introduced into the reactor tube and a reduced pressure $N_2$ purge was conducted for 2 minutes (at a pressure of 2.3 Torr). The flow of $N_2$ was then stopped and the tube was evacuated to a pressure of ≤5 mTorr. The previously described cycle purging steps were repeated until the base pressure of the system was achieved.

After base pressure was achieved, a flow of 20 sccm of ultra-high purity $N_2$ was introduced into the reactor system and a reduced pressure $N_2$ purge (at 2.3 Torr) was conducted for 1 hour to reduce the background moisture concentration in the system prior to initiating the thermal treatment. As known to those skilled in the art, use of a load lock system will enable greatly reduced cycle times while still providing the required system purity for the processes described herein to be operative.

Under a flow of 20 sccm ultra-high purity $N_2$ through the tube at a pressure of 2.5 Torr while the sample temperature was raised to 270° C. The samples were equilibrated at 270° C. for 10 minutes, the $N_2$ flow was terminated and the tube was fully evacuated to a pressure of no more than 1 mTorr. The tube was then charged with a first chemical dose of dimethylamino(tri-n-propyl) silane $(CH_3CH_2CH_2)_3SiN(CH_3)_2$ to a pressure of 0.085 Torr and then isolated at this pressure for 10 minutes. The first chemical dose was then removed from the chamber using a combination of reduced pressure $N_2$ purging and evacuation that encompassed first introducing a dynamic flow of 20 sccm $N_2$ at a pressure of 2.5 Torr for one minute, followed by evacuation of the tube to a pressure not greater than 10 mTorr for two minutes. The second chemical dose of $(CH_3CH_2CH_2)_3SiN(CH_3)_2$ was then introduced in a manner identical to the first dose except that the pressure of the second dose was 0.079 Torr. The second dose was then removed in the same manner as the first chemical dose prior to the introduction of the third chemical dose. The third through eleventh chemical doses of $(CH_3CH_2CH_2)_3SiN(CH_3)_2$ were then introduced in a manner identical to the first and second doses except that the pressure of these doses varied slightly between 0.081 Torr and 0.084 Torr. The third through eleventh doses were then removed in the same manner as the first and second chemical doses, completing the selective formation of the tri-n-propylsilyl surface passivation on the 'SC-1 cleaned, HF-etched', 1,000 Å $SiO_2$ samples and 'as-received' 1,000 Å $SiO_2$ samples.

After the selective passivation formation was completed, the 'SC-1 cleaned, HF-etched' 1,000 Å $SiO_2$ and 'as-received' 1,000 Å $SiO_2$ samples were cooled to room temperature under a flow of 20 sccm ultra-high purity $N_2$ at a pressure of 2.3 Torr. The samples were then unloaded under a flow of 500 sccm $N_2$, quickly enclosed in a container and then stored under $N_2$ for shipment to the vendor for analytical characterization of their properties.

The 'SC-1 cleaned, HF-etched' 1,000 Å $SiO_2$ and 'as-received' 1,000 Å $SiO_2$ samples were characterized using water contact angle measurements, Atomic Force Microscopy (AFM) and Time-of-Flight Secondary Ion Mass Spectrometry (TOF-SIMS). The results of these analyses are presented in the tables below:

| Contact Angle Measurements and Surface Roughness Measurements | | | |
|---|---|---|---|
| Sample | Thermal Treatment | Water Contact Angle (Degrees) | Surface Roughness (nm) |
| As-Received 1,000 Å SiO2/Si(100) | No | 101.5 | 0.18 |
| SC-1 Cleaned, HF-etched 1,000 Å SiO2/Si(100) | No | 94.5 | 0.29 |

The samples were also analyzed by X-Ray Photoelectron Spectroscopy (XPS) and the results are presented in the table below.

| Sample | Carbon (atomic %) | Oxygen (atomic %) | Silicon (atomic %) | O/Si Ratio |
|---|---|---|---|---|
| As-Received 1,000 Å SiO2/Si(100) | 4.1 | 65.5 | 30.4 | 2.154605263 |
| SC-1 Cleaned, HF-etched 1,000 Å SiO2/Si(100) | 3.3 | 66.5 | 30.1 | 2.209302326 |

Figure 35:
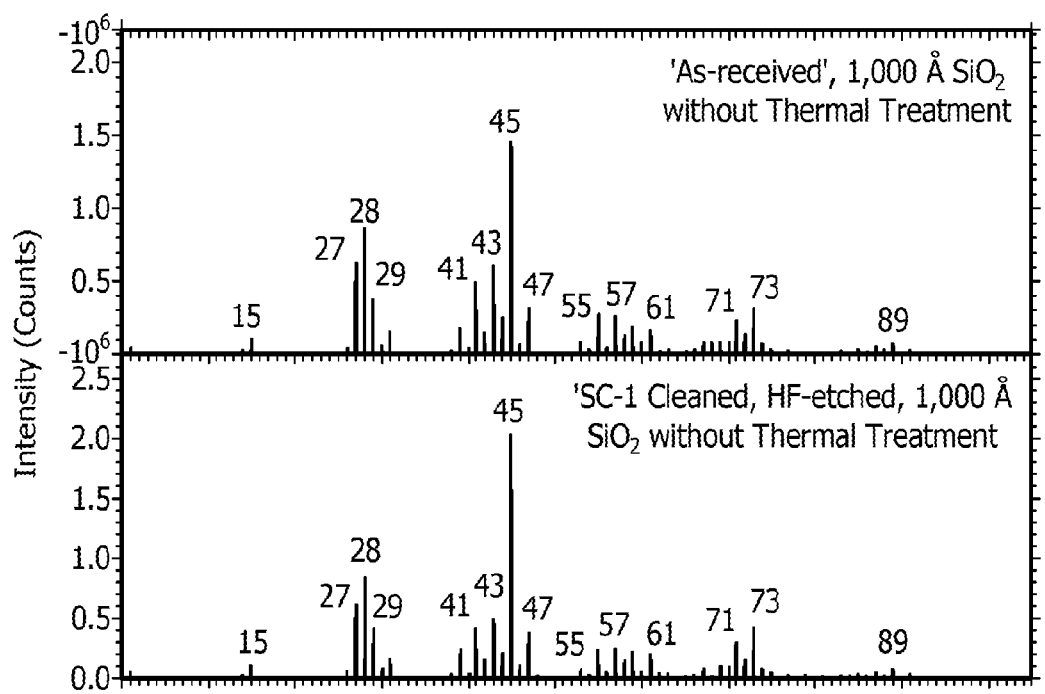
FIG. 35 is a series of TOF-SIMS spectra of a substrate surface as received without a thermal treatment and of a substrate after a wet chemical treatment also without thermal treatment according to an embodiment of the present invention.

The TOF-SIMS spectra for the 'SC-1 cleaned, HF-etched' 1,000 Å SiO$_2$ and the 'as-received' 1,000 Å SiO$_2$ samples are shown in FIG. 35. It is clear from the spectra in FIG. 35 that there is a much higher surface coverage of passivating species on the "SC-1 cleaned, HF-etched" 1,000 Å SiO$_2$ woo) sample relative to the 'as-received' 1,000 Å SiO$_2$ sample.

Normalized ion intensities for positive ions with mass 45 amu, 29 amu, 43 amu, 59 amu and 73 amu or "SC-1 cleaned, HF-etched" 1,000 Å SiO$_2$/Si(100) and 'as-received' 1,000 Å SiO$_2$ samples are presented in the table below.

| Sample | Thermal Treatment | mass 45 amu | mass 29 amu | mass 43 amu | mass 59 amu | mass 73 amu |
|---|---|---|---|---|---|---|
| As-Received 1,000 Å SiO2/Si(100) | No | 554 | 355 | 564 | 133.3 | 241.7 |
| SC-1 Cleaned, HF-etched 1,000 Å SiO2/Si(100) | No | 727 | 349 | 610 | 150.3 | 307 |

Example 21 (Comparative): Formation of tri-n-propylsilyl Surface Passivation on 'SC-1 Cleaned', 1,000 Å SiO$_2$/Si(100) and "as-Received" 1,000 Å SiO$_2$/Si(100) Using ClSi(CH$_2$CH$_2$CH$_3$)$_3$ (tri-n-propyl chlorosilane) at 445° C.

The "SC-1 cleaned" 1,000 Å SiO$_2$ samples were subjected to the "SC-1" cleaning process previously described prior to the formation of the passivation layer. A tri-n-propylsilyl passivation layer was then selectively formed on the "SC-1 cleaned" 1,000 Å SiO$_2$ samples and the "as-received" 1,000 Å SiO$_2$/Si(100) samples using the following process. The 'as-received' samples were not cleaned.

Several of the 'SC-1 cleaned', 1000 Å SiO$_2$ and 'as-received', 1,000 Å SiO$_2$/Si(100) samples were then loaded into the tube of a tube furnace reactor system under a flow of 250 sccm ultra-high purity N$_2$ gas at room temperature with as minimum a delay as possible. The tube was then sealed and slowly evacuated to a pressure of 30 mTorr. A flow of 20 sccm N$_2$ was then introduced into the reactor tube and a reduced pressure N$_2$ purge was conducted for 2 minutes (at a pressure of 2.3 Torr). The flow of N$_2$ was then stopped and the tube was evacuated to a pressure of ≤5 mTorr. The previously described cycle purging steps were repeated until the base pressure of the system was achieved.

After base pressure was achieved, a flow of 20 sccm of ultra-high purity N$_2$ was introduced into the reactor system and a reduced pressure N$_2$ purge (at 2.3 Torr) was conducted for 1 hour to reduce the background moisture concentration in the system prior to initiating the thermal treatment. As known to those skilled in the art, use of a load lock system will enable greatly reduced cycle times while still providing the required system purity for the processes described herein to be operative.

Under a flow of 20 sccm ultra-high purity N$_2$ through the tube at a pressure of 2.5 Torr while the sample temperature was raised to 445° C. The samples were equilibrated at 445° C. for 10 minutes, the N$_2$ flow was terminated and the tube was fully evacuated to a pressure of no more than 1 mTorr. The tube was then charged with a first chemical dose of tri-n-propyl chlorosilane (CH$_3$CH$_2$CH$_2$)$_3$SiCl to a pressure of 0.296 Torr and then isolated at this pressure for 6 minutes. The first chemical dose was then removed from the chamber using a combination of reduced pressure N$_2$ purging and evacuation that encompassed first introducing a dynamic flow of 20 sccm N$_2$ at a pressure of 2.5 Torr for one minute, followed by evacuation of the tube to a pressure not greater than 10 mTorr for one minute. The second chemical dose of (CH$_3$CH$_2$CH$_2$)$_3$SiCl was then introduced in a manner identical to the first dose except that the pressure of the second dose was 0.320 Torr. The second dose was then removed in the same manner as the first chemical dose prior to the introduction of the third chemical dose. The third through tenth chemical doses of (CH$_3$CH$_2$CH$_2$)$_3$SiCl were then introduced in a manner identical to the first and second doses except that the pressure of these doses varied slightly between 0.300 Torr and 0.350 Torr. The third through eleventh doses were then removed in the same manner as the first and second chemical doses, completing the selective formation of the tri-n-propylsilyl surface passivation on the 'SC-1 cleaned', 1,000 Å SiO$_2$ samples and 'as-received' 1,000 Å SiO$_2$ samples.

After the selective passivation formation was completed, the 'SC-1 cleaned, HF-etched' 1,000 Å SiO$_2$ and 'as-received' 1,000 Å SiO$_2$ samples were cooled to room temperature under a flow of 20 sccm ultra-high purity N$_2$ at a pressure of 2.3 Torr. The samples were then unloaded under a flow of 500 sccm N$_2$, quickly enclosed in a container and then stored under N$_2$.

The 'SC-1 cleaned' 1,000 Å SiO$_2$ and 'as-received' 1,000 Å SiO$_2$ samples were characterized using water contact angle measurements. The results of these analyses are presented in the table below.

| Water Contact Angle Measurements | | |
|---|---|---|
| Sample | Thermal Treatment | Water Contact Angle (Degrees) |
| As-Received 1,000 Å SiO2/Si(100) | No | 72.6 |
| SC-1 Cleaned 1,000 Å SiO2/Si(100) | No | 76.6 |

Example 22 (Comparative): Formation of Trimethylsilyl Surface Passivation on 'SC-1 Cleaned', 1,000 Å SiO$_2$/Si(100) and "as-Received" 1,000 Å SiO$_2$/Si(100) Using BrSi(CH$_3$)$_3$ (Trimethylbromosilane) at 220° C.

The "SC-1 cleaned" 1,000 Å SiO$_2$ samples were subjected to the "SC-1" cleaning process previously described prior to the formation of the passivation layer. A trimethylsilyl passivation layer was then selectively formed on the "SC-1 cleaned" 1,000 Å SiO$_2$ samples and the "as-received" 1,000 Å SiO$_2$ samples using the following process. The 'as-received' samples were not cleaned.

Several of the 'SC-1 cleaned', 1000 Å SiO$_2$ and 'as-received', 1,000 Å SiO$_2$/(100) samples were loaded into the tube of a tube furnace reactor system under a flow of 250 sccm ultra-high purity N$_2$ gas at room temperature with as minimum a delay as possible. The tube was then sealed and slowly evacuated to a pressure of 40 mTorr. A flow of 20 sccm N$_2$ was then introduced into the reactor tube and a reduced pressure N$_2$ purge was conducted for 2 minutes (at a pressure of 2.3 Torr). The flow of N$_2$ was then stopped and the tube was evacuated to a pressure of ≤5 mTorr. The previously described cycle purging steps were repeated until the base pressure of the system was achieved.

After base pressure was achieved, a flow of 20 sccm of ultra-high purity N$_2$ was introduced into the reactor system and a reduced pressure N$_2$ purge (at 2.3 Torr) was conducted for 1 hour to reduce the background moisture concentration in the system prior to initiating the thermal treatment. As known to those skilled in the art, use of a load lock system will enable greatly reduced cycle times while still providing the required system purity for the processes described herein to be operative.

Under a flow of 20 sccm ultra-high purity N$_2$ through the tube at a pressure of 2.5 Torr while the sample temperature was raised to 220° C. The samples were equilibrated at 220° C. for 10 minutes, the N$_2$ flow was terminated and the tube was fully evacuated to a pressure of no more than 1 mTorr. The tube was then charged with a first chemical dose of trimethylbromosilane (CH$_3$)$_3$SiBr to a pressure of 20.5 Torr and then isolated at this pressure for 10 minutes. The first chemical dose was then removed from the chamber using a combination of reduced pressure N$_2$ purging and evacuation that encompassed first introducing a dynamic flow of 20 sccm N$_2$ at a pressure of 2.5 Torr for one minute, followed by evacuation of the tube to a pressure not greater than 10 mTorr for one minute. The second chemical dose of (CH$_3$)$_3$SiBr was then introduced in a manner identical to the first dose except that the pressure of the second dose was 20.5 Torr. The second dose was then removed in the same manner as the first chemical dose prior to the introduction of the third chemical dose. The third dose of (CH$_3$)$_3$SiBr were then introduced in a manner identical to the first and second doses except that the pressure of this dose was 19.5 Torr. The third dose was then removed in the same manner as the first and second chemical doses, completing the selective formation of the trimethylsilyl surface passivation on the 'SC-1 cleaned', 1,000 Å SiO$_2$ samples and 'as-received' 1,000 Å SiO$_2$ samples.

After the selective passivation formation was completed, the 'SC-1 cleaned, HF-etched' 1,000 Å SiO$_2$ and 'as-received' 1,000 Å SiO$_2$ samples were cooled to room temperature under a flow of 20 sccm ultra-high purity N$_2$ at a pressure of 2.3 Torr. The samples were then unloaded under a flow of 500 sccm N$_2$, quickly enclosed in a container and then stored under N$_2$.

The 'SC-1 cleaned' 1,000 Å SiO$_2$ and 'as-received' 1,000 Å SiO$_2$ samples were characterized using water contact angle measurements. The results of these analyses are presented in the table below.

| Water Contact Angle Measurements | | |
| --- | --- | --- |
| Sample | Thermal Treatment | Water Contact Angle (Degrees) |
| As-Received 1,000 Å SiO2/Si(100) | No | 46.5 |
| SC-1 Cleaned 1,000 Å SiO2/Si(100) | No | 75.9 |

Example 23 (Comparative): Formation of Trimethylsilyl Surface Passivation on 'SC-1 Cleaned', 1,000 Å SiO$_2$/Si(100) and "as-Received" 1,000 Å SiO$_2$/Si(100) Using ClSi(CH$_3$)$_3$ (Trimethylchlorosilane) at 405° C.

The "SC-1 cleaned" 1,000 Å SiO$_2$ samples were subjected to the "SC-1" cleaning process previously described prior to the formation of the passivation layer. A trimethylsilyl passivation layer was then selectively formed on the "SC-1 cleaned" 1,000 Å SiO$_2$ samples and the "as-received" 1,000 Å SiO$_2$ samples using the following process. The 'as-received' samples were not cleaned.

Several of the 'SC-1 cleaned', 1000 Å SiO$_2$ and 'as-received', 1,000 Å SiO$_2$/(100) samples were loaded into the tube of a tube furnace reactor system under a flow of 250 sccm ultra-high purity N$_2$ gas at room temperature with as minimum a delay as possible. The tube was then sealed and slowly evacuated to a pressure of 40 mTorr. A flow of 20 sccm N$_2$ was then introduced into the reactor tube and a reduced pressure N$_2$ purge was conducted for 2 minutes (at a pressure of 2.3 Torr). The flow of N$_2$ was then stopped and the tube was evacuated to a pressure of ≤5 mTorr. The previously described cycle purging steps were repeated until the base pressure of the system was achieved.

After base pressure was achieved, a flow of 20 sccm of ultra-high purity N$_2$ was introduced into the reactor system and a reduced pressure N$_2$ purge (at 2.3 Torr) was conducted for 1 hour to reduce the background moisture concentration in the system prior to initiating the thermal treatment. As known to those skilled in the art, use of a load lock system will enable greatly reduced cycle times while still providing the required system purity for the processes described herein to be operative.

Under a flow of 20 sccm ultra-high purity N$_2$ through the tube at a pressure of 2.5 Torr while the sample temperature was raised to 405° C. The samples were equilibrated at 405° C. for 10 minutes, the N$_2$ flow was terminated and the tube was fully evacuated to a pressure of no more than 1 mTorr. The tube was then charged with a first chemical dose of trimethylchlorosilane (CH$_3$)$_3$SiCl to a pressure of 3.35 Torr and then isolated at this pressure for 5 minutes. The first chemical dose was then removed from the chamber using a combination of reduced pressure N$_2$ purging and evacuation that encompassed first introducing a dynamic flow of 20 sccm N$_2$ at a pressure of 2.5 Torr for one minute, followed by evacuation of the tube to a pressure not greater than 10 mTorr for one minute. The second chemical dose of (CH$_3$)$_3$SiCl was then introduced in a manner identical to the first dose except that the pressure of the second dose was 24.7

Torr. The second dose was then removed in the same manner as the first chemical dose prior to the introduction of the third chemical dose. The third dose of $(CH_3)_3SiBr$ were then introduced in a manner identical to the first and second doses except that the pressure of this dose was 1.9 Torr and the exposure time was 10 minutes. The third dose was then removed in the same manner as the first and second chemical doses, completing the selective formation of the trimethylsilyl surface passivation on the 'SC-1 cleaned', 1,000 Å $SiO_2$ samples and 'as-received' 1,000 Å $SiO_2$ samples.

After the selective passivation formation was completed, the 'SC-1 cleaned, HF-etched' 1,000 Å $SiO_2$ and 'as-received' 1,000 Å $SiO_2$ samples were cooled to room temperature under a flow of 20 sccm ultra-high purity $N_2$ at a pressure of 2.3 Torr. The samples were then unloaded under a flow of 500 sccm $N_2$, quickly enclosed in a container and then stored under $N_2$.

The 'SC-1 cleaned' 1,000 Å $SiO_2$ and 'as-received' 1,000 Å $SiO_2$ samples were characterized using water contact angle measurements. The results of these analyses are presented in the table below.

Water Contact Angle Measurements

| Sample | Thermal Treatment | Water Contact Angle (Degrees) |
|---|---|---|
| SC-1 Cleaned, 1,000 Å SiO2/Si(100) | No | 65.2 |

Example 24: Formation of Trimethylsilyl Surface Passivation on 'SC-1 Cleaned", 1,000 Å $SiO_2$/Si(100) and "as-Received", 1,000 Å $SiO_2$/Si(100) Using $ISi(CH_3)_3$ (Iodotrimethylsilane) at 370° C. with Thermal Treatment Processing Several 1.5"×1.5" coupons of a 1,000 Å thermal $SiO_2$/Si(100) ["1,000 Å $SiO_2$") were cleaved from 4" wafers, blown off with a stream of high purity nitrogen to remove particles and then loaded into a Teflon boat suitable for immersion in an SC-1 cleaning bath. The boat and samples were then immersed in an SC-1 cleaning solution (100 ml ultra-high purity $NH_4OH$ (28%-30%); 200 ml ultra-high purity $H_2O_2$ (28-30%); 1000 ml distilled, deionized $H_2O$) that was pre-heated to a temperature of 70+/−5° C. where they were cleaned for 10 minutes. The SC-1 cleaned, 1,000 Å $SiO_2$/Si(100) and Si(100) samples were then removed from the cleaning bath and rinsed of chemicals using three dump rinse cycles of distilled, deionized water. The samples were then dried thoroughly using a source of ultra-high purity $N_2$ gas that was filtered for particles.

Several of the 'SC-1 cleaned', 1000 Å $SiO_2$ and "as-received", 1,000 Å $SiO_2$/Si(100) samples were then loaded into the tube of a tube furnace reactor system under a flow of 250 sccm ultra-high purity $N_2$ gas at room temperature with as minimum a delay as possible. The tube was then sealed and slowly evacuated to a pressure of 80 mTorr. A flow of 20 sccm $N_2$ was then introduced into the reactor tube and a reduced pressure $N_2$ purge was conducted for 2 minutes (at a pressure of 2.3 Torr). The flow of $N_2$ was then stopped and the tube was evacuated to a pressure of ≤5 mTorr. The previously described cycle purging steps were repeated until the base pressure of the system was achieved.

After base pressure was achieved, a flow of 20 sccm of ultra-high purity $N_2$ was introduced into the reactor system and a reduced pressure $N_2$ purge (at 2.3 Torr) was conducted for 1 hour to reduce the background moisture concentration in the system prior to initiating the thermal treatment. As known to those skilled in the art, use of a load lock system will enable greatly reduced cycle times while still providing the required system purity for the processes described herein to be operative.

Figure 36:
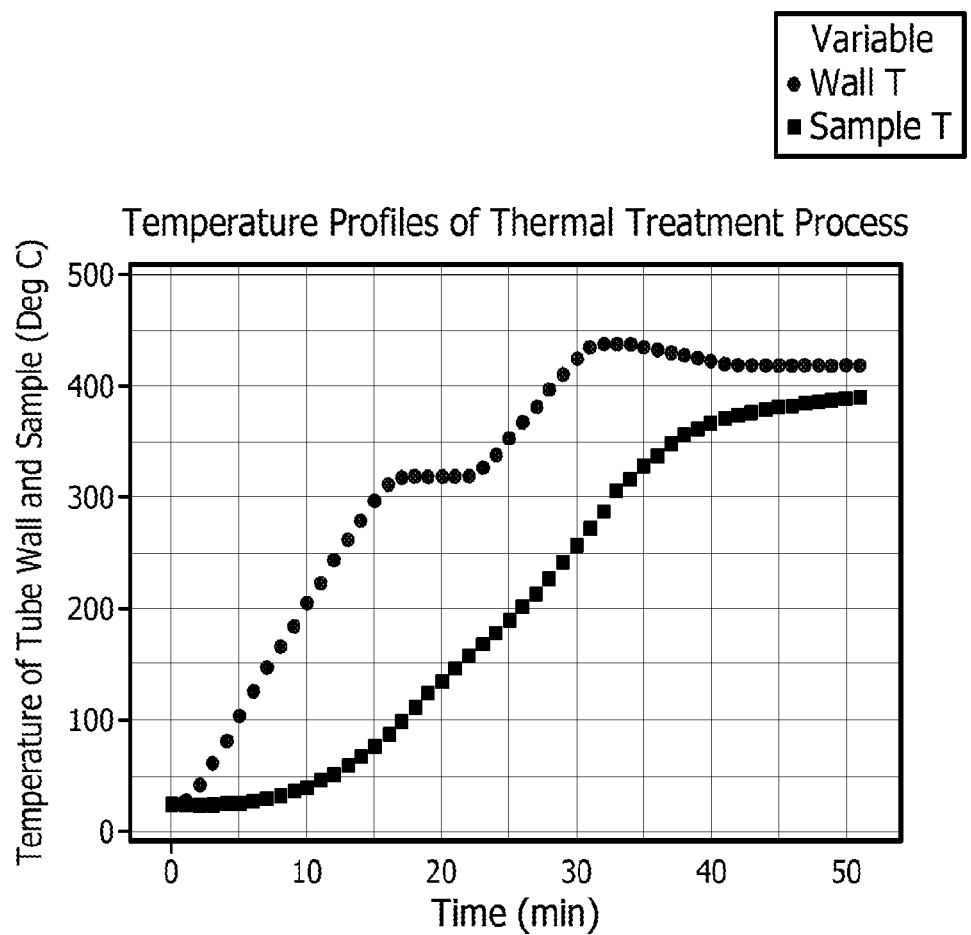
FIG. 36 is a graph illustrating the temperature profile verus time for a thermal treatment step according to an embodiment of the present invention.

The thermal treatment was then performed under a reduced pressure purge of ultra-high purity $N_2$ gas (at 2.3 Torr) using the pre-programmed heating process recipe stored on the temperature controller for the furnace. The heat traces of two independent thermocouples (one representing the external tube temperature—'wall' and one representing the sample temperature) are shown in FIG. 36.

After the thermal treatment was completed, a flow of 20 sccm ultra-high purity $N_2$ was maintained through the tube at a pressure of 2.5 Torr while the sample temperature was reduced to 370° C. The samples were equilibrated at 370° C. for 10 minutes, the $N_2$ flow was terminated and the tube was fully evacuated to a pressure of about 1 mTorr. The tube was then charged with a first chemical dose of iodotrimethylsilane $[ISi(CH_3)_3]$ to a pressure of 20.1 Torr and then isolated at this pressure for 20 minutes. The first chemical dose was then removed from the chamber using a combination of reduced pressure $N_2$ purging and evacuation that encompassed first introducing a dynamic flow of 20 sccm $N_2$ at a pressure of 2.5 Torr for one minute, followed by evacuation of the tube to a pressure not greater than 10 mTorr for one minute. The second chemical dose of $[ISi(CH_3)_3]$ was then introduced in a manner identical to the first dose except that the pressure of the second dose was 19.8 Torr. The second dose was then removed in the same manner as the first chemical dose prior to the introduction of the third chemical dose. The third chemical dose of $[ISi(CH_3)_3]$ was then introduced in a manner identical to the first and second doses except that the pressure of the third dose was 20.2 Torr. The third chemical dose was then removed in the same manner as the first and second chemical doses, completing the selective formation of the trimethylsilyl surface passivation on the 'SC-1 cleaned', 1,000 Å $SiO_2$ samples and the 'as-received', 1000 Å $SiO_2$ samples.

After the selective passivation formation was completed, the 'SC-1 cleaned' 1,000 Å $SiO_2$ and 'as-received' 1000 Å $SiO_2$ samples were cooled to room temperature under a flow of 20 sccm ultra-high purity $N_2$ at a pressure of 2.3 Torr. The samples were then unloaded under a flow of 500 sccm $N_2$, quickly enclosed in a container and then stored under $N_2$ for shipment to the vendor for analytical characterization of their properties.

The 'SC-1 cleaned' 1,000 Å $SiO_2$ and 'as-received' 1000 Å $SiO_2$ samples were characterized using water contact angle measurements, Atomic Force Microscopy (AFM) and Time-of-Flight Secondary Ion Mass Spectrometry (TOF-SIMS). The results of these analyses are presented in the table below.

Contact Angle Measurements and Surface Roughness Measurements

| Sample | Thermal Treatment | Water Contact Angle (Degrees) | Surface Roughness (nm) |
|---|---|---|---|
| As-Received 1,000 Å SiO2/Si(100) | Yes | 90 | 0.62 |
| SC-1 Cleaned 1,000 Å SiO2/Si(100) | Yes | 87.4 | 0.29 |

The samples were also analyzed by X-Ray Photoelectron Spectroscopy (XPS) and the results are presented in the table below:

| Sample | Carbon (atomic %) | Oxygen (atomic %) | Silicon (atomic %) | O/Si Ratio |
|---|---|---|---|---|
| As-Received 1,000 Å SiO2/Si(100) | 4.4 | 64.4 | 31.2 | 2.06 |
| SC-1 Cleaned, HF-etched 1,000 Å SiO2/Si(100) | 4.8 | 64.6 | 30.4 | 2.13 |

Figure 37:
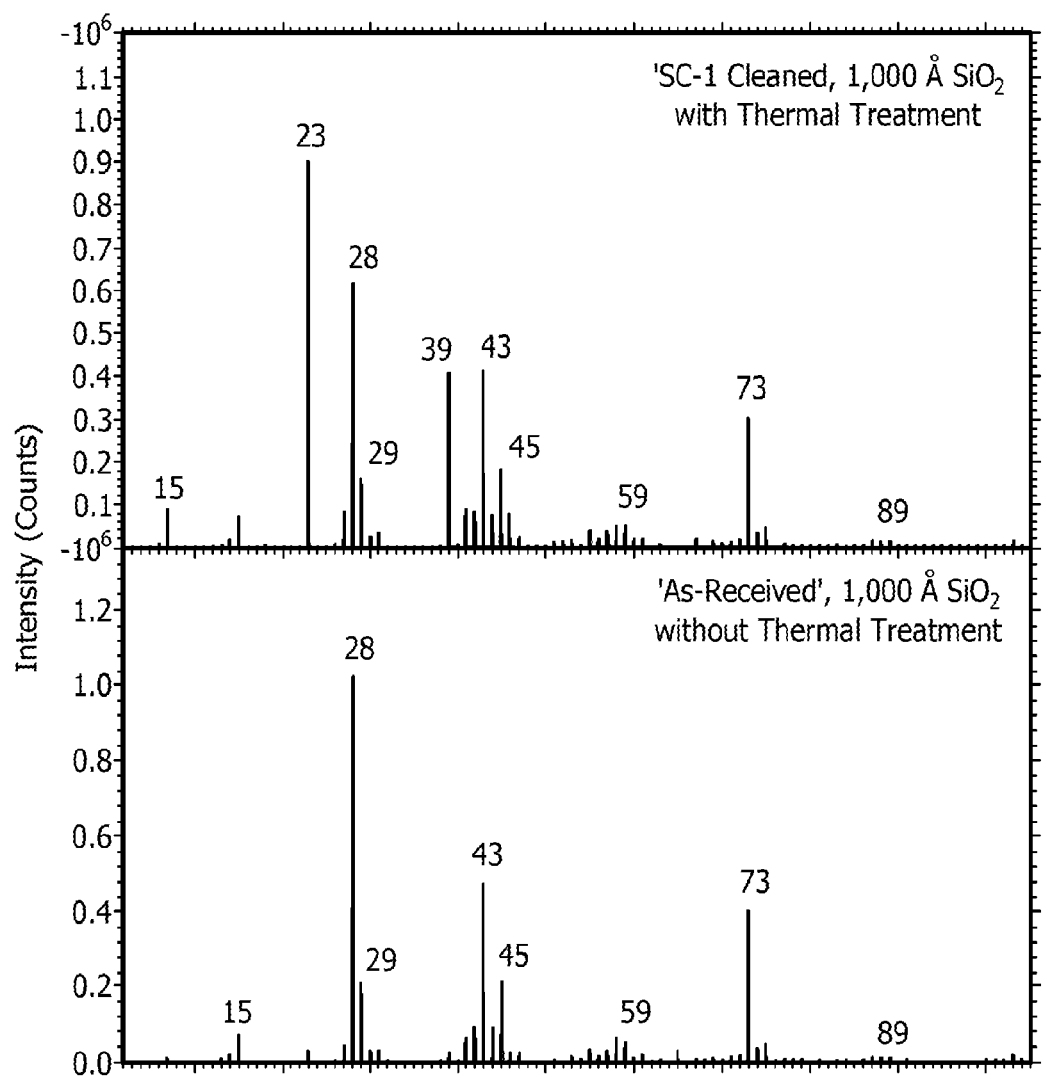
FIG. 37 is a series of TOF-SIMS spectra of a substrate surface as received with a thermal treatment and of a substrate after a wet chemical treatment also with a thermal treatment according to an embodiment of the present invention.

The TOF-SIMS spectra for the 'SC-1 cleaned, HF-etched' 1,000 Å $SiO_2$ and Si(100) samples are shown in FIG. 37. Referring to FIG. 37, the lack of observation of the peaks associated with trimethylsilyl surface passivation in the Si(100) TOF-SIMS spectrum is evidence that the formation of the passivation layer was limited to the 'SC-1 cleaned, HF-etched' 1,000 Å SiO2/Si(100) substrate. That is, the passivation was formed selectively on the desired surface and not on the Si(100) surface. This conclusion is also supported by the water contact angle measurements for the samples and the AFM surface roughness measurements for the samples.

Normalized Ion Intensities for positive ions with mass 45 amu, 29 amu, 43 amu, 59 amu and 73 amu for "SC-1 cleaned, HF-etched" 1,000 Å SiO2/Si(100) and Si(100) are shown in the table below.

| Sample | Thermal Treatment | mass 45 amu | mass 29 amu | mass 43 amu | mass 59 amu | mass 73 amu |
|---|---|---|---|---|---|---|
| As-Received 1,000 Å SiO2/Si(100) | Yes | 458 | 458 | 652 | 36.1 | 523 |
| SC-1 Cleaned 1,000 Å SiO2/Si(100) | Yes | 391 | 391 | 994 | 57.7 | 877 |

Example 25: Formation of Trimethylsilyl Surface Passivation on 'SC-1 Cleaned", 1,000 Å $SiO_2$/Si(100) and "as-Received", 1,000 Å $SiO_2$/Si(100) Using $ISi(CH_3)_3$ (Iodotrimethylsilane) at 370° C. without Thermal Treatment Processing Several 1.5"×1.5" coupons of a 1,000 Å thermal $SiO_2$/Si (100) ["1,000 Å $SiO_2$"] were cleaved from 4" wafers, blown off with a stream of high purity nitrogen to remove particles and then loaded into a Teflon boat suitable for immersion in an SC-1 cleaning bath. The boat and samples were then immersed in an SC-1 cleaning solution (100 ml ultra-high purity $NH_4OH$ (28%-30%); 200 ml ultra-high purity $H_2O_2$ (28-30%); 1000 ml distilled, deionized $H_2O$) that was pre-heated to a temperature of 70+/−5° C. where they were cleaned for 10 minutes. The SC-1 cleaned, 1,000 Å $SiO_2$/Si(100) and Si(100) samples were then removed from the cleaning bath and rinsed of chemicals using three dump rinse cycles of distilled, deionized water. The samples were then dried thoroughly using a source of ultra-high purity $N_2$ gas that was filtered for particles.

Several of the 'SC-1 cleaned', 1000 Å $SiO_2$ and "as-received" 1000 Å $SiO_2$ samples were then loaded into the tube of a tube furnace reactor system under a flow of 250 sccm ultra-high purity $N_2$ gas at room temperature with as minimum a delay as possible. The tube was then sealed and slowly evacuated to a pressure of 80 mTorr. A flow of 20 sccm $N_2$ was then introduced into the reactor tube and a reduced pressure $N_2$ purge was conducted for 2 minutes (at a pressure of 2.3 Torr). The flow of $N_2$ was then stopped and the tube was evacuated to a pressure of ≤5 mTorr. The previously described cycle purging steps were repeated until the base pressure of the system was achieved.

After base pressure was achieved, a flow of 20 sccm of ultra-high purity $N_2$ was introduced into the reactor system and a reduced pressure $N_2$ purge (at 2.3 Torr) was conducted for 1 hour to reduce the background moisture concentration in the system prior to initiating the thermal treatment. As known to those skilled in the art, use of a load lock system will enable greatly reduced cycle times while still providing the required system purity for the processes described herein to be operative.

Under a flow of 20 sccm ultra-high purity $N_2$ through the tube at a pressure of 2.5 Torr while the sample temperature was raised to 370° C. The samples were equilibrated at 370° C. for 10 minutes, the $N_2$ flow was terminated and the tube was fully evacuated to a pressure of no more than 1 mTorr.

The tube was then charged with a first chemical dose of dimethylaminotrimethylsilane [$(CH_3)_2NSi(CH_3)_3$] to a pressure of 20.8 Torr and then isolated at this pressure for 20 minutes. The first chemical dose was then removed from the chamber using a combination of reduced pressure $N_2$ purging and evacuation that encompassed first introducing a dynamic flow of 20 sccm $N_2$ at a pressure of 2.5 Torr for one minute, followed by evacuation of the tube to a pressure not greater than 10 mTorr for two minutes. The second chemical dose of $(CH_3)_2NSi(CH_3)_3$ was then introduced in a manner identical to the first dose except that the pressure of the second dose was 21.0 Torr. The second dose was then removed in the same manner as the first chemical dose prior to the introduction of the third chemical dose. The third chemical dose of $(CH_3)_2NSi(CH_3)_3$ was then introduced in a manner identical to the first and second doses except that the pressure of the third dose was 21.4 Torr. The third chemical dose was then removed in the same manner as the first and second chemical doses, completing the selective formation of the trimethylsilyl surface passivation on the 'SC-1 cleaned, HF-etched', 1,000 Å $SiO_2$ samples, but not on the Si(100) samples.

After the selective passivation formation was completed, the 'SC-1 cleaned' 1,000 Å $SiO_2$ and "as-received" 1,000 Å $SiO_2$ samples were cooled to room temperature under a flow of 20 sccm ultra-high purity $N_2$ at a pressure of 2.3 Torr. The samples were then unloaded under a flow of 500 sccm $N_2$, quickly enclosed in a container and then stored under $N_2$ for shipment to the vendor for analytical characterization of their properties.

The 'SC-1 cleaned, HF-etched' 1,000 Å $SiO_2$ and Si(100) samples were characterized using water contact angle measurements, Atomic Force Microscopy (AFM) and Time-of-Flight Secondary Ion Mass Spectrometry (TOF-SIMS). For comparison, 'SC-1 cleaned, HF-etched' 1,000 Å $SiO_2$ samples that did not receive the thermal treatment processing were also characterized in a similar fashion. The results of these analyses are presented in the table below.

| Contact Angle Measurements and Surface Roughness Measurements | | | |
|---|---|---|---|
| Sample | Thermal Treatment | Water Contact Angle (Degrees) | Surface Roughness (nm) |
| As-Received 1,000 Å SiO2/Si(100) | No | 89.8 | 0.19 |
| SC-1 Cleaned 1,000 Å SiO2/Si(100) | No | 85.1 | 0.29 |

The samples were also analyzed by X-Ray Photoelectron Spectroscopy (XPS) and the results are presented in the table below.

| Sample | Carbon (atomic %) | Oxygen (atomic %) | Silicon (atomic %) | O/Si Ratio |
|---|---|---|---|---|
| As-Received 1,000 Å SiO2/Si(100) | 3.6 | 66.8 | 29.6 | 2.26 |
| SC-1 Cleaned, HF-etched 1,000 Å SiO2/Si(100) | 4.1 | 66.1 | 29.6 | 2.23 |

Figure 38:
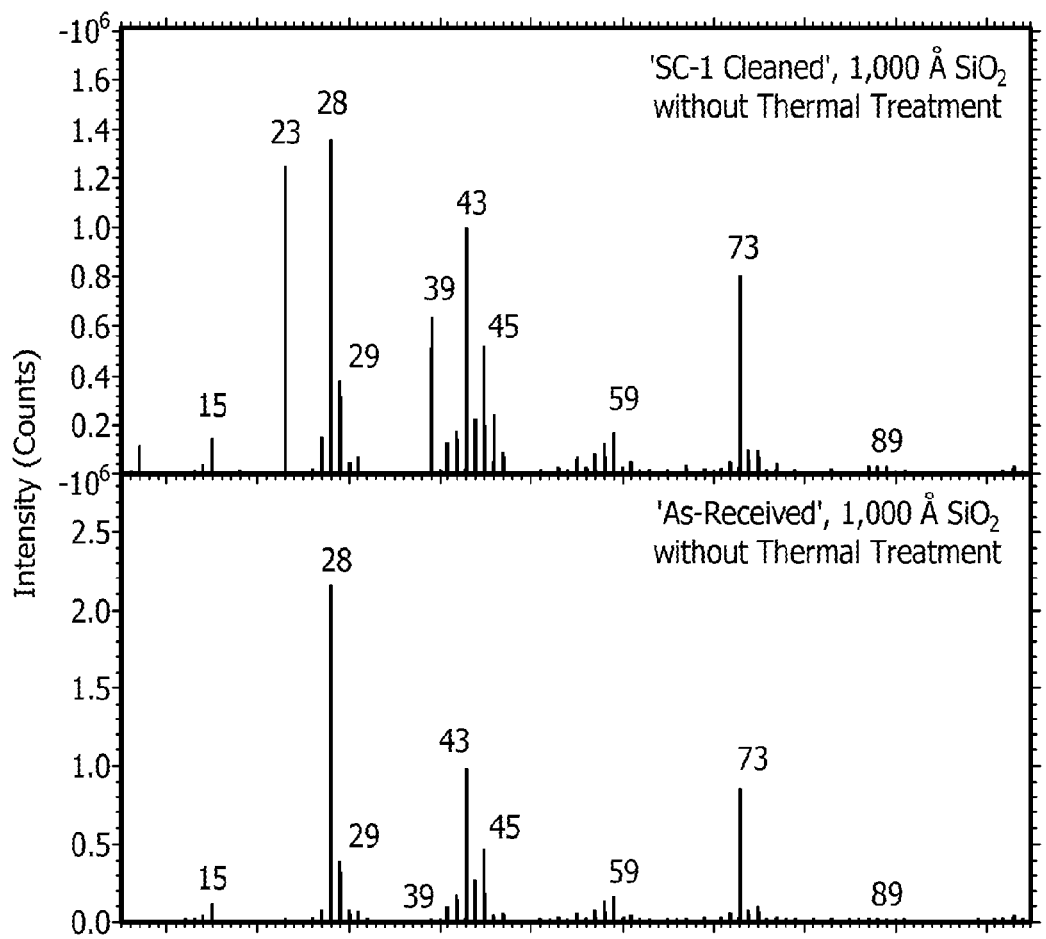
FIG. 38 is a series of TOF-SIMS spectra of a substrate surface as received without a thermal treatment and of a substrate after a wet chemical treatment also without thermal treatment according to an embodiment of the present invention.

The TOF-SIMS spectra for the 'SC-1 cleaned' 1,000 Å $SiO_2$ and "as-received" 1,000 Å $SiO_2$ samples are shown in FIG. 38.

Normalized Ion Intensities for positive ions with mass 45 amu, 29 amu, 43 amu, 59 amu and 73 amu for "SC-1 cleaned" 1,000 Å $SiO_2$/Si(100) and Si(100) are listed in the table below.

| Sample | Thermal Treatment | mass 45 amu | mass 29 amu | mass 43 amu | mass 59 amu | mass 73 amu |
|---|---|---|---|---|---|---|
| As-Received 1,000 Å SiO2/Si(100) | No | 239 | 441 | 782 | 46.4 | 671 |
| SC-1 Cleaned 1,000 Å SiO2/Si(100) | No | 244 | 310 | 1100 | 65.8 | 970 |

While the principles of the invention have been described above in connection with preferred embodiments, it is to be clearly understood that this description is made only by way of example and not as a limitation of the scope of the invention.

The invention claimed is:

1. A method for selectively passivating the surface of a substrate by vapor phase reaction, wherein the surface of the substrate comprises at least a first surface comprising $SiO_2$ and an initial concentration of surface hydroxyl groups and a second surface comprising SiH, the method comprising the steps of:
   contacting the substrate to a wet chemical composition to obtain a treated substrate comprising an increased concentration of surface hydroxyl groups relative to the initial concentration of surface hydroxyl groups;
   heating the treated substrate at a temperature of from about 200° C. to about 600° C. and a pressure of from 10-10 Torr to 3000 Torr, wherein the heating step converts at least a portion of the surface hydroxyl groups on the first surface to surface siloxane groups on the surface of the substrate;
   exposing the substrate, at a temperature equal to or below the heating step, to a silicon-containing compound selected from the group consisting of Formula I and Formula II:

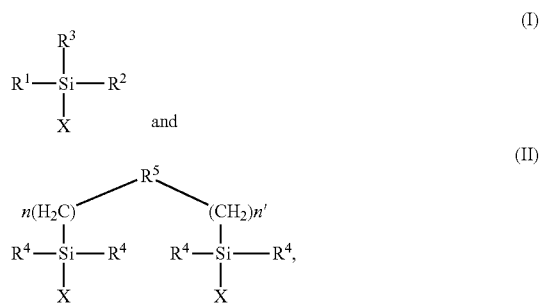

wherein $R^1$, $R^2$, and $R^4$ are each independently selected from H, a $C_1$ to $C_8$ linear alkyl group, a branched $C_3$ to $C_8$ alkyl group, a $C_3$ to $C_8$ cyclic alkyl group, a $C_3$ to $C_{10}$ heterocyclic group, a $C_3$ to $C_{10}$ alkenyl group, a $C_4$ to $C_8$ aryl group, and a $C_3$ to $C_{10}$ alkynyl group;

$R^3$ is selected from a $C_1$ to $C_{18}$ alkyl group, a branched $C_3$ to $C_{10}$ alkyl group, a $C_4$ to $C_{10}$ heterocyclic group and a $C_4$ to $C_{10}$ aryl group;

$R^5$ is selected from a bond, a $C_1$ to $C_8$ linear alkyl group, a branched $C_3$ to $C_8$ alkyl group, a $C_3$ to $C_8$ cyclic alkyl group, a $C_3$ to $C_{10}$ heterocyclic group, a $C_3$ to $C_{10}$ alkenyl group, a $C_4$ to $C_8$ aryl group, and a $C_3$ to $C_{10}$ alkynyl group;

X is selected from $NR^aR^b$, Cl, F, Br, I, —$OCH_3$, and —OH, wherein $R^a$ and $R^b$ are each independently selected from H, a $C_1$ to $C_4$ linear alkyl group and a $C_1$-$C_4$ branched alkyl group; and n and n' are each independently selected from a number of from 0 to 5, wherein n+n'>1 and <11, wherein the silicon-containing compound reacts with the surface hydroxyl groups of the first surface to form a silyl ether-terminated surface and thereby passivate the surface.

2. The method of claim 1 wherein the silicon-containing compound is at least one compound represented by Formula I.

3. The method of claim 2 wherein the compound represented by Formula I is at least one selected from the group consisting of iodo tris(3,3,3-trifluoropropyl) silane, dimethylamino tris(3,3,3-trifluoropropyl) silane, [(CF$_3$CF$_2$(CH$_2$)$_6$(CH$_3$)$_2$SiCl], and bromo tris(1,1,1-3,3,3-hexafluoro-isopropyl) silane.

4. The method of claim 1 wherein the silicon-containing compound is a compound represented by Formula II.

5. The method of claim 4 wherein the compound represented by Formula II is selected from the group consisting of 1,3-bis-chlorodimethylsilyl(ethane); 1,3-bis-bromodimethylsilyl(ethane); 1,3-bis-iododimethylsilyl(ethane); 1,3-bis-dimethylamino-dimethylsilyl(ethane); 1,3-bis-chlorodimethylsilyl(propane); 1,3-bis-bromodimethylsilyl(propane); 1,3-bis-iododimethylsilyl(propane); 1,3-bis-dimethylamino-dimethylsilyl(propane); 1,3-bis-chlorodimethylsilyl(butane); 1,3-bis-bromodimethylsilyl(butane); 1,3-bis-iododimethylsilyl(butane); and 1,3-bis-dimethylamino-dimethylsilyl(butane).

6. The method of claim 1 wherein the contacting step is performed at a temperature of from about 50° C. to about 100° C.

7. The method of claim 6 wherein the contacting step is performed at a temperature of from about 55° C. to about 95° C.

8. The method of claim 7 wherein the contacting step is performed at a temperature of from about 60° C. to about 90° C.

9. The method of claim 1 wherein the heating step is performed at a temperature of from about 200° C. to about 650° C.

10. The method of claim 9 wherein the heating step is performed at a temperature of from about 300° C. to about 550° C.

11. The method of claim 10 wherein the heating step is performed at a temperature of from about 400° C. to about 500° C.

12. The method of claim 1 wherein the heating step is performed by first heating the substrate to a temperature of less than 200° C. for 5-10 minutes, followed by increasing the temperature to from about 400° C. to about 500° C.

13. The method of claim 1 wherein the wet chemical composition comprises at least one selected from the group consisting of a composition comprising H$_2$O$_2$ (28% aq), NH$_4$O$_4$ (28-30%, and H$_2$O, HF (0.01%-5% (aq)), peroxide, and a mixture of H$_2$SO$_4$/H$_2$O$_2$.

14. The method of claim 1 wherein the second surface comprising SiH comprises at least one selected from the group consisting of a —SiH$_3$, —SiH$_2$, and —SiH.

15. The method of claim 1 wherein the second surface comprising SiH comprises Si(100).

16. The method of claim 1 wherein the first surface comprising SiO$_2$ comprises at least one selected from the group consisting of a —SiH$_3$, —SiH$_2$, and —SiH.

17. The method of claim 1 wherein the second surface comprising SiH comprises SiN.

18. The method of claim 1 wherein the second surface comprising SiH comprises a metal or metal oxide.

19. The method of claim 1 wherein the exposing step is conducted at a temperature of between from 150° C. and 500° C.

20. The method of claim 1 wherein the exposing step is conducted at a temperature of between from 150° C. and 450° C.

21. The method of claim 1 wherein the heating of the treated substrate is accomplished in at least two separate heating steps.

22. The method of claim 2 wherein the compound represented by Formula I is at least one selected from the group consisting of trimethylsilicon chloride; trimethylsilicon bromide; trimethylsilicon Iodide; dimethylaminotrimethyl silane; ethylmethylaminotrimethyl silane; diethylaminotrimethyl silane; ethylpropylaminotrimethyl silane; di-propylaminotrimethyl silane; ethylisopropylaminotrimethyl silane; di-iso-propylaminotrimethyl silane; di-n-butyltrimethyl silane; di-isobutyltrimethyl silane; and di-sec-butyltrimethyl silane.

23. The method of claim 2 wherein the compound represented by Formula I is at least one selected from the group consisting of triethylsilicon chloride; triethylsilicon bromide; triethylsilicon iodide; dimethylaminotriethyl silane; ethylmethylaminotriethyl silane; diethylaminotriethyl silane; ethylpropylaminotriethyl silane; di-propylaminotriethyl silane; ethylisopropylaminotriethyl silane; di-iso-propylaminotriethyl silane; di-n-butyltriethyl silane; di-isobutyltriethyl silane; and di-sec-butyltriethyl silane.

24. The method of claim 2 wherein the compound represented by Formula I is at least one selected from the group consisting of tri-n-propylsilicon chloride; tri-n-propylsilicon bromide; tri-n-propylsilicon iodide; dimethylaminotri-n-propyl silane; ethylmethylaminotri-n-propyl silane; diethylaminotri-n-propyl silane; ethylpropylaminotri-n-propylsilane; di-propylaminotri-n-propyl silane; ethylisopropylaminotri-n-propyl silane; and di-iso-propylaminotri-n-propyl silane.

25. The method of claim 2 wherein the compound represented by Formula I is at least one selected from the group consisting of tri-isopropylsilicon chloride; tri-isopropylsilicon bromide; tri-isopropylsilicon iodide; dimethylaminotri-isopropyl silane; ethylmethylamino tri-isopropyl silane; diethylamino tri-isopropyl silane; ethylpropylaminotri-isopropyl silane; di-propylamino tri-isopropyl silane; ethylisopropylamino tri-isopropyl silane; and di-iso-propylamino tri-isopropyl silane.

26. The method of claim 2 wherein the compound represented by Formula I is at least one selected from the group consisting of tri-n-butylsilicon chloride; tri-n-butylsilicon bromide; tri-n-butylsilicon iodide; dimethylaminotri-n-butyl silane; ethylmethylamino tri-n-butyl silane; and diethylamino tri-n-butyl silane.

27. The method of claim 2 wherein the compound represented by Formula I is at least one selected from the group consisting of tri-isobutylsilicon chloride; tri-isobutylsilicon bromide; tri-isobutylsilicon iodide; dimethylaminotri-isobutyl silane; ethylmethylamino tri-isobutyl silane; and diethylamino tri-isobutyl silane.

28. The method of claim 2 wherein the compound represented by Formula I is at least one selected from the group consisting of tri-secbutylsilicon chloride; tri-secbutylsilicon bromide; tri-secbutylsilicon iodide; dimethylaminotri-secbutyl silane; ethylmethylamino tri-secbutyl silane; diethylamino tri-secbutyl silane; tri-n-pentylsilicon chloride; tri-n-pentylsilicon bromide; tri-n-pentylsilicon iodide; and dimethylaminotri-n-pentyl silane.

29. The method of claim 2 wherein the compound represented by Formula I is at least one selected from the group consisting of chloro-tris(3,3,3-trifluoropropyl)silane; bromo-tris(3,3,3-trifluoropropyl)silane; iodo-tris(3,3,3-trifluoropropyl)silane; dimethylamino-tris(3,3,3-trifluoropropyl)silane; ethylmethylamino-tris(3,3,3-trifluoropropyl)silane; diethylamino-tris(3,3,3-trifluoropropyl)silane; ethylpropylamino-tris(3,3,3-trifluoropropyl)silane; di-propylamino-tris(3,3,3-trifluoropropyl)silane; ethylisopropylamino-tris(3,3,3-trifluoropropyl)silane; di-iso-propylamino-tris(3,3,3-trifluoropropyl)silane; chloro-tris(4,4,4-trifluorobutyl)silane; bromo-tris(4,4,4-trifluorobutyl)silane; iodo-tris(4,4,4-trifluorobutyl)silane; and dimethylamino-tris(4,4,4-trifluorobutyl)silane.

30. The method of claim 2 wherein the compound represented by Formula I is at least one selected from the group consisting of octyldimethylsilicon chloride; octyldimethylsilicon bromide; octyldimethylsilicon iodide; dimethylaminooctyldimethyl silane; decyldimethylsilicon chloride; decyldimethylsilicon bromide; decyldimethylsilicon iodide; dimethylamino decyldimethyl silane; dodecyldimethylsilicon chloride; dodecyldimethylsilicon bromide; dodecyldimethylsilicon iodide; dimethylaminododecyldimethyl silane; hexadecyldimethylsilicon chloride; hexadecyldimethylsilicon bromide; hexadecyldimethylsilicon iodide; dimethylaminohexadecyldimethyl silane; octadecyldimethylsilicon chloride; octadecyldimethylsilicon bromide; octadecyldimethylsilicon iodide; dimethylamino-octadecyldimethyl silane; chlorodimethyl(1H,1H-2H,2H-perfluorooctyl)silane; bromodimethyl(1H,1H-2H,2H-perfluorooctyl)silane; iododimethyl(1H,1H-2H,2H-perfluorooctyl)silane; dimethylaminodimethyl(1H,1H-2H,2H-perfluorooctyl)silane; chlorodimethyl(1H,1H-2H,2H-perfluorodecyl)silane; bromodimethyl(1H,1H-2H,2H-perfluorodecyl)silane; iododimethyl(1H,1H-2H,2H-perfluorodecyl)silane; dimethylamino-dimethyl(1H,1H-2H,2H-perfluorodecyl)silane; chlorodimethyl(1H,1H-2H,2H-perfluorododecyl)silane; bromodimethyl(1H,1H-2H,2H-perfluorododecyl)silane; iododimethyl(1H,1H-2H,2H-perfluorododecyl)silane; and dimethylamino-dimethyl(1H,1H-2H,2H-perfluorododecyl)silane.

31. A method of selectively depositing a film on a surface of a substrate wherein the surface of the substrate comprises at least a first surface comprising SiO$_2$ and an initial concentration of surface hydroxyl groups and a second surface comprising SiH, the method comprising the steps of:
contacting the substrate to a wet chemical composition to obtain a treated substrate comprising an increased concentration of surface hydroxyl groups relative to the initial concentration of surface hydroxyl groups;
heating the treated substrate at a temperature of from about 200° C. to about 600° C. and a pressure of from 10-10 Torr to 3000 Torr, wherein the heating step converts at least a portion of the surface hydroxyl groups on the first surface to surface siloxane groups on the surface of the substrate;
exposing the substrate, at a temperature equal to or below the heating step, to a silicon-containing compound selected from the group consisting of Formula I and Formula II:

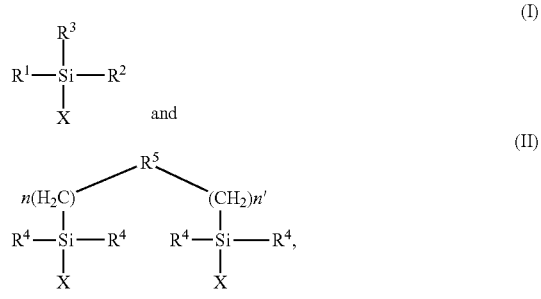

wherein R$^1$, R$^2$, and R$^4$ are each independently selected from H, a C$_1$ to C$_8$ linear alkyl group, a branched C$_3$ to C$_8$ alkyl group, a C$_3$ to C$_8$ cyclic alkyl group, a C$_3$ to C$_{10}$ heterocyclic group, a C$_3$ to C$_{10}$ alkenyl group, a C$_4$ to C$_8$ aryl group, and a C$_3$ to C$_{10}$ alkynyl group;
R$^3$ is selected from a C$_1$ to C$_{18}$ alkyl group, a branched C$_3$ to C$_{10}$ alkyl group, a C$_4$ to C$_{10}$ heterocyclic group and a C$_4$ to C$_{10}$ aryl group;
R$^5$ is selected from a bond, a C$_1$ to C$_8$ linear alkyl group, a branched C$_3$ to C$_8$ alkyl group, a C$_3$ to C$_8$ cyclic alkyl group, a C$_3$ to C$_{10}$ heterocyclic group, a C$_3$ to C$_{10}$ alkenyl group, a C$_4$ to C$_8$ aryl group, and a C$_3$ to C$_{10}$ alkynyl group;
X is selected from NR$^a$R$^b$, Cl, F, Br, I, —OCH$_3$, and —OH, wherein R$^a$ and R$^b$ are each independently selected from H, a C$_1$ to C$_4$ linear alkyl group and a C$_1$-C$_4$ branched alkyl group; and
n and n' are each independently selected from a number of from 0 to 5, wherein n+n'>1 and <11,
wherein the silicon-containing compound reacts with the surface hydroxyl groups of the first surface to form a silyl ether-terminated surface and thereby passivate the surface; and
exposing the substrate to one or more deposition precursors to deposit a film on the second surface selectively over the first surface.

32. The method of claim 31 wherein the silicon-containing compound is a compound represented by Formula I.

33. The method of claim 32 wherein the compound represented by Formula I is selected from the group consisting of iodo tris(3,3,3-trifluoropropyl) silane, dimethylamino tris(3,3,3-trifluoropropyl) silane, [(CF$_3$CF$_2$(CH$_2$)$_6$(CH$_3$)$_2$SiCl], and bromo tris(1,1,1-3,3,3-hexafluoroisopropyl) silane.

34. The method of claim 31 wherein the silicon-containing compound is a compound represented by Formula II.

35. The method of claim 34 wherein the compound represented by Formula II is selected from the group consisting of 1,3-bis-chlorodimethylsilyl(ethane); 1,3-bis-bromodimethylsilyl(ethane); 1,3-bis-iododimethylsilyl(ethane); 1,3-bis-dimethylamino-dimethylsilyl(ethane); 1,3-bis-chlorodimethylsilyl(propane); 1,3-bis-bromodimethylsilyl(propane); 1,3-bis-iododimethylsilyl(propane); 1,3-bis-dimethylamino-dimethylsilyl(propane); 1,3-bis-chlorodimethylsilyl(butane); 1,3-bis-bromodimethylsilyl(butane); 1,3-bis-iododimethylsilyl(butane); and 1,3-bis-dimethylamino-dimethylsilyl(butane).

36. The method of claim 31 wherein the contacting step is performed at a temperature of from about 50° C. to about 100° C.

37. The method of claim 36 wherein the contacting step is performed at a temperature of from about 55° C. to about 95° C.

38. The method of claim 37 wherein the contacting step is performed at a temperature of from about 60° C. to about 90° C.

39. The method of claim 31 wherein the heating step is performed at a temperature of from about 200° C. to about 650° C.

40. The method of claim 31 wherein the heating step is performed at a temperature of from about 300° C. to about 550° C.

41. The method of claim 40 wherein the heating step is performed at a temperature of from about 400° C. to about 500° C.

42. The method of claim 31 wherein the heating step is performed by first eating the substrate to a temperature of less than 200° C. for 5-10 minutes, followed by increasing the temperature to from about 400° C. to about 500° C.

43. The method of claim 31 wherein the wet chemical composition comprises at least one selected from the group consisting of a composition comprising $H_2O_2$ (28% aq), $NH_4O_4$ (28-30%, and $H_2O$, HF (0.01%-5% (aq)), peroxide, and a mixture of $H_2SO_4/H_2O_2$.

44. The method of claim 31 wherein the second surface comprising SiH comprises at least one selected from the group consisting of a —$SiH_3$, —$SiH_2$, and —SiH.

45. The method of claim 31 wherein the second surface comprising SiH comprises Si(100).

46. The method of claim 31 wherein the first surface comprising $SiO_2$ comprises at least one selected from the group consisting of a —$SiH_3$, —$SiH_2$, and —SiH.

47. The method of claim 31 wherein the second surface comprising SiH comprises SiN.

48. The method of claim 31 wherein the second surface comprising SiH comprises a metal or metal oxide.

49. The method of claim 31 wherein the exposing step is conducted at a temperature of between from 150° C. and 500° C.

50. The method of claim 31 wherein the exposing step is conducted at a temperature of between from 150° C. and 450° C.

51. The method of claim 31 wherein the heating of the treated substrate is accomplished in at least two separate heating steps.

52. The method of claim 32 wherein the compound represented by Formula I is at least one selected from the group consisting of trimethylsilicon chloride; trimethylsilicon bromide; trimethylsilicon Iodide; dimethylaminotrimethyl silane; ethylmethylaminotrimethyl silane; diethylaminotrimethyl silane; ethylpropylaminotrimethyl silane; di-propylaminotrimethyl silane; ethylisopropylaminotrimethyl silane; di-iso-propylaminotrimethyl silane; di-n-butyltrimethyl silane; di-isobutyltrimethyl silane; and di-sec-butyltrimethyl silane.

53. The method of claim 32 wherein the compound represented by Formula I is at least one selected from the group consisting of triethylsilicon chloride; triethylsilicon bromide; triethylsilicon iodide; dimethylaminotriethyl silane; ethylmethylaminotriethyl silane; diethylaminotriethyl silane; ethylpropylaminotriethyl silane; di-propylaminotriethyl silane; ethylisopropylaminotriethyl silane; di-iso-propylaminotriethyl silane; di-n-butyltriethyl silane; di-isobutyltriethyl silane; and di-sec-butyltriethyl silane.

54. The method of claim 32 wherein the compound represented by Formula I is at least one selected from the group consisting of tri-n-propylsilicon chloride; tri-n-propylsilicon bromide; tri-n-propylsilicon iodide; dimethylaminotri-n-propyl silane; ethylmethylaminotri-n-propyl silane; diethylaminotri-n-propyl silane; ethylpropylaminotri-n-propylsilane; di-propylaminotri-n-propyl silane; ethylisopropylaminotri-n-propyl silane; and di-iso-propylaminotri-n-propyl silane.

55. The method of claim 32 wherein the compound represented by Formula I is at least one selected from the group consisting of tri-isopropylsilicon chloride; tri-isopropylsilicon bromide; tri-isopropylsilicon iodide; dimethylaminotri-isopropyl silane; ethylmethylamino tri-isopropyl silane; diethylamino tri-isopropyl silane; ethylpropylamino-tri-isopropyl silane; di-propylamino tri-isopropyl silane; ethylisopropylamino tri-isopropyl silane; and di-iso-propylamino tri-isopropyl silane.

56. The method of claim 32 wherein the compound represented by Formula I is at least one selected from the group consisting of tri-n-butylsilicon chloride; tri-n-butylsilicon bromide; tri-n-butylsilicon iodide; dimethylaminotri-n-butyl silane; ethylmethylamino tri-n-butyl silane; and diethylamino tri-n-butyl silane.

57. The method of claim 32 wherein the compound represented by Formula I is at least one selected from the group consisting of tri-isobutylsilicon chloride; tri-isobutylsilicon bromide; tri-isobutylsilicon iodide; dimethylamino-tri-isobutyl silane; ethylmethylamino tri-isobutyl silane; and diethylamino tri-isobutyl silane.

58. The method of claim 32 wherein the compound represented by Formula I is at least one selected from the group consisting of tri-secbutylsilicon chloride; tri-secbutylsilicon bromide; tri-secbutylsilicon iodide; dimethylaminotri-secbutyl silane; ethylmethylamino tri-secbutyl silane; diethylamino tri-secbutyl silane; tri-n-pentylsilicon chloride; tri-n-pentylsilicon bromide; tri-n-pentylsilicon iodide; and dimethylaminotri-n-pentyl silane.

59. The method of claim 32 wherein the compound represented by Formula I is at least one selected from the group consisting of chloro-tris(3,3,3-trifluoropropyl)silane; bromo-tris(3,3,3-trifluoropropyl)silane; iodo-tris(3,3,3-trifluoropropyl)silane; dimethylamino-tris(3,3,3-trifluoropropyl)silane; ethylmethylamino-tris(3,3,3-trifluoropropyl)silane; diethylamino-tris(3,3,3-trifluoropropyl)silane; ethylpropylamino-tris(3,3,3-trifluoropropyl)silane; di-propylamino-tris(3,3,3-trifluoropropyl)silane; ethylisopropylamino-tris(3,3,3-trifluoropropyl)silane; di-iso-propylamino-tris(3,3,3-trifluoropropyl)silane; chloro-tris(4,4,4-trifluorobutyl)silane; bromo-tris(4,4,4-trifluorobutyl)silane; iodo-tris(4,4,4-trifluorobutyl)silane; and dimethylamino-tris (4,4,4-trifluorobutyl)silane.

60. The method of claim 32 wherein the compound represented by Formula I is at least one selected from the group consisting of octyldimethylsilicon chloride; octyldimethylsilicon bromide; octyldimethylsilicon iodide; dimethylaminooctyldimethyl silane; decyldimethylsilicon chloride; decyldimethylsilicon bromide; decyldimethylsilicon iodide; dimethylamino decyldimethyl silane; dodecyldimethylsilicon chloride; dodecyldimethylsilicon bromide; dodecyldimethylsilicon iodide; dimethylaminododecyldimethyl silane; hexadecyldimethylsilicon chloride; hexadecyldimethylsilicon bromide; hexadecyldimethylsilicon iodide; dimethylaminohexadecyldimethyl silane; octadecyldimethylsilicon chloride; octadecyldimethylsilicon bromide; octadecyldimethylsilicon iodide; dimethylamino-octadecyldimethyl silane; chlorodimethyl(1H,1H-2H,2H-perfluorooctyl) silane; bromodimethyl(1H,1H-2H,2H-perfluorooctyl)silane; iododimethyl(1H,1H-2H,2H-perfluorooctyl)silane; dimethylaminodimethyl(1H,1H-2H,2H-perfluorooctyl)silane; chlorodimethyl(1H,1H-2H,2H-perfluorodecyl)silane; bromodimethyl(1H,1H-2H,2H-perfluorodecyl)silane; iododimethyl(1H,1H-2H,2H-perfluorodecyl)silane; dimethylamino-dimethyl(1H,1H-2H,2H-perfluorodecyl)silane; chlorodimethyl(1H,1H-2H,2H-perfluorododecyl)silane; bromodimethyl(1H,1H-2H,2H-perfluorododecyl)silane; iododimethyl(1H,1H-2H,2H-perfluorododecyl)silane; and dimethylamino-dimethyl(1H,1H-2H,2H-perfluorododecyl) silane.

* * * * *